US007331101B2

(12) United States Patent
Silverbrook

(10) Patent No.: US 7,331,101 B2
(45) Date of Patent: Feb. 19, 2008

(54) METHOD OF FABRICATING A MICRO-ELECTROMECHANICAL ACTUATING MECHANISM

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 301 days.

(21) Appl. No.: 11/176,158

(22) Filed: Jul. 8, 2005

(65) Prior Publication Data

US 2005/0270335 A1 Dec. 8, 2005

Related U.S. Application Data

(63) Continuation of application No. 10/992,714, filed on Nov. 22, 2004, now Pat. No. 7,032,992, which is a continuation of application No. 09/835,471, filed on Apr. 16, 2001, now Pat. No. 6,918,655, which is a continuation of application No. 09/807,297, filed as application No. PCT/AU99/00894 on Oct. 15, 1999, now Pat. No. 6,902,255.

(30) Foreign Application Priority Data

| | | |
|---|---|---|
| Oct. 16, 1998 | (AU) | PP6534 |
| Oct. 16, 1998 | (AU) | PP6535 |
| Oct. 16, 1998 | (AU) | PP6536 |
| Oct. 16, 1998 | (AU) | PP6537 |
| Oct. 16, 1998 | (AU) | PP6538 |
| Oct. 16, 1998 | (AU) | PP6539 |
| Oct. 16, 1998 | (AU) | PP6540 |
| Oct. 16, 1998 | (AU) | PP6541 |
| Oct. 16, 1998 | (AU) | PP6542 |
| Oct. 16, 1998 | (AU) | PP6543 |
| Oct. 16, 1998 | (AU) | PP6544 |
| Oct. 16, 1998 | (AU) | PP6545 |
| Oct. 16, 1998 | (AU) | PP7022 |
| Oct. 16, 1998 | (AU) | PP7023 |

(51) Int. Cl.
*H01L 21/02* (2006.01)

(52) U.S. Cl. ........................ 29/611; 29/890.1; 29/846; 438/21; 438/199

(58) Field of Classification Search ................. 29/611, 29/890.1, 846, 831; 438/21, 199, 210, 330, 438/382; 347/68–72, 20, 27, 40, 50, 54, 347/63, 65

See application file for complete search history.

(56) References Cited

U.S. PATENT DOCUMENTS 5,126,768 A 6/1992 Nozawa et al.

(Continued)

FOREIGN PATENT DOCUMENTS

EP 0539804 A 5/1993

(Continued)

OTHER PUBLICATIONS

Storment et al., "Fexible, Dry-Released Process for Aluminum Electrostatic Actuators", Journal of Mircroelectromechanical Systems, Vo. 3, No. 3, Sep. 1994, pp. 90-93.*

*Primary Examiner*—A. Dexter Tugbang

(57) ABSTRACT

A method of fabricating a micro-electromechanical actuating mechanism on a wafer substrate includes the step of carrying out a CMOS fabrication process on the wafer to form transistor control and drive circuitry. Sacrificial material is deposited on the transistor control and drive circuitry. The sacrificial material is etched to provide connection access to the drive circuitry. A MEMS fabrication process is carried out on the layer of sacrificial material to form a micro-electromechanical actuator connected to the drive circuitry and responsive to electrical signals from the drive circuitry. The sacrificial material is removed to free the actuator. The steps of carrying out the CMOS and MEMS fabrication processes are such that the transistor circuitry is interposed between the actuator and the wafer substrate.

8 Claims, 81 Drawing Sheets

Mount on wafer blank, back-etch inlets

No mask

Detach from wafer blank, etch sacrificial material

U.S. PATENT DOCUMENTS

| | | | |
|---|---|---|---|
| 5,479,197 | A | 12/1995 | Kobayashi et al. |
| 5,790,151 | A | 8/1998 | Mills |
| 6,022,099 | A | 2/2000 | Chwalek et al. |
| 6,106,089 | A | 8/2000 | Wen et al. |
| 6,260,953 | B1 | 7/2001 | Silverbrook et al. |
| 6,273,544 | B1 | 8/2001 | Silverbrook |
| 6,294,420 | B1 | 9/2001 | Tsu et al. |
| 6,374,482 | B1 * | 4/2002 | Mihara et al. ................ 29/611 |
| 6,881,632 | B2 * | 4/2005 | Fitzgerald et al. ...... 438/199 X |

FOREIGN PATENT DOCUMENTS

| | | | |
|---|---|---|---|
| EP | 0764977 | A | 3/1997 |
| EP | 829360 | A2 | 3/1998 |
| EP | 0865922 | A | 9/1998 |
| EP | 867294 | A2 | 9/1998 |
| GB | 2086807 | A | 5/1982 |
| GB | 2333065 | A | 7/1999 |
| WO | WO 96/32808 | | 10/1996 |

* cited by examiner

N-Well mask

Implant N-Well

Active mask

Grow field oxide

Poly mask

Deposit poly n+ mask n+ implant p+ mask p+ implant

Contacts mask

Deposit ILD 1, etch contacts

Metal 1 mask

Deposit Metal 1

Via 1 mask

Deposit ILD 2, etch vias

Metal 2 mask

Deposit metal 2

Via 2 mask

Deposit ILD 3, etch vias

Metal 3 mask

Deposit metal 3

Via 3 / Passivation mask

Deposit passivation oxide & nitride, etch vias

Heater mask

Deposit heater TiN

Actuator / bend compensator mask

Deposit actuator glass and bend compensator TiN, etch together

Nozzle mask

Deposit sacrificial layer, etch nozzles

Chamber mask

Etch chambers in sacrificial layer

No mask

Form self-aligned nozzles using CMP

Back-etch inlet mask

Mount on wafer blank, back-etch inlets

No mask

Package, fill with ink, test

A single pod, numbered by firing order

METHOD OF FABRICATING A MICRO-ELECTROMECHANICAL ACTUATING MECHANISM

Cross Reference to Related Applications

The present application is a continuation of U.S. application Ser. No. 10/992,714 filed Nov. 22, 2004, now issued U.S. Pat. No. 7,032,992, which is a continuation of U.S. application Ser. No. 09/835,471 filed Apr. 16, 2001, now Issued U.S. Pat. No. 6,918,655, which is Continuation of U.S. application Ser. No. 09/807,297 filed Aug. 13, 2001, now Issued U.S. Pat. No. 6,902,255, which is a 371 of PCT/AU99/00894 filed Oct. 15, 1999.

FIELD OF THE INVENTION

In interntional patent application PCT/AU98/00550, the present applicant has proposed an ink jet printing device which utilises micro-electro mechanical (mems) processing techniques in the construction of a print head driven by thermal bend actuator devices for the ejection of fluid such as ink from an array of nozzle chambers.

Devices of this type have a number of limitations and problems.

It is an object of the present invention to provide various aspects of an inkjet printing device which overcomes or at least ameliorates one of or more of the disadvantages of the prior art or which at least offers a useful alternative thereto.

SUMMARY OF THE INVENTION

In accordance with a first aspect of the present invention, there is provided an inkjet printhead having a series of nozzles for the ejection of ink wherein each said nozzle has a rim formed by the conformal deposition of a rim material layer over a sacrificial layer and a subsequent planar etching of at least said rim material layer so as to form said nozzle rim.

The planar etching can comprise chemical—mechanical planarization of the rim material layer and any associated sacrificial layers.

In accordance with a second aspect of the present invention, there is provided an inkjet printhead comprising:

a plurality of nozzle chambers each having an ink ejection aperture in one wall thereof and an actuator interconnection aperture in a second wall thereof;

a moveable ink ejection paddle located within the nozzle chamber and moveable under the control of an external thermal actuator through said actuator interconnection aperture for the ejection of ink out of said ink ejection aperture;

said external actuator being covered by a protective covering shell around the operational portions of said actuator, spaced apart from said actuator.

The protective covering shell can be formed simultaneously with the formation of other portions of the inkjet printing arrangement in particular with the nozzle chamber walls.

The protective covering shell can be formed by deposition and etching of a sacrificial material layer followed by deposition and etching of an inert material layer forming the covering shell.

The external actuator can comprise a thermal bend actuator.

In accordance with a third aspect of the present invention, there is provided a method of forming an inkjet printhead on a substrate said method including:

providing a first substrate on which is formed electrical drive circuitry made up of one or more interleaved layers of conductive, semi-conductive and non-conductive materials for the control of said inkjet printhead;

forming on said substrate at least one nozzle chamber having an ink ejection aperture in one wall thereof;

providing a moveable ink ejection paddle within said nozzle chamber, moveable under the control of an actuator for the ejection of ink out of said ink ejection aperture;

and utilizing portions of at least one of said interleaved layers as a sacrificial material layer in the formation of one or more of the group comprising said actuator and said ink ejection paddle.

The sacrificial material layer can comprise portions of a conductive layer of the electrical drive circuitry. The electrical drive circuitry can comprise a Complementary Metal Oxide (CMOS) process and the sacrificial material layer can comprise a CMOS metal layer.

The sacrificial material layer can be utilized in formulating the actuator. The actuator can comprise a thermal actuator. The actuator can be located external to the nozzle chamber and can be interconnected to the ink ejection paddle through an actuation interconnection aperture formed in a second wall of the nozzle chamber.

In accordance with a fourth aspect of the present invention, there is provided an inkjet printhead constructed by MEMS processing techniques with a plurality of ink ejection nozzles each having a nozzle chamber, an external thermal bend actuator having a proximal end anchored to a substrate and a distal end connected to an ink ejection paddle within said chamber;

wherein said external thermal bend actuator further comprises a series of layers and includes a planar conductive heating circuit layer which includes a first portion adjacent said proximal end forming a planar conductive heating circuit for heating said thermal bend actuator, and a second portion extending into said ink ejection paddle, said second portion being electrically isolated from said first portion by means of a discontinuity in said planar conductive heating circuit layer, said discontinuity being located external to said nozzle chamber.

The planar conductive heating circuit layer can comprise substantially titanium nitride. The conductive circuit preferably can include at least one tapered portion adjacent the proximal end so as to increase resistive heating adjacent the proximal end.

In accordance with a fifth spect of the present invention, there is provided an inkjet printhead having a series of ink ejection nozzles for the ejection of ink, each of said nozzles interconnecting a nozzle chamber with an external atmosphere, each said nozzle having a first meniscus rim around which an ink meniscus normally forms, and an extended ink flow prevention rim spaced outwardly from said first meniscus rim and substantially encircling said first meniscus rim, arranged to prevent the flow of ink across the surface of said inkjet printhead.

The ink flow prevention rim can be substantially coplanar with the first meniscus rim and can be formed from the same material as the first meniscus n.

The ink flow prevention rim and the first meniscus rim are preferably formed utilizing chemical mechanical planarization.

The ink flow prevention rim and the first meniscus rim are preferably formed from Titanium Nitride.

In accordance with a sixth aspect of the present invention, there is provided a moveable micromechanical device including a bend actuator adapted to curve in a first bending direction and having a substantially planar bottom surface, said bend actuator being formed on a plane substrate on top of a number of deposited lower layers, wherein the bend actuator is formed by a plurality of steps including:

forming a series of structures in said deposited lower layers, said series of structures having a surface profile including a series of elongate ribs running in a direction substantially transverse to said first bending direction.

The bend actuator can comprise a thermal bend actuator. The deposited layers can include a conductive circuitry layer and can be interconnected to the bend actuator for activation of the bend actuator. The bend actuator can be attached to a paddle member and actuated for the ejection of ink from an ink ejection nozzle of an inkjet printhead. The deposited layer, located under the bend actuator can include a power transistor for the control of operation of the bend actuator.

In accordance with a seventh aspect of the present invention, there is provided a method of construction of an inkjet printhead having a large array of inkjet nozzle arrangements said method comprising:

defining a single inkjet nozzle arrangement for the ejection of ink from a single nozzle; and utilizing a series of translations and rotations of said single inkjet nozzle arrangement to form all the inkjet nozzles of said inkjet print head;

said utilizing step including:

initially forming a plurality of nozzles in a pod;

forming a group of pods, each group corresponding to a different colored ink dispensed from said printhead;

forming a plurality of said groups of pods into a firing group;

combining firing groups forming a segment of said printhead;

forming each segment together to form said printhead.

The inkjet nozzle arrangements can include a series of layers deposited and etch utilizing a mask. The layers can include conductive layers which are preferably etched utilizing the mask so as to form a series of conductive interconnections. The conductive interconnects can include interconnects with adjacent versions of the inkjet nozzle arrangement which can comprise translated and/or rotated copies of the inkjet nozzle arrangement.

In accordance with an eighth aspect of the present invention, there is provided a method of operation of a fluid ejection printhead within a predetermined thermal range so as to print an image, said printhead including a series of thermal actuators operated to eject fluid from said printhead, said method comprising the steps of:

(a) sensing the printhead temperature of said printhead to determine if said printhead temperature is below a predetermined threshold, (b) if said printhead temperature is below said predetermined threshold, performing a preheating step of heating said printhead so that it is above said predetermined threshold, (c) controlling said preheating step such that said thermal actuators are heated to an extent insufficient to cause the ejection of fluid from said printhead; and (d) utilizing said printhead to print said image.

The step (a) can further preferably include the steps of: (aa) initially sensing an ambient temperature surrounding the printhead; (ab) setting the predetermined threshold to be the ambient temperature plus a predetermined operational factor amount, the operational factor amount being dependant on the ambient temperature.

The method can further comprise the step of: (d) monitoring the printhead temperature whilst printing the image and where the temperature falls below the predetermined threshold, reheating the printhead so that it can be above the predetermined threshold.

The step (b) can comprise constantly monitoring the printhead temperature whilst heating the printhead.

The step (c) further can comprise applying a series of short electrical pulses so the thermal actuators, each being insufficient to cause the ejection of fluid from the printhead.

In accordance with an additional aspect of the eighth aspect of the present invention, there is provided a fluid ejection device comprising:

an array of nozzles formed on a substrate and adapted to eject ink on demand by means of a series of ink ejection thermal actuators actuated by an actuator activation unit attached to said ink ejection actuators for activation thereof, at least one temperature sensor attached to said substrate for sensing the temperature of said substrate; and a temperature sensor unit;

wherein before a fluid ejection operation is begun said temperature sensor unit utilizes said at least one temperature sensor to sense a current temperature of said substrate, and if said temperature is below a predetermined limit, to output a preheat activation signal to said actuator activation unit, whereupon said actuator activation unit activates said ink ejection thermal actuators to an extent sufficient to heat said substrate, while being insufficient for the ejection of ink from said array.

The at least one temperature sensor can comprise a series of spaced apart temperature sensors formed on the print head.

The array of nozzles are preferably divided into a series of spaced apart segments with at least one temperature sensor per segment.

In accordance with a ninth aspect of the present invention, there is provided an ink supply arrangement for supplying ink to the printing arrangement of a portable printer, said ink supply arrangement including:

an ink supply unit including at least one storage chamber for holding ink for supply to said printing arrangement, said ink supply unit including a series of spaced apart baffles configured so as to reduce the acceleration of the ink within the unit as may be induced by movement of the portable printer, whilst allowing for flows of ink to the printing arrangement in response to active demand therefrom.

Preferably, the ink printing arrangement is in the form of a printhead which is connected directly to an ink supply arrangement in the form of an ink supply unit having an ink distribution manifold that supplies ink via a plurality of outlets to corresponding ink supply passages formed on the printhead.

In the preferred form, the printhead is an elongate pagewidth printhead chip and the baffles in the ink supply are configured to reduce acceleration of the ink in a direction along the longitudinal extent of the printhead and corresponding ink supply unit. Preferably, the ink supply unit has a series of storage chambers for holding separate color inks.

Preferably, the ink storage chamber or chambers are constructed from two or more interconnecting molded components. In accordance with a tenth aspect of the present invention, there is provided a power distribution arrangement for an elongate inkjet printhead of a kind having a plurality of longitudinally spaced voltage supply points, said power distribution arrangement including:

two or more elongate low resistance power supply busbars; and interconnect means to connect a selected plurality of said voltage supply points to said busbars.

Preferably the busbars are disposed to extend parallel to said printhead and said interconnect means provide interconnections extending generally transversely therebetween.

In a preferred form the interconnect means is in the form of a tape automated bonded film (TAB film).

Desirably the TAB film electrically connects with said busbars by means of correspondingly sized noble metal deposited strips formed on said TAB film.

Preferably the interconnect means also includes a plurality of control lines for connection to selected other of said voltage supply points on said printhead.

The unit can be detachable from the power supply and the external series of control lines. The conductive rails can comprise two mechanically stiff conductive bars.

In accordance with an eleventh aspect of the invention there is provided an ink supply unit for supplying a printhead containing an array of ink ejection nozzles, said supply unit comprising:

a first member formed having dimensions refined to a first accuracy and having a first cavity defined therein;

a second member in the form of an ink distribution manifold having a second cavity defined therein, said second cavity being adapted for the insertion of a printhead;

said second member being configured to engage said first cavity in said first member so as to define one or more chambers for the supply of ink to ink supply passages formed in said printhead;

said second member being formed having dimensions refined to a second accuracy which is higher than said first accuracy.

Preferably, the first and second members are configured to together define a series of ink storage chambers, desirably suitable for storing different colored inks.

In the preferred form the second member defines a series of discrete ink outlets that are adapted to provide ink to ink supply passages in the printhead that are adapted to supply ink to grouped sets of ink ejection nozzles.

Preferably, the second member has overall external dimensions that are substantially smaller than those of the first member.

In accordance with an additional aspect of the eleventh aspect of the present invention, there is provided an ink supply unit for supplying a multiple color pagewidth ink supply printhead, comprising: a first elongated member containing a series of chambers for the storage of separate color inks and formed having dimensions refined to a first accuracy and having a first elongated cavity defined therein; a second elongated member including a series of wall elements and a second elongated cavity defined therein, the second elongated cavity being adapted for the insertion of a page width ink jet printhead, the wall elements mating with corresponding elements of the first elongated member to complete the formation of the series of chambers for the supply of ink to a series of slots formed in the back of the printhead when inserted in the second elongated cavity, wherein the second elongate member is formed having dimensions refined to a second accuracy which is higher then the first accuracy.

A screen for filtering portions of the ink supply flowing through to the printhead is preferably provided, optionally as part of the second member.

The first elongated member and/or the second elongated member can include a series of baffles for reducing the acceleration of the ink within the ink supply unit.

In accordance with a twelfth aspect of the present invention, there is provided a method of interconnecting a printhead containing an array of ink ejection nozzles to an ink distribution manifold, said method comprising:

attaching said printhead to said ink distribution manifold utilizing a resilient adhesive adapted to be elastically deformed with any deflections of the ink distribution manifold.

In accordance with an additional aspect of the twelfth aspect of the invention there is provided a printhead and ink distribution manifold assembly wherein said printhead is attached to said ink distribution manifold by means of a resilient adhesive adapted to be elastically deformed with any deflections of the ink distribution manifold.

In the preferred form the printhead is an elongate pagewidth printhead chip and the ink distribution manifold forms part of an ink supply unit. Desirably the ink supply unit comprises:

a first elongated member containing a series of chambers for the storage of separate color inks and having a first elongated cavity defined therein;

a second elongated member including a series of wall elements and a second elongated cavity defined therein, said second elongated cavity being adapted for the insertion of a page width ink jet printhead, said wall elements mating with corresponding elements of said first elongated member to complete the formation of said series of chambers for the supply of ink to a series of slots formed in the back of said printhead when inserted in said second elongated cavity, wherein said second elongated member is interconnected to said first elongated member utilizing a resilient adhesive adapted to be elastically deformed with any bending of said ink supply unit.

The printhead chip can be attached to the ink supply unit along the sides and along a back surface thereof.

In accordance with a thirteenth aspect of the present invention, there is provided an inkjet printhead comprising:

a plurality of nozzle chambers, each having a nozzle aperture defined in one wall thereof for the ejection of ink out of said aperture;

an ink supply channel interconnected with said nozzle chamber;

a paddle moveable within the nozzle chamber by an actuator and operable to eject ink from said nozzle chamber, said paddle having a projecting part which, upon operation of said actuator is caused to move towards said nozzle aperture.

Preferably, the projecting part, upon activation of the actuator, moves through the plane of the aperture and can be located concentrically with the nozzle aperture.

The liquid ejection aperture can be formed utilizing the deposition and etching of a series of layers and the projecting part can comprise a hollow cylindrical column.

The hollow cylindrical column preferably can include an end adjacent the aperture which can be chemically mechanically planarized during the formation of the aperture.

The actuator can comprise a thermal bend actuator conductively heated so as to cause movement of the paddle.

The projecting part can be located substantially centrally on the paddle.

In accordance with an additional aspect of the thirteenth aspect of the present invention, there is provided in an inkjet printhead having at least one chamber from which liquid is ejected from a nozzle aperture interconnected with said chamber by means of movement of a liquid ejection paddle, a method of improving the operational characteristics of said printhead comprising the steps of:

locating a projecting part on said moveable paddle, said projecting part undergoing movement towards said nozzle aperture upon activation of said liquid ejection paddle to eject fluid.

The projection part preferably can include an end portion which moves through the plane of an outer rim of the aperture upon activation of the liquid ejection paddle.

In accordance with a fourteenth aspect of the present invention, there is provided an inkjet printhead apparatus comprising:

a plurality of nozzle chambers each having a nozzle aperture defined in one wall thereof for the ejection of ink out of said chamber and a second aperture for the insertion of an actuator mechanism;

an ink supply channel interconnected with said nozzle chamber;

a paddle moveable by an actuator operable to eject ink from said nozzle chamber, said actuator including:

a first portion located externally of said nozzle chamber and a second portion located internally of said nozzle chamber, supporting said paddle;

an interconnecting portion interconnecting said first portion and said second portion through said second aperture, said interconnecting portion further including a protruding shield formed adjacent said second aperture and positioned so as to restrict the flow of fluid through said second aperture.

The shield can comprise a hydrophobic surface. The interconnecting portion typically moves in an upwardly defined direction towards the liquid ejection aperture, and the shield can be formed on a top surface of the portion. The actuator preferably can include a thermal expansion actuator located in the first portion.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

The preferred embodiment is a 1600 dpi modular monolithic print head suitable for incorporation into a wide variety of page width printers and in print-on-demand camera systems. The print head is fabricated by means of Micro-Electro-Mechanical-Systems (MEMS) technology, which refers to mechanical systems built on the micron scale, usually using technologies developed for integrated circuit fabrication.

As more than 50,000 nozzles are required for a 1600 dpi A4 photographic quality page width printer, integration of the drive electronics on the same chip as the print head is essential to achieve low cost. Integration allows the number of external connections to the print head to be reduced from around 50,000 to around 100. To provide the drive electronics, the preferred embodiment integrates CMOS logic and drive transistors on the same wafer as the MEMS nozzles. MEMS has several major advantages over other manufacturing techniques:

mechanical devices can be built with dimensions and accuracy on the micron scale;

millions of mechanical devices can be made simultaneously, on the same silicon wafer; and the mechanical devices can incorporate electronics.

The term "IJ46 print head" is used herein to identify print heads made according to the preferred embodiment of this invention.

Operating Principle

The preferred embodiment relies on the utilization of a thermally actuated lever arm which is utilized for the ejection of ink. The nozzle chamber from which ink ejection occurs includes a thin nozzle rim around which a surface meniscus is formed. A nozzle rim is formed utilizing a self aligning deposition mechanism. The preferred embodiment also includes the advantageous feature of a flood prevention rim around the ink ejection nozzle.

Figure 1:
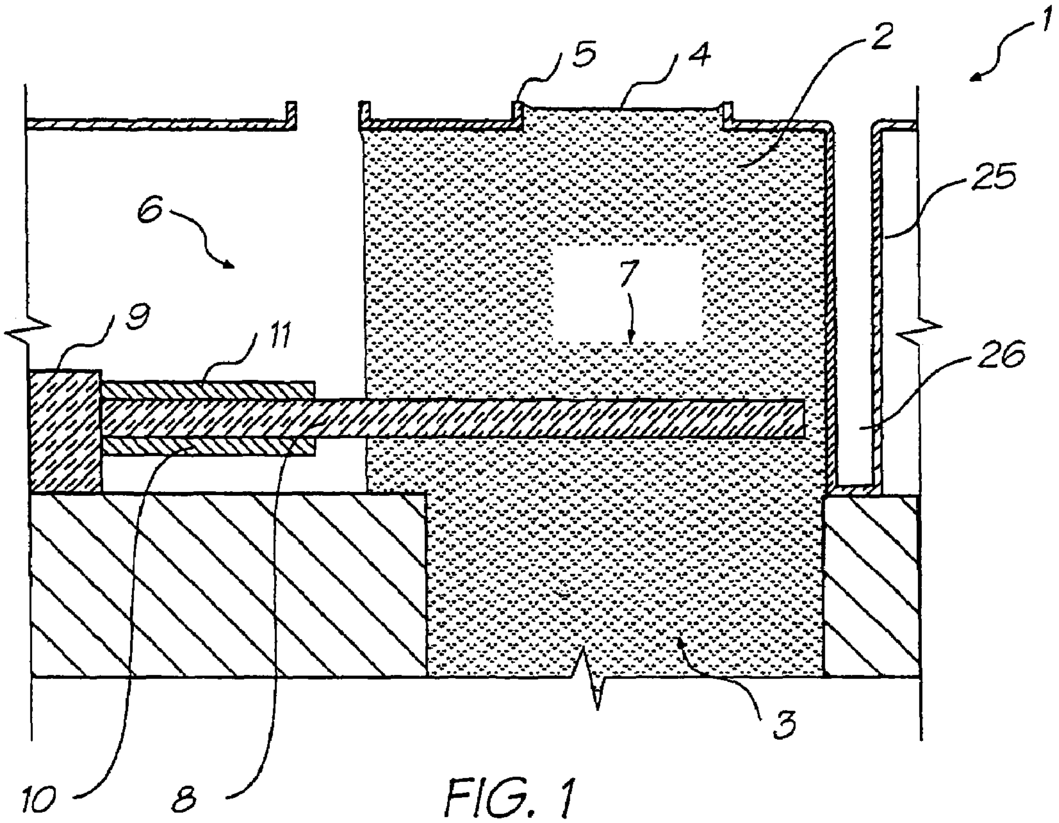
FIG. 1 illustrates schematically a single ink jet nozzle in a quiescent position.
Figure 2:
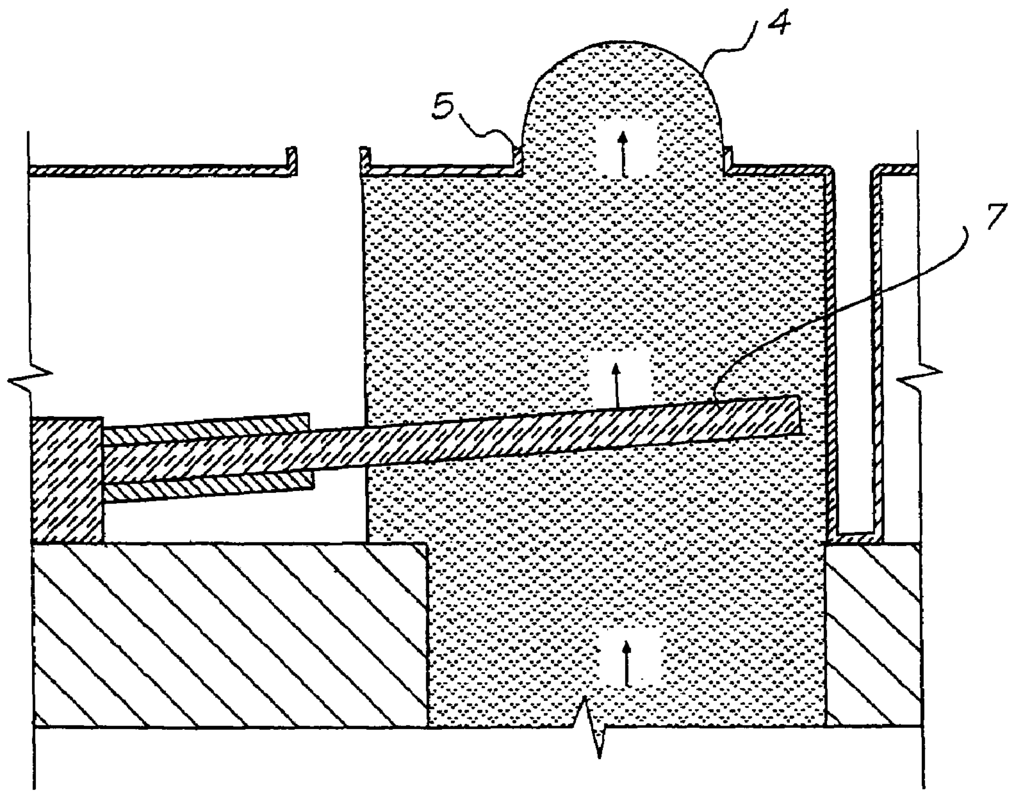
FIG. 2 illustrates schematically a single ink jet nozzle in a firing position.
Figure 3:
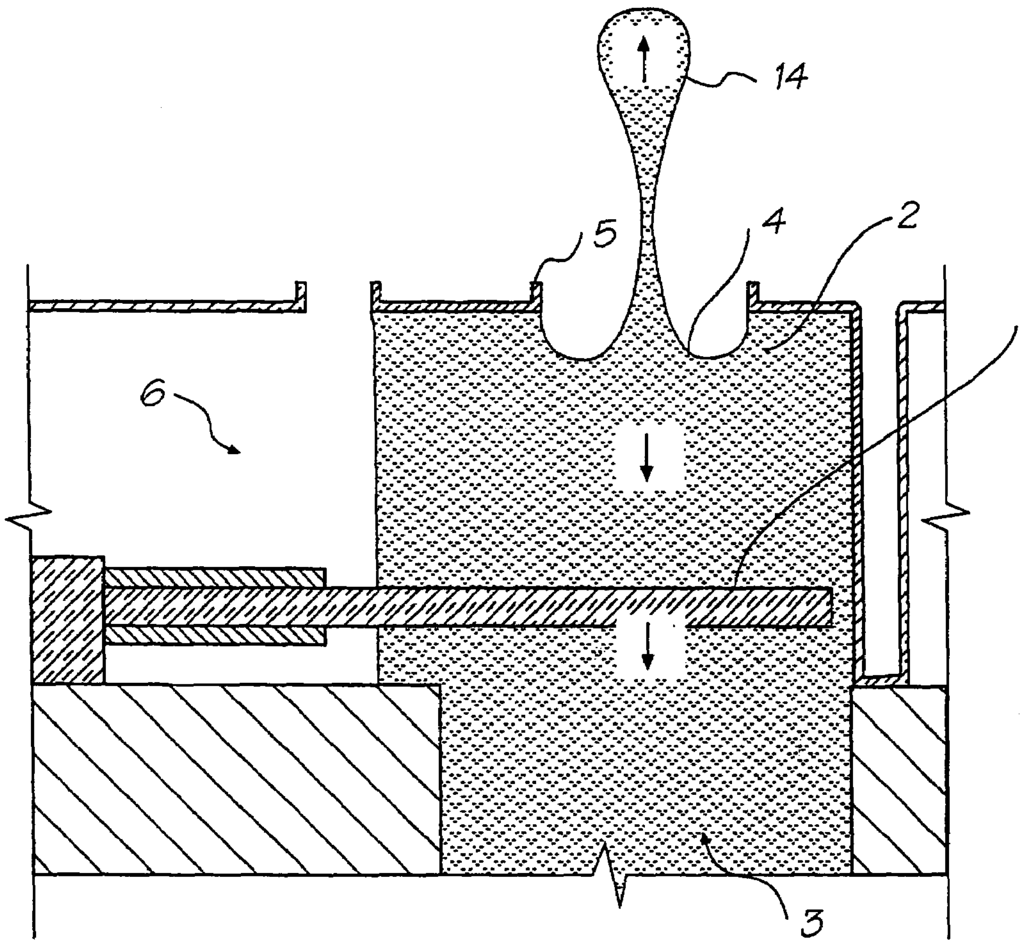
FIG. 3 illustrates schematically a single ink jet nozzle in a refilling position.

Turning initially to FIG. 1 to FIG. 3, there will be now initially explained the operation of principles of the ink jet print head of the preferred embodiment. In FIG. 1, there is illustrated a single nozzle arrangement 1 which includes a nozzle chamber 2 which is supplied via an ink supply channel 3 so as to form a meniscus 4 around a nozzle rim 5. A thermal actuator mechanism 6 is provided and includes an end paddle 7 which can be a circular form. The paddle 7 is attached to an actuator arm 8 which pivots at a post 9. The actuator arm 8 includes two layers 10, 11 which are formed from a conductive material having a high degree of stiffness, such as titanium nitride. The bottom layer 10 forms a conductive circuit interconnected to post 9 and further includes a thinned portion near the end post 9. Hence, upon passing a current through the bottom layer 10, the bottom layer is heated in the area adjacent the post 9. Without the heating, the two layers 10, 11 are in thermal balance with one another. The heating of the bottom layer 10 causes the overall actuator mechanism 6 to bend generally upwards and hence paddle 7 as indicated in FIG. 2 undergoes a rapid upward movement. The rapid upward movement results in an increase in pressure around the rim 5 which results in a general expansion of the meniscus 4 as ink flows outside the chamber. The conduction to the bottom layer 10 is then turned off and the actuator arm 6, as illustrated in FIG. 3 begins to return to its quiescent position. The return results in a movement of the paddle 7 in a downward direction. This in turn results in a general sucking back of the ink around the nozzle 5. The forward momentum of the ink outside the nozzle in addition to the backward momentum of the ink within the nozzle chamber results in a drop 14 being formed as a result of a necking and breaking of the meniscus 4. Subsequently, due to surface tension effects across the meniscus 4, ink is drawn into the nozzle chamber 2 from the ink supply channel 3.

Figure 4:
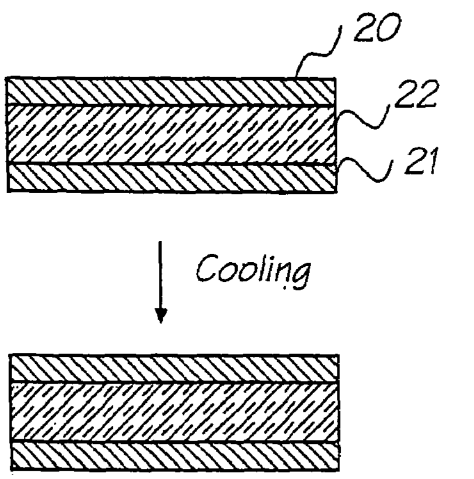
FIG. 4 illustrates a bi-layer cooling process.
Figure 5:
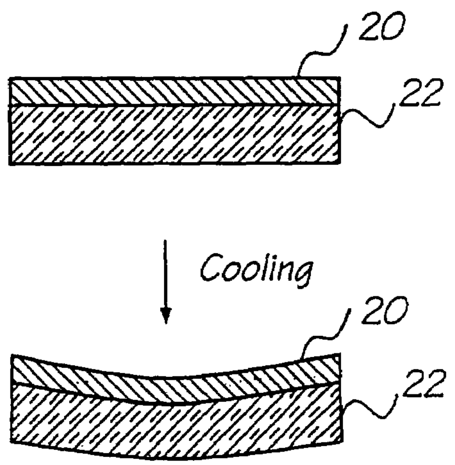
FIG. 5 illustrates a single-layer cooling process.

The operation of the preferred embodiment has a number of significant features. Firstly, there is the aforementioned balancing of the layer 10, 11. The utilization of a second layer 11 allows for more efficient thermal operation of the actuator device 6. Further, the two layer operation ensures thermal stresses are not a problem upon cooling during manufacture, thereby reducing the likelihood of peeling during fabrication. This is illustrated in FIG. 4 and FIG. 5. In FIG. 4, there is shown the process of cooling off a thermal actuator arm having two balanced material layers 20, 21 surrounding a central material layer 22. The cooling process affects each of the conductive layers 20, 21 equally resulting in a stable configuration. In FIG. 5, a thermal actuator arm having only one conductive layer 20 as shown. Upon cooling after manufacture, the upper layer 20 is going to bend with respect to the central layer 22. This is likely to cause problems due to the instability of the final arrangement and variations and thickness of various layers which will result in different degrees of bending.

Figure 11:
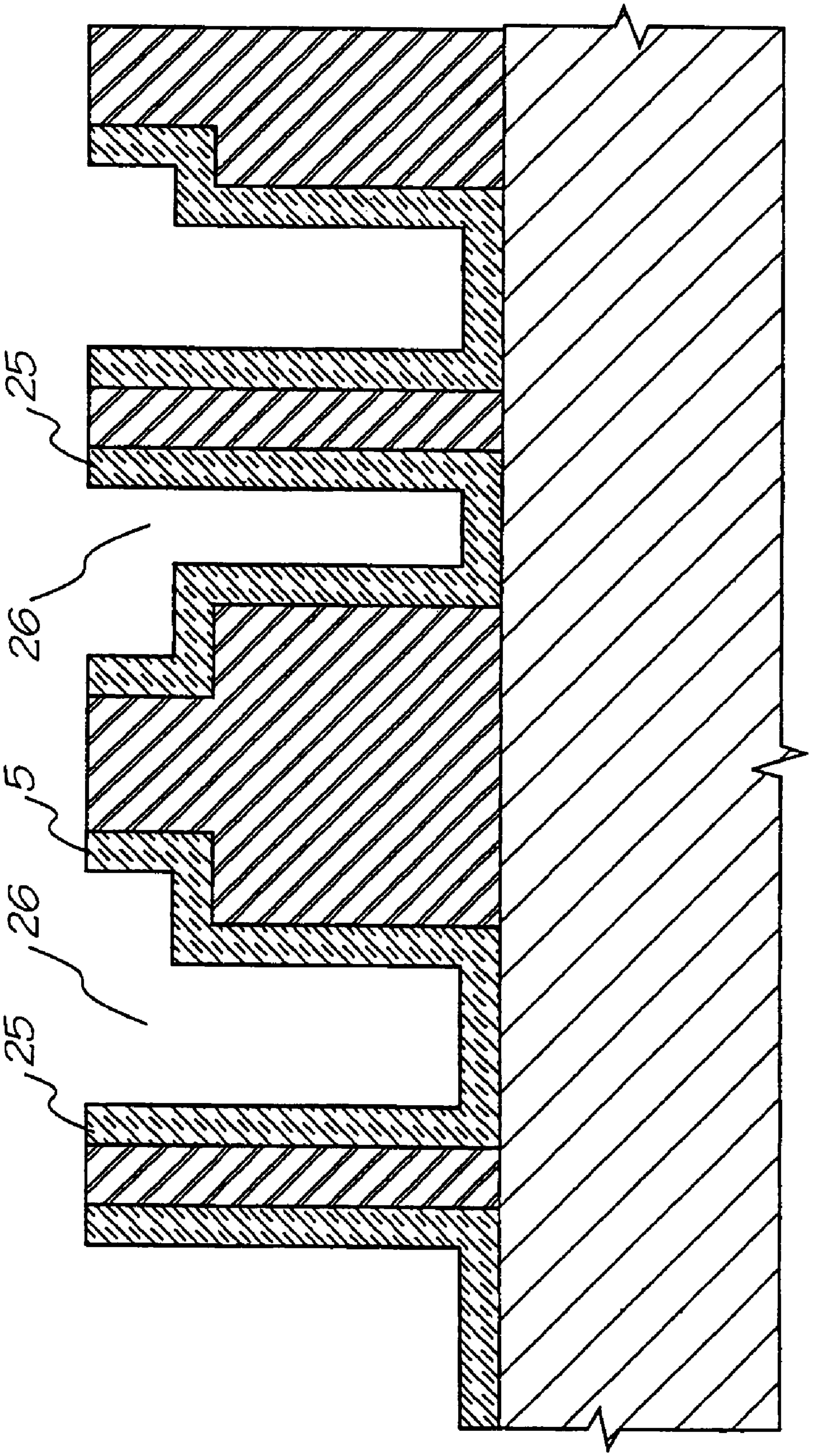
FIG. 11 is a sectional view of a process on constructing an ink jet nozzle after Chemical Mechanical Planarization.

Further, the arrangement described with reference to FIGS. 1 to 3 includes an ink jet spreading prevention rim 25 (FIG. 1) which is constructed so as to provide for a pit 26 around the nozzle rim 5. Any ink which should flow outside of the nozzle rim 5 is generally caught within the pit 26 around the rim and thereby prevented from flowing across the surface of the ink jet print head and influencing operation. This arrangement can be clearly seen in FIG. 11.

Figure 6:
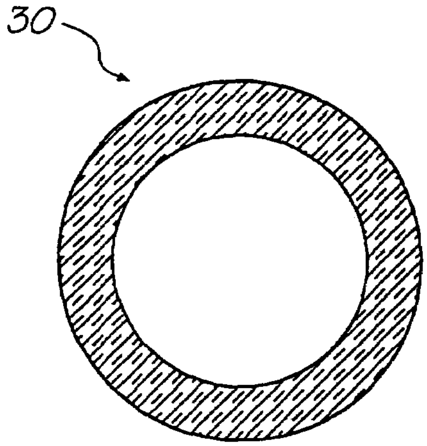
FIG. 6 is a top view of an aligned nozzle.
Figure 7:
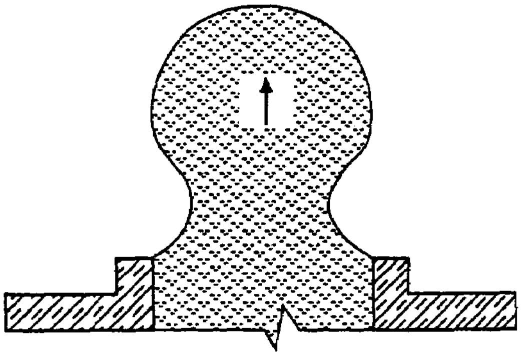
FIG. 7 is a sectional view of an aligned nozzle.
Figure 8:
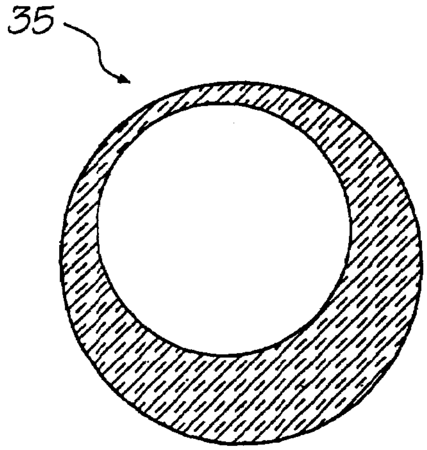
FIG. 8 is a top view of an aligned nozzle.
Figure 9:
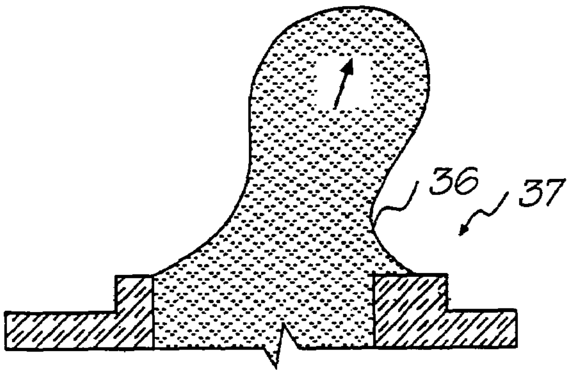
FIG. 9 is a sectional view of an aligned nozzle.

Further, the nozzle rim 5 and ink spread prevention rim 25 are formed via a unique chemical mechanical planarization technique. This arrangement can be understood by reference to FIG. 6 to FIG. 9. Ideally, an ink ejection nozzle rim is highly symmetrical in form as illustrated at 30 in FIG. 6. The utilization of a thin highly regular rim is desirable when it is time to eject ink. For example, in FIG. 7 there is illustrated a drop being ejected from a rim during the necking and breaking process. The necking and breaking process is a high sensitive one, complex chaotic forces being involved. Should standard lithography be utilized to form the nozzle rim, it is likely that the regularity or symmetry of the rim can only be guaranteed to within a certain degree of variation in accordance with the lithographic process utilized. This may result in a variation of the rim as illustrated at 35 in FIG. 8. The rim variation leads to a non-symmetrical rim 35 as illustrated in FIG. 8. This variation is likely to cause problems when forming a droplet. The problem is illustrated in FIG. 9 wherein the meniscus 36 creeps along the surface 37 where the rim is bulging to a greater width. This results in an ejected drop likely to have a higher variance in direction of ejection.

Figure 10:
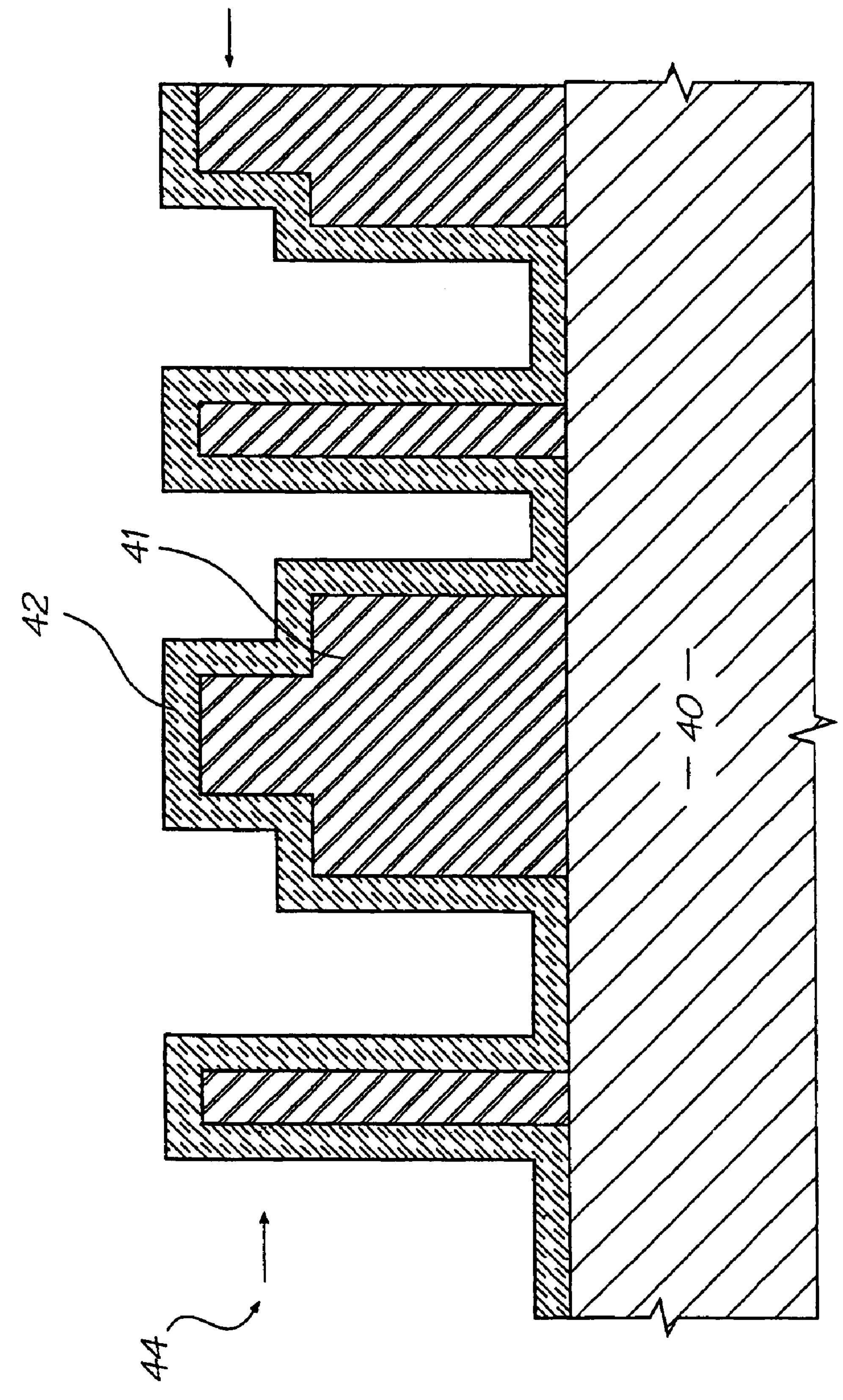
FIG. 10 is a sectional view of a process on constructing an ink jet nozzle.

In the preferred embodiment, to overcome this problem, a self aligning chemical mechanical planarization (CMP) technique is utilized. A simplified illustration of this technique will now be discussed with reference to FIG. 10. In FIG. 10, there is illustrated a silicon substrate 40 upon which is deposited a first sacrificial layer 41 and a thin nozzle layer 42 shown in exaggerated form. The sacrificial layer is first deposited and etched so as to form a "blank" for the nozzle layer 42 which is deposited over all surfaces conformally. In an alternative manufacturing process, a further sacrificial material layer can be deposited on top of the nozzle layer 42.

Next, the critical step is to chemically mechanically planarize the nozzle layer and sacrificial layers down to a first level eg. 44. The chemical mechanical planarization process acts to effectively "chop off" the top layers down to level 44. Through the utilization of conformal deposition, a regular rim is produced. The result, after chemical mechanical planarization, is illustrated schematically in FIG. 11.

The description of the preferred embodiments will now proceed by first describing an ink jet preheating step preferably utilized in the IJ46 device.

Ink Preheating

Figure 12:
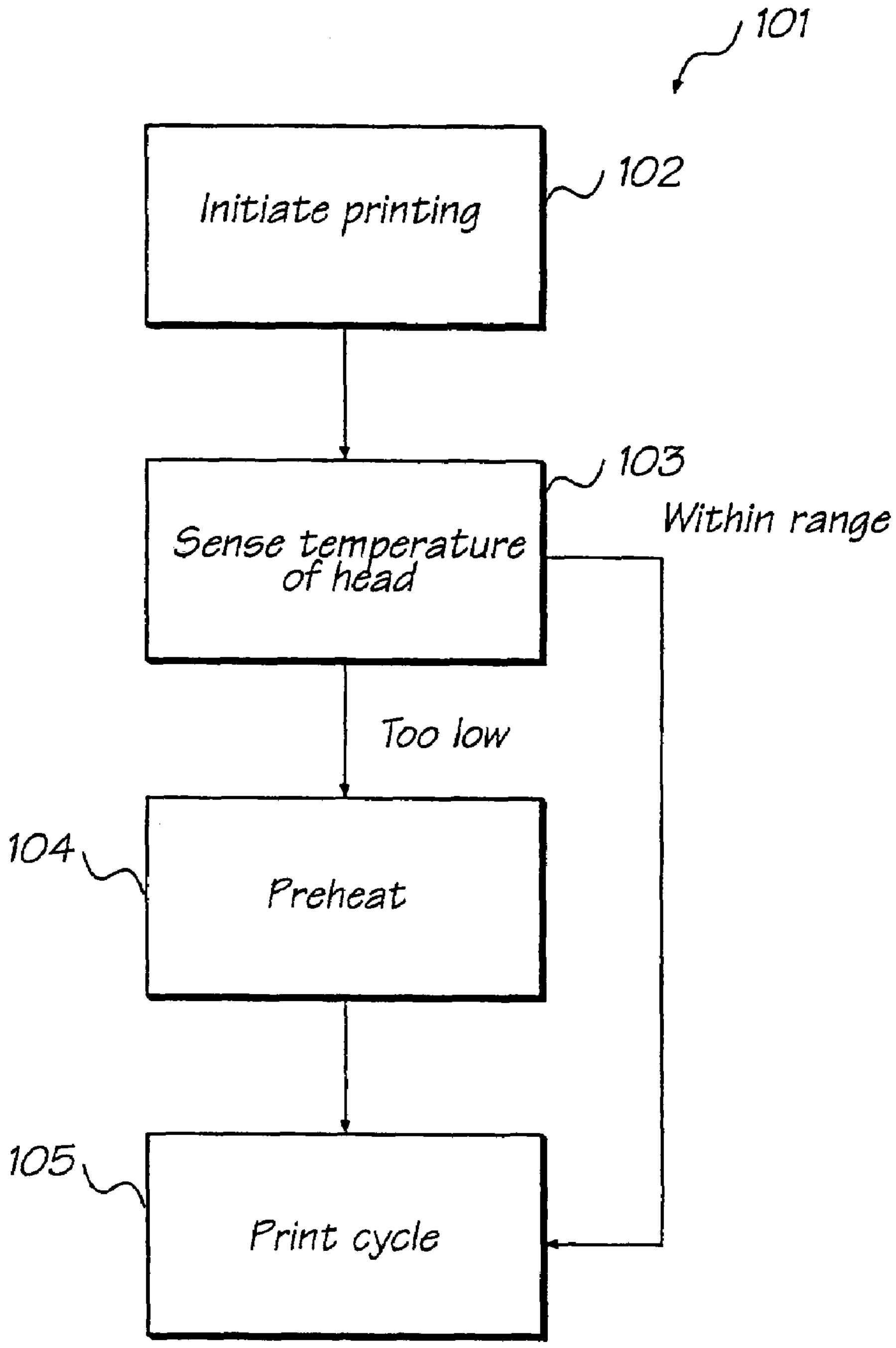
FIG. 12 illustrates the steps involved in the preferred embodiment in preheating the ink.

In the preferred embodiment, an ink preheating step is utilized so as to bring the temperature of the print head arrangement to be within a predetermined bound. The steps utilized are illustrated at 101 in FIG. 12. Initially, the decision to initiate a printing run is made at 102. Before any printing has begun, the current temperature of the print head is sensed to determine whether it is above a predetermined threshold. If the heated temperature is too low, a preheat cycle 104 is applied which heats the print head by means of heating the thermal actuators to be above a predetermined temperature of operation. Once the temperature has achieved a predetermined temperature, the normal print cycle 105 has begun.

The utilization of the preheating step 104 results in a general reduction in possible variation in factors such as viscosity etc. allowing for a narrower operating range of the device and, the utilization of lower thermal energies in ink ejection.

Figure 13:
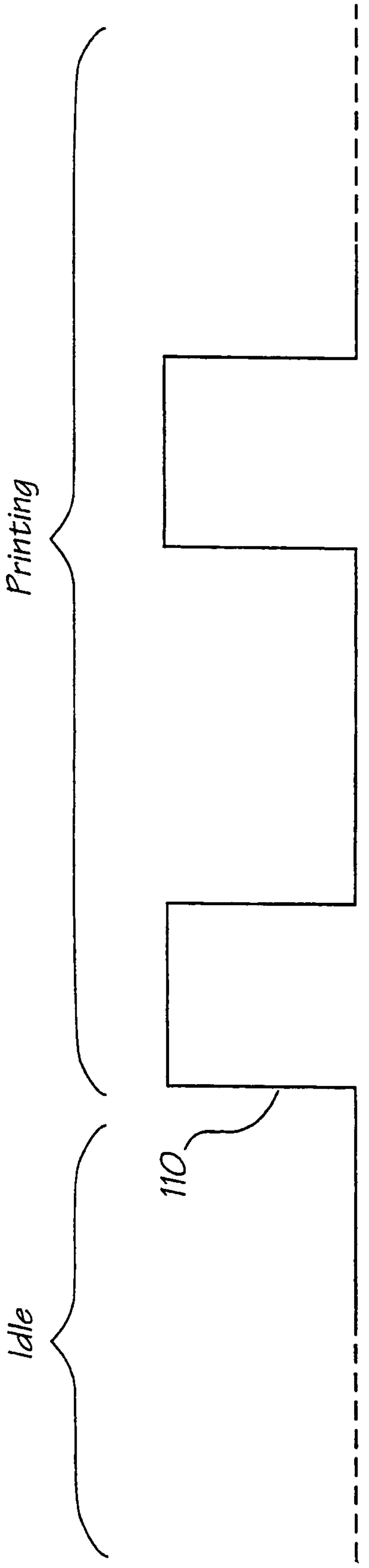
FIG. 13 illustrates the normal printing clocking cycle.

The preheating step can take a number of different forms. Where the ink ejection device is of a thermal bend actuator type, it would normally receive a series of clock pulse as illustrated in FIG. 13 with the ejection of ink requiring a clock pulses 110 of a predetermined thickness so as to provide enough energy for ejection.

Figure 14:
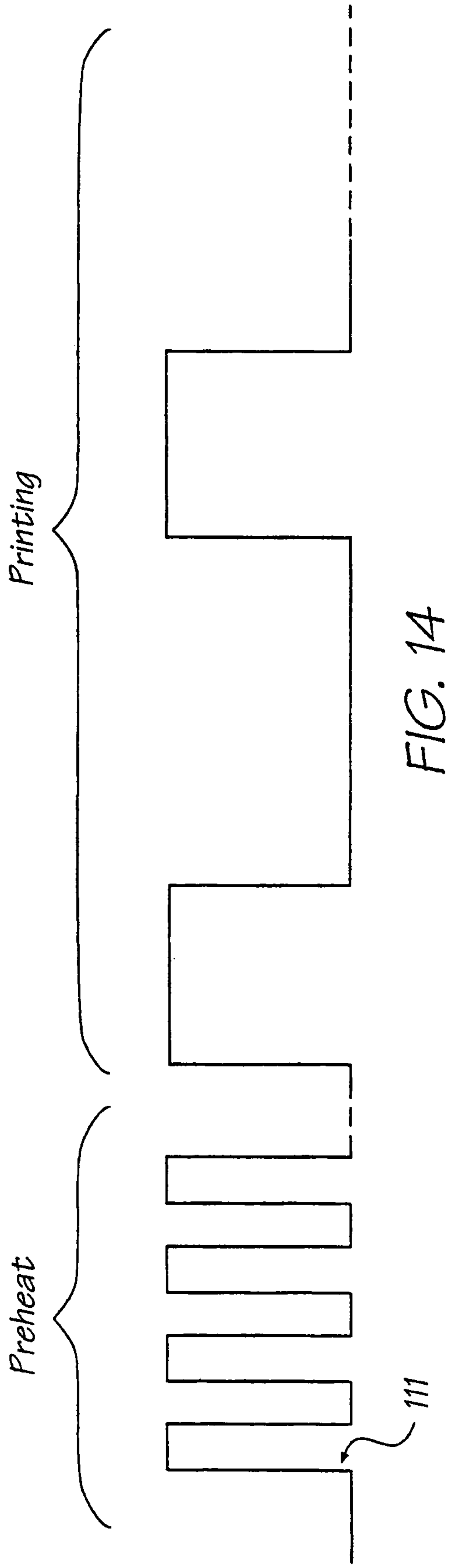
FIG. 14 illustrates the utilization of a preheating cycle.
Figure 15:
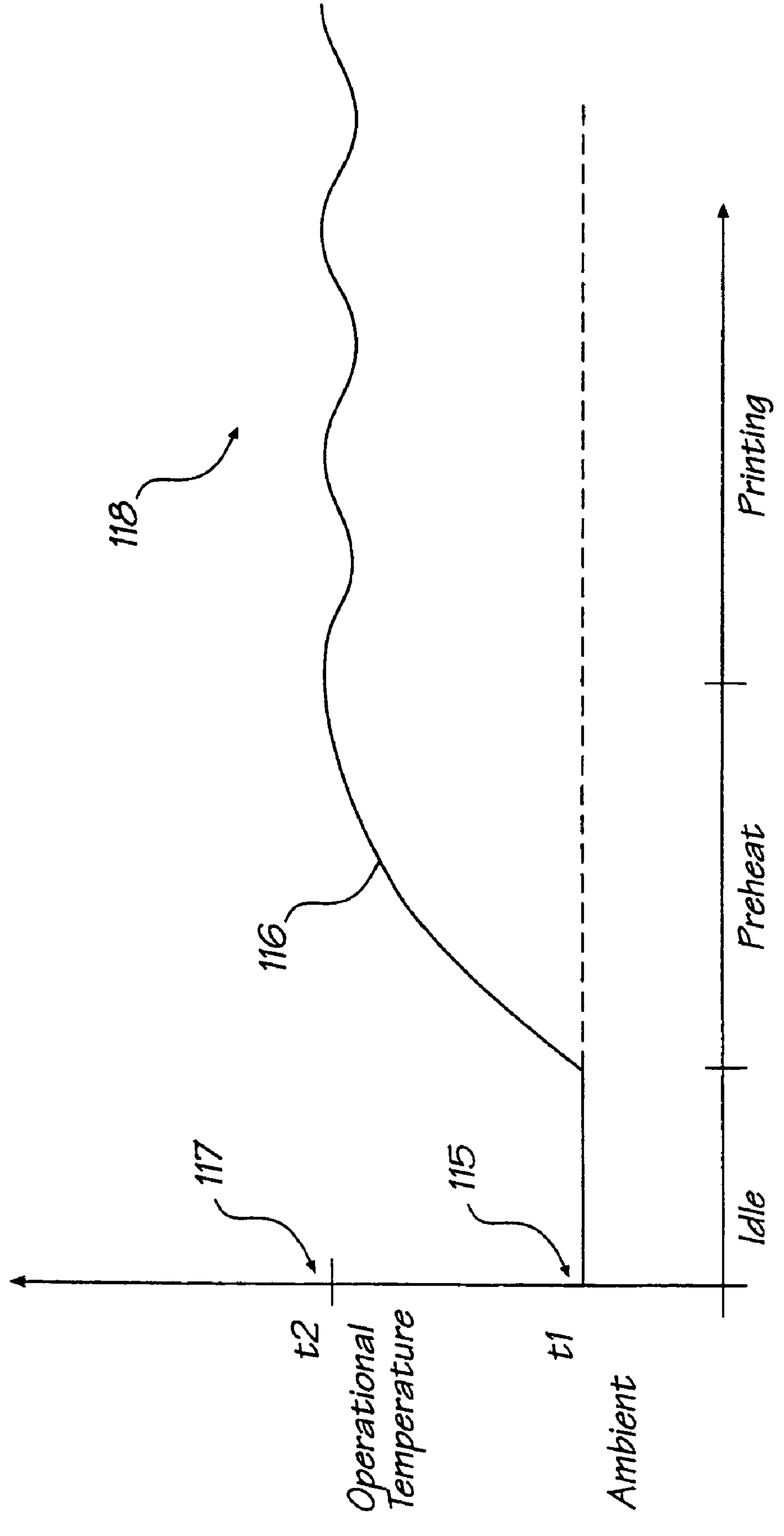
FIG. 15 illustrates a graph of likely print head operation temperature.

As illustrated in FIG. 14, when it is desired to provide for preheating capabilities, these can be provided through the utilization of a series of shorter pulses eg. 111 which whilst providing thermal energy to the print head, fail to cause ejection of the ink from the ink ejection nozzle.

Figure 16:
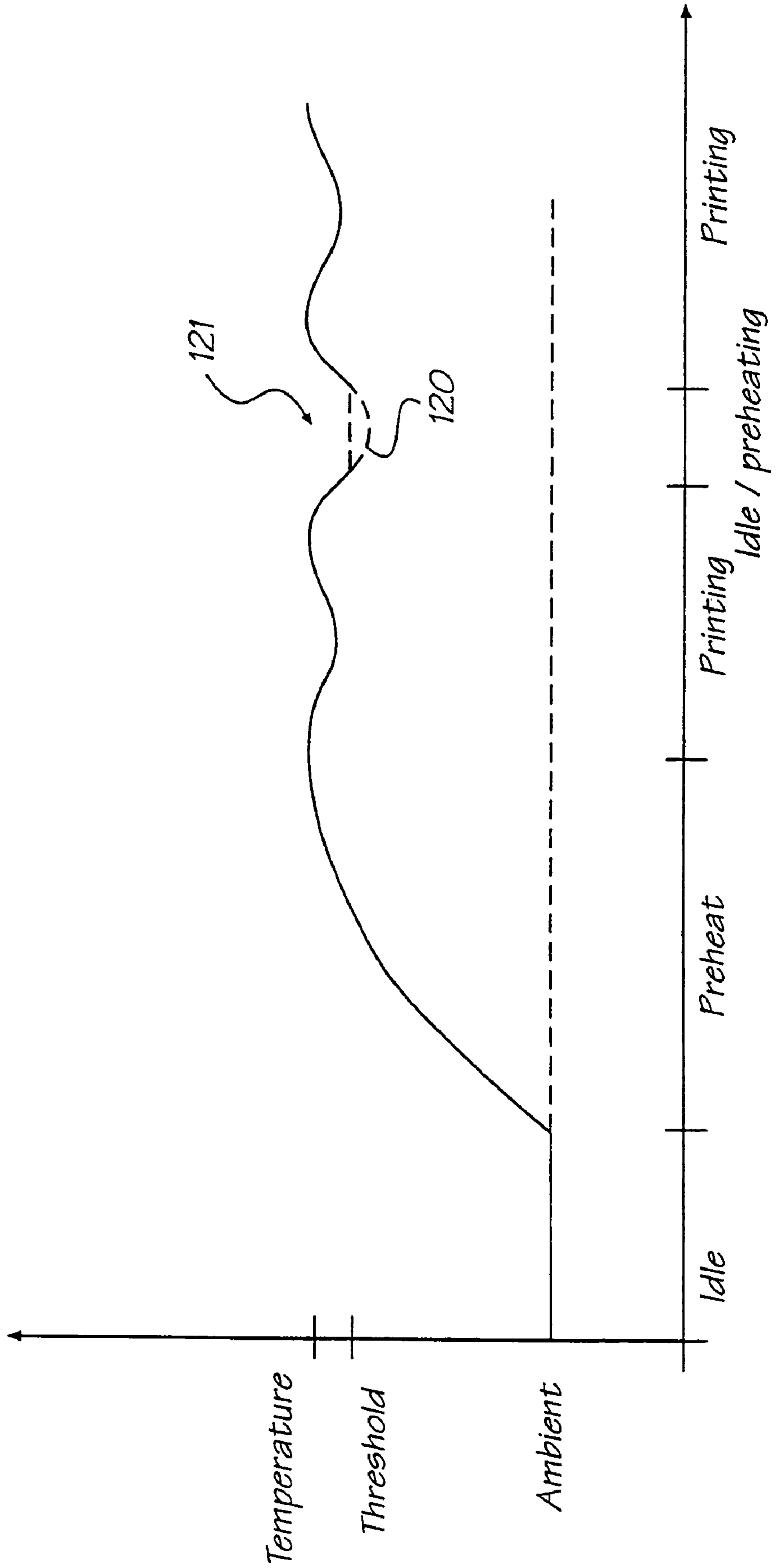
FIG. 16 illustrates a graph of likely print head operation temperature.

FIG. 16 illustrates an example graph of the print head temperature during a printing operation. Assuming the print head has been idle for a substantial period of time, the print head temperature, initially 115, will be the ambient temperature. When it is desired to print, a preheating step (104 of FIG. 12) is executed such that the temperature rises as shown at 116 to an operational temperature T2 at 117, at which point printing can begin and the temperature left to fluctuate in accordance with usage requirements.

Alternately, as illustrated in FIG. 16, the print head temperature can be continuously monitored such that should the temperature fall below a threshold eg. 120, a series of preheating cycles are injected into the printing process so as to increase the temperature to 121, above a predetermined threshold.

Assuming the ink utilized has properties substantially similar to that of water, the utilization of the preheating step can take advantage of the substantial fluctuations in ink viscosity with temperature. Of course, other operational factors may be significant and the stabilisation to a narrower temperature range provides for advantageous effects. As the viscosity changes with changing temperature, it would be readily evident that the degree of preheating required above the ambient temperature will be dependant upon the ambient temperature and the equilibrium temperature of the print head during printing operations. Hence, the degree of preheating may be varied in accordance with the measured ambient temperature so as to provide for optimal results.

Figure 17:
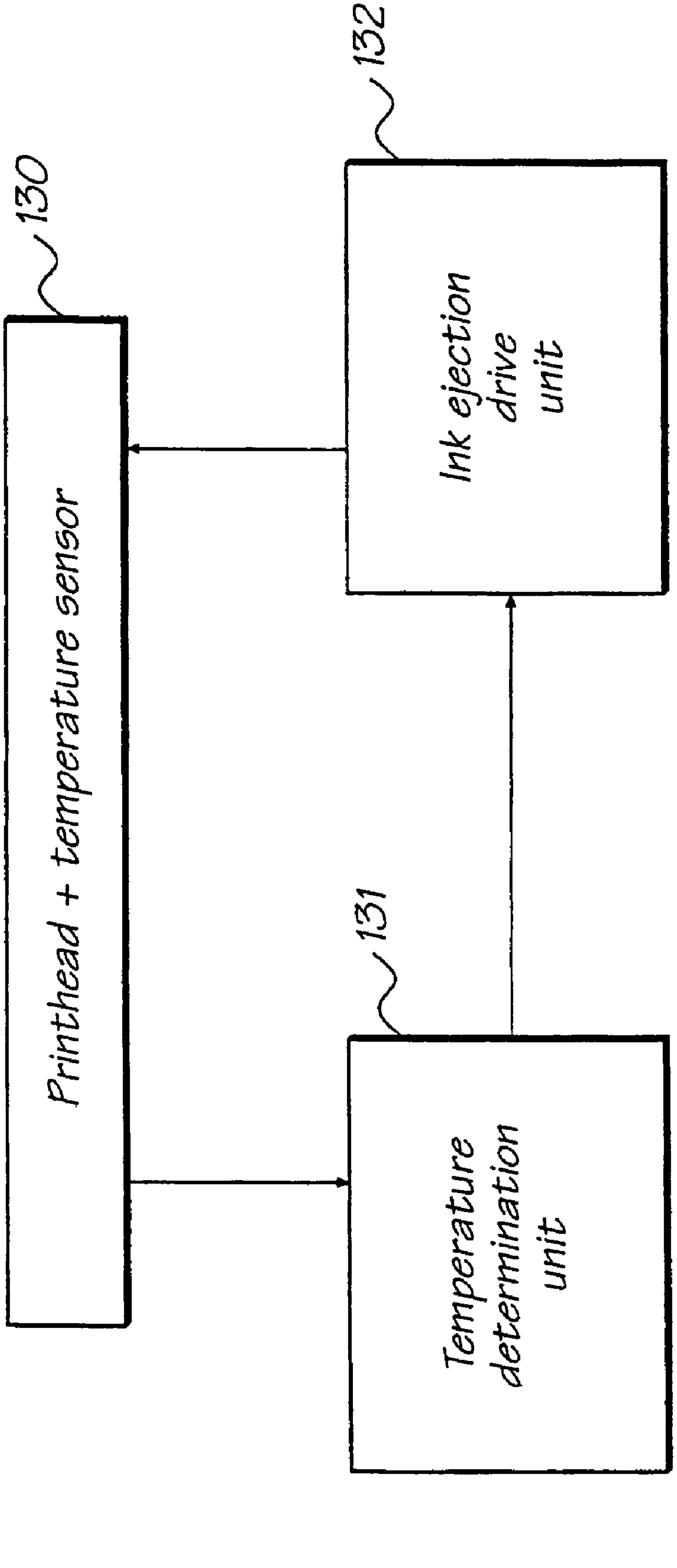
FIG. 17 illustrates one form of driving a print head for preheating

A simple operational schematic is illustrated in FIG. 17 with the print head 130 including an on-board series of temperature sensors which are connected to a temperature determination unit 131 for determining the current temperature which in turn outputs to an ink ejection drive unit 132 which determines whether preheating is required at any particular stage. The on-chip (print head) temperature sensors can be simple MEMS temperature sensors, the construction of which is well known to those skilled in the art.

Manufacturing Process

IJ46 device manufacture can be constructed from a combination of standard CMOS processing, and MEMS post-processing. Ideally, no materials should be used in the MEMS portion of the processing which are not already in common use for CMOS processing. In the preferred embodiment, the only MEMS materials are PECVD glass, sputtered TiN, and a sacrificial material (which may be polyimide, PSG, BPSG, aluminum, or other materials). Ideally, to fit corresponding drive circuits between the nozzles without increasing chip area, the minimum process is a 0.5 micron, one poly, 3 metal CMOS process with aluminum metalization. However, any more advanced process can be used instead. Alternatively, NMOS, bipolar, BiCMOS, or other processes may be used. CMOS is recommended only due to its prevalence in the industry, and the availability of large amounts of CMOS fab capacity.

For a 100 mm photographic print head using the CMY process color model, the CMOS process implements a simple circuit consisting of 19,200 stages of shift register, 19,200 bits of transfer register, 19,200 enable gates, and 19,200 drive transistors. There are also some clock buffers and enable decoders. The clock speed of a photo printhead is only 3.8 MHz, and a 30 ppm A4 print head is only 14 MHz, so the CMOS performance is not critical. The CMOS process is fully completed, including passivation and opening of bond pads before the MEMS processing begins. This allows the CMOS processing to be completed in a standard CMOS fab, with the MEMS processing being performed in a separate facility.

Reasons for Process Choices

It will be understood from those skilled in the art of manufacture of MEMS devices that there are many possible process sequences for the manufacture of an IJ46 print head. The process sequence described here is based on a 'generic' 0.5 micron (drawn) n-well CMOS process with 1 poly and three metal layers. This table outlines the reasons for some of the choices of this nominal process, to make it easier to determine the effect of any alternative process choices.

| Nominal Process | Reason |
|---|---|
| CMOS | Wide availability |
| 0.5 micron or less | 0.5 micron is required to fit drive electronics under the actuators |
| 0.5 micron or more | Fully amortized fabs, low cost |
| N-well | Performance of n-channel is more important than p-channel transistors |
| 6" wafers | Minimum practical for 4" monolithic print heads |
| 1 polysilicon layer | 2 poly layers are not required, as there is little low current connectivity |
| 3 metal layers | To supply high currents, most of metal 3 also provides sacrificial structures |
| Aluminum metalization | Low cost, standard for 0.5 micron processes (copper may be more efficient) |

| | | | | | | |
|---|---|---|---|---|---|---|
| | | Mask Summary | | | | |
| Mask # | Mask | Notes | Type | Pattern | Align to | CD |
| 1 | N-well | | CMOS 1 | Light | Flat | 4 μm |
| 2 | Active | Includes nozzle chamber | CMOS 2 | Dark | N-Well | 1 μm |
| 3 | Poly | | CMOS 3 | Dark | Active | 0.5 μm |
| 4 | N+ | | CMOS 4 | Dark | Poly | 4 μm |
| 5 | P+ | | CMOS 4 | Light | Poly | 4 μm |
| 6 | Contact | Includes nozzle chamber | CMOS 5 | Light | Poly | 0.5 μm |
| 7 | Metal 1 | | CMOS 6 | Dark | Contact | 0.6 μm |
| 8 | Via 1 | Includes nozzle chamber | CMOS 7 | Light | Metal 1 | 0.6 μm |
| 9 | Metal 2 | Includes sacrificial al. | CMOS 8 | Dark | Via 1 | 0.6 μm |
| 10 | Via 2 | Includes nozzle chamber | CMOS 9 | Light | Metal 2 | 0.6 μm |
| 11 | Metal 3 | Includes sacrificial al. | CMOS 10 | Dark | Poly | 1 μm |
| 12 | Via 3 | Overcoat, but 0.6 μm CD | CMOS 11 | Light | Poly | 0.6 μm |
| 13 | Heater | | MEMS 1 | Dark | Poly | 0.6 μm |
| 14 | Actuator | | MEMS 2 | Dark | Heater | 1 μm |
| 15 | Nozzle | For CMP control | MEMS 3 | Dark | Poly | 2 μm |
| 16 | Chamber | | MEMS 4 | Dark | Nozzle | 2 μm |
| 17 | Inlet | Backside deep silicon etch | MEMS 5 | Light | Poly | 4 μm |

Example Process Sequence (Including CMOS Steps)

Although many different CMOS and other processes can be used, this process description is combined with an example CMOS process to show where MEMS features are integrated in the CMOS masks, and show where the CMOS process may be simplified due to the low CMOS performance requirements.

Process steps described below are part of the example 'generic' 1P3M 0.5 micron CMOS process.

Figure 18:
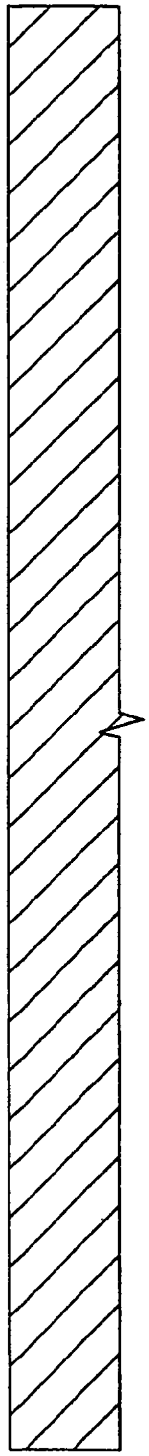
FIG. 18 illustrates a sectional view of a portion of an initial wafer on which an ink jet nozzle structure is to be formed.
Figure 19:
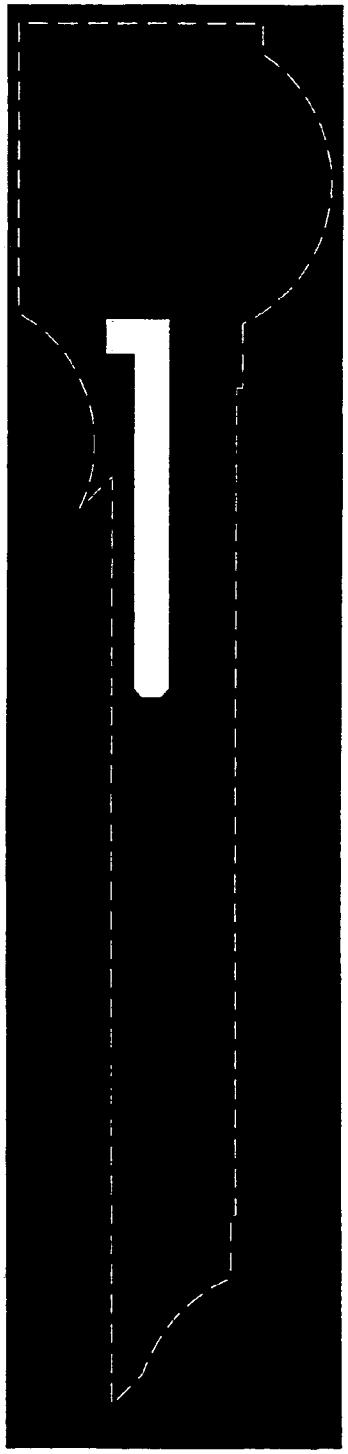
FIG. 19 illustrates the mask for N-well processing.
Figure 20:
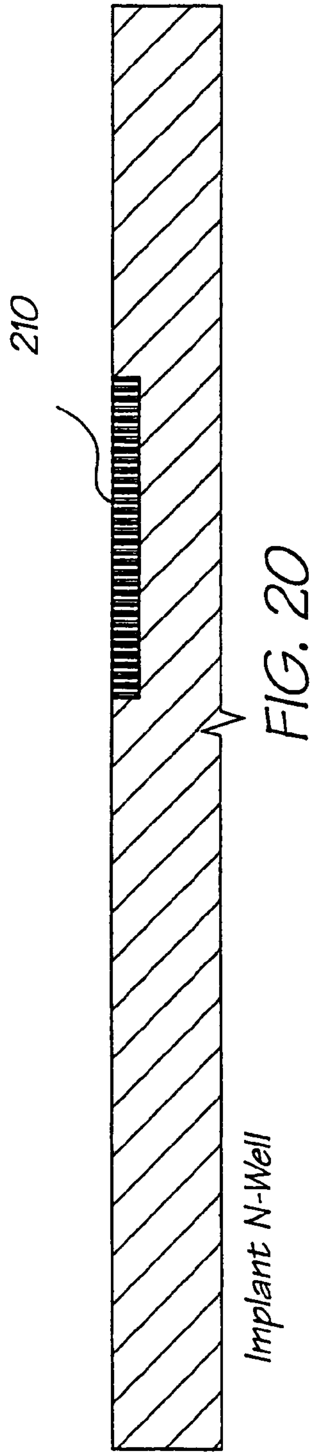
FIG. 20 illustrates a sectional view of a portion of the wafer after N-well processing.
Figure 21:
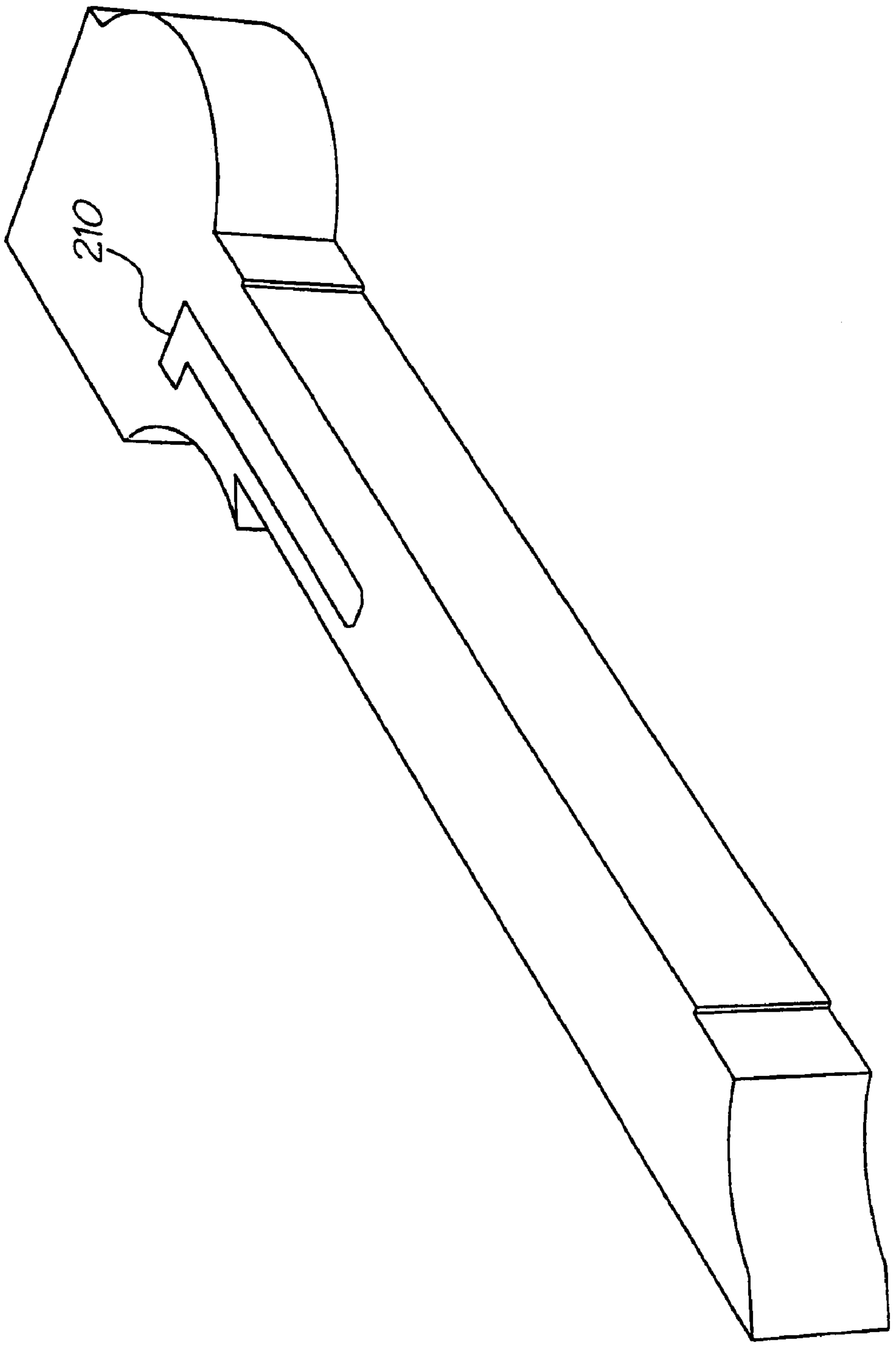
FIG. 21 illustrates a side perspective view partly in section of a single nozzle after N-well processing.
Figure 22:
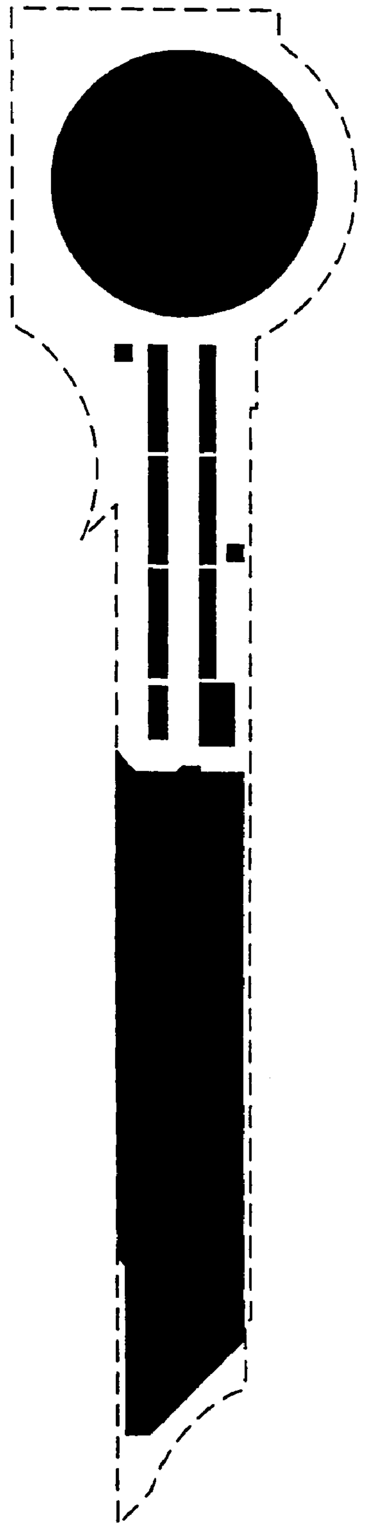
FIG. 22 illustrates the active channel mask.
Figure 23:
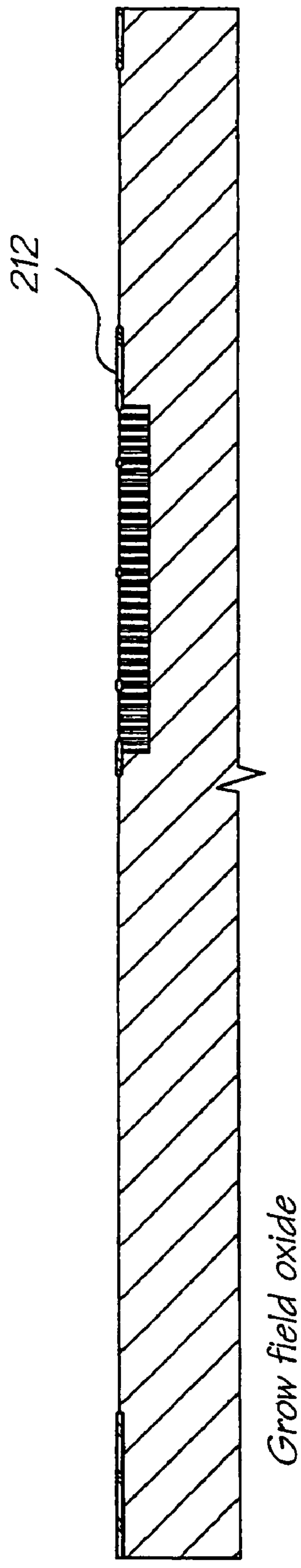
FIG. 23 illustrates a sectional view of the field oxide.
Figure 24:
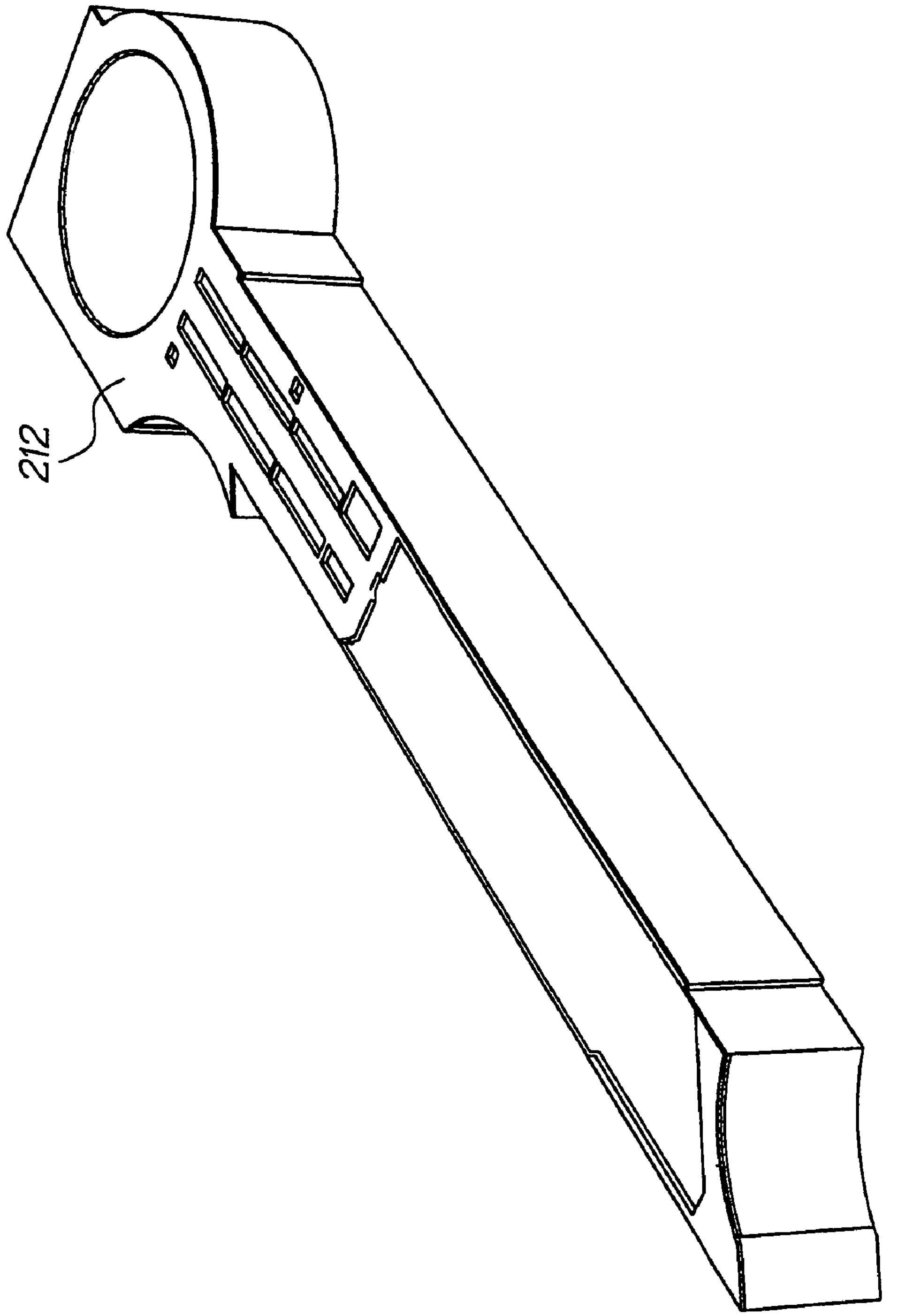
FIG. 24 illustrates a side perspective view partly in section of a single nozzle after field oxide deposition.
Figure 25:
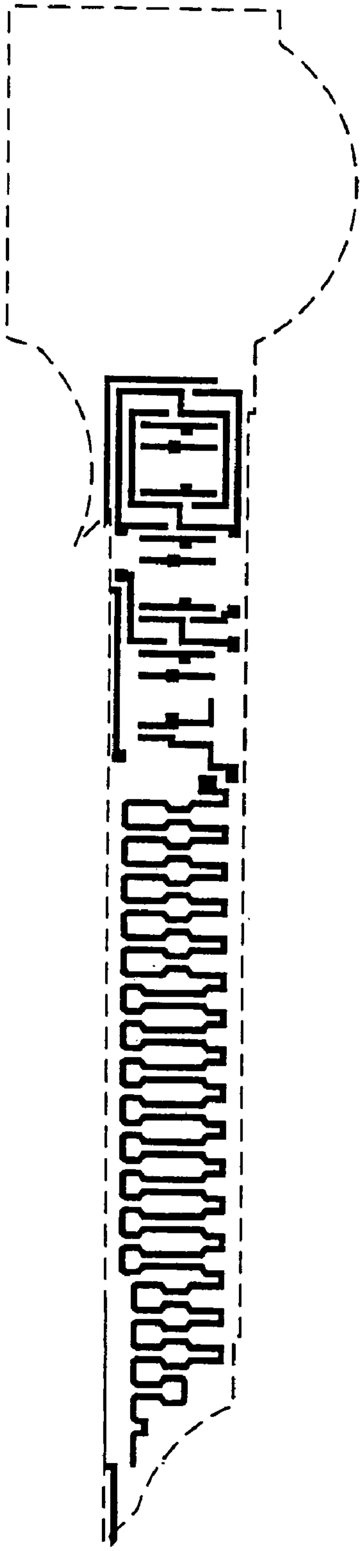
FIG. 25 illustrates the poly mask.
Figure 26:
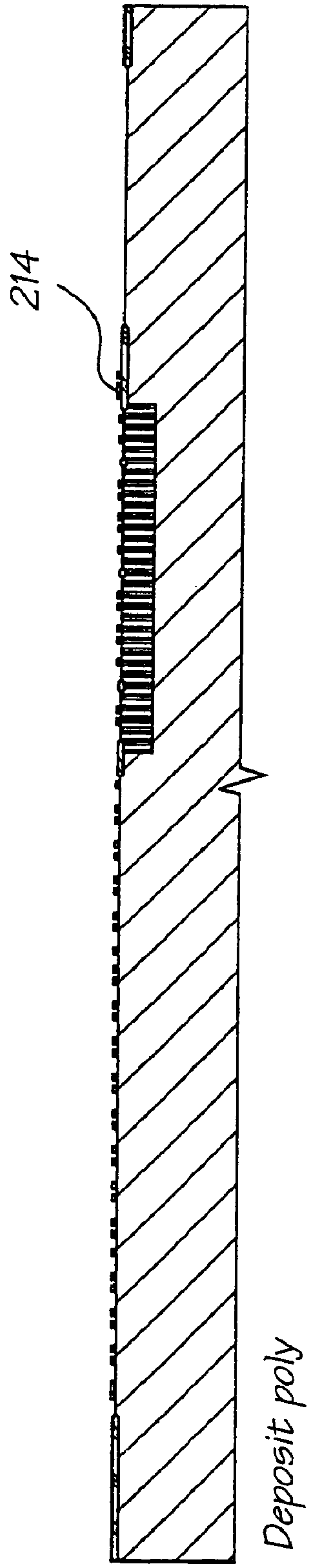
FIG. 26 illustrates a sectional view of the deposited poly.
Figure 27:
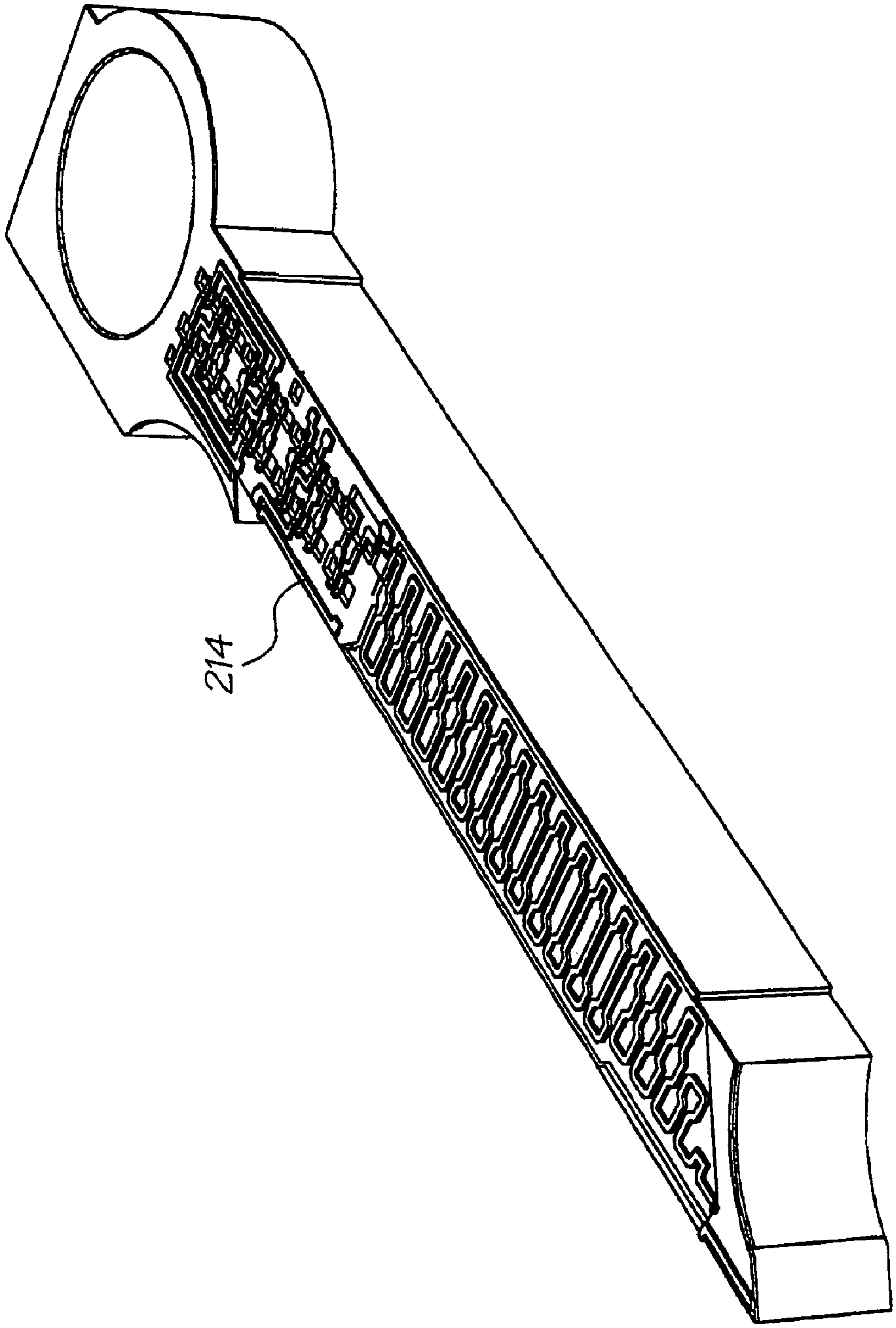
FIG. 27 illustrates a side perspective view partly in section of a single nozzle after poly deposition.
Figure 28:
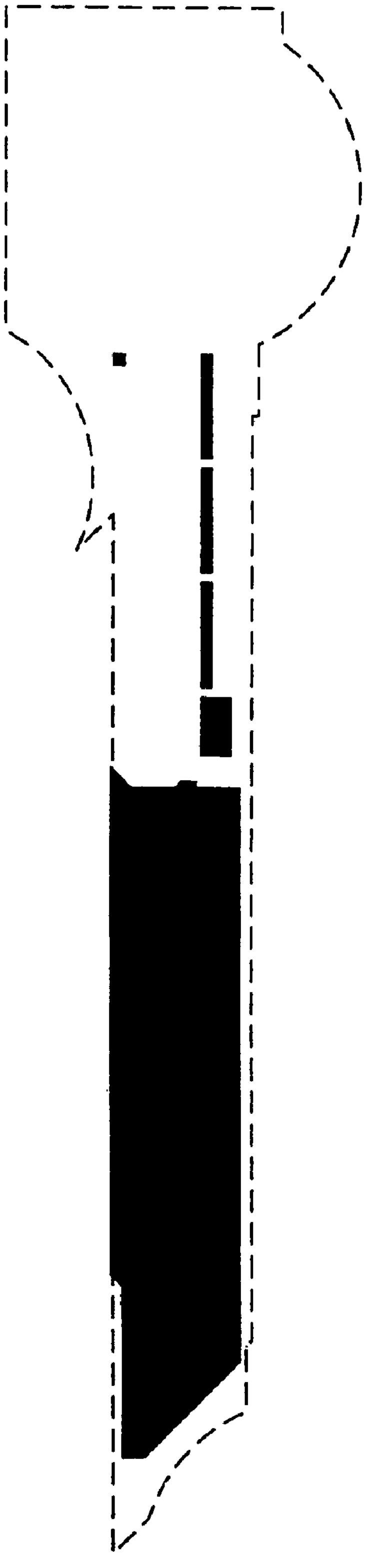
FIG. 28 illustrates the n+ mask.
Figure 29:
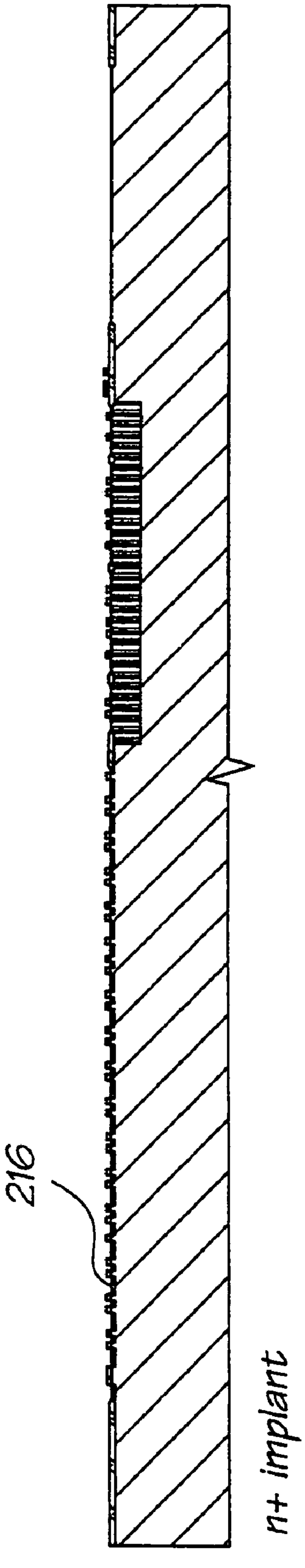
FIG. 29 illustrates a sectional view of the n+ implant.
Figure 30:
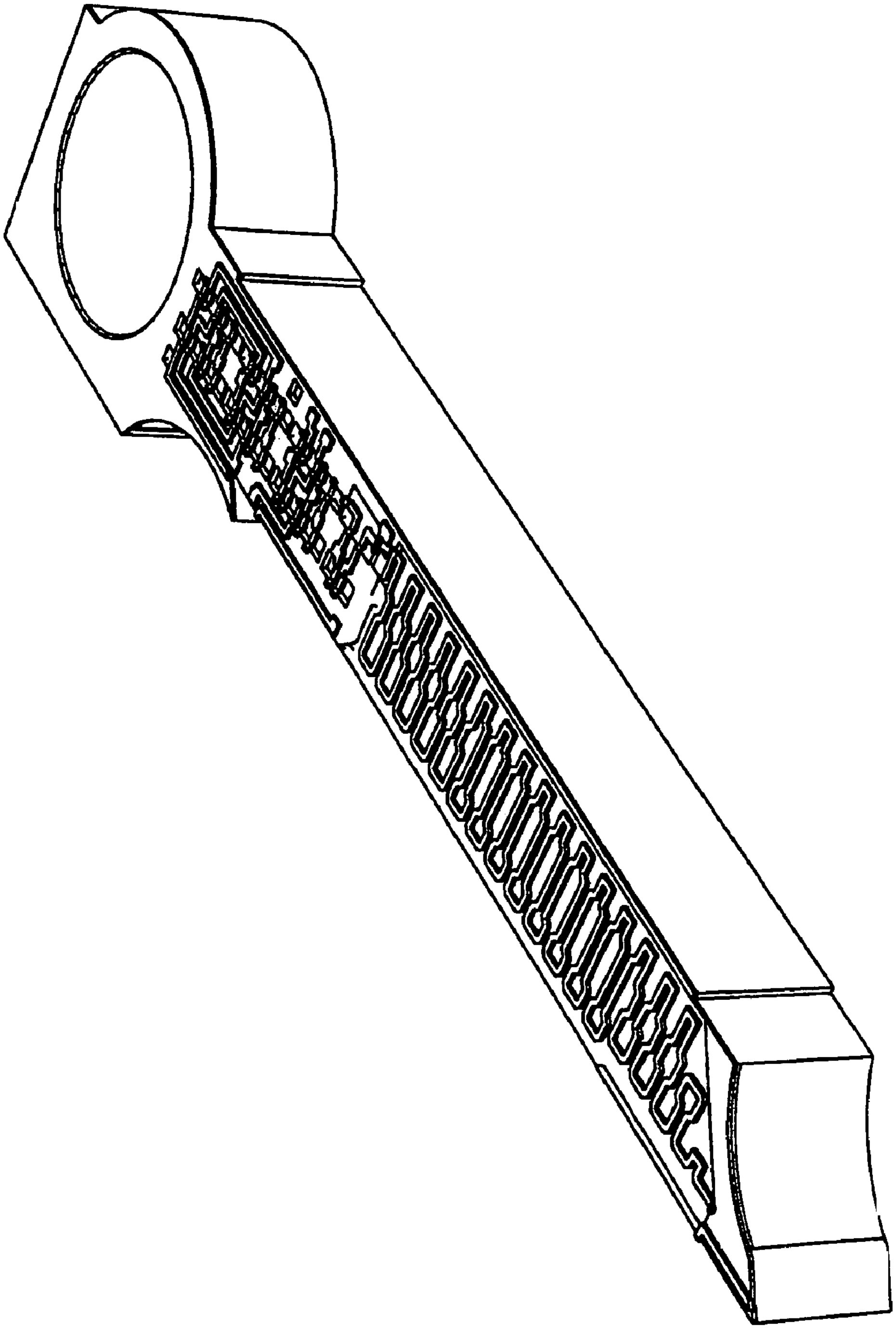
FIG. 30 illustrates a side perspective view partly in section of a single nozzle after n+ implant.
Figure 31:
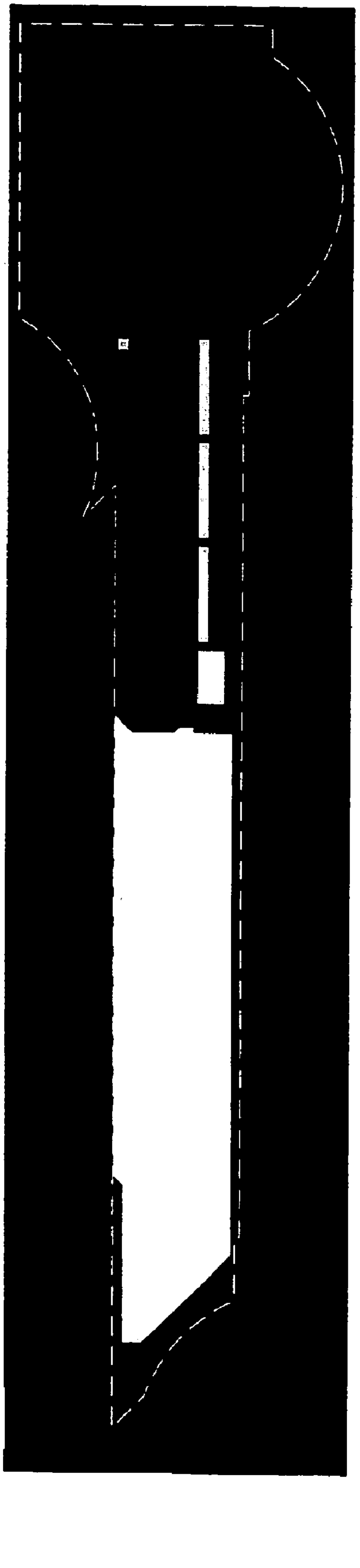
FIG. 31 illustrates the p+ mask.
Figure 32:
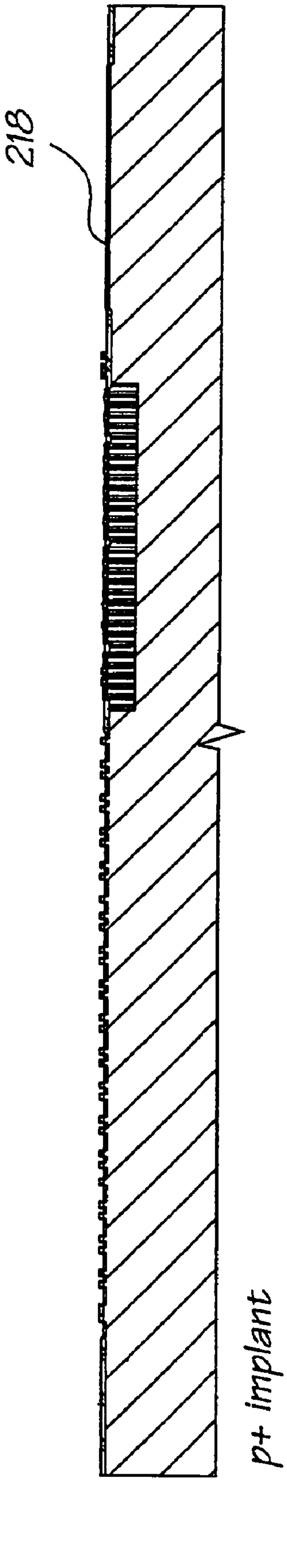
FIG. 32 illustrates a sectional view showing the effect of the p+ implant.
Figure 33:
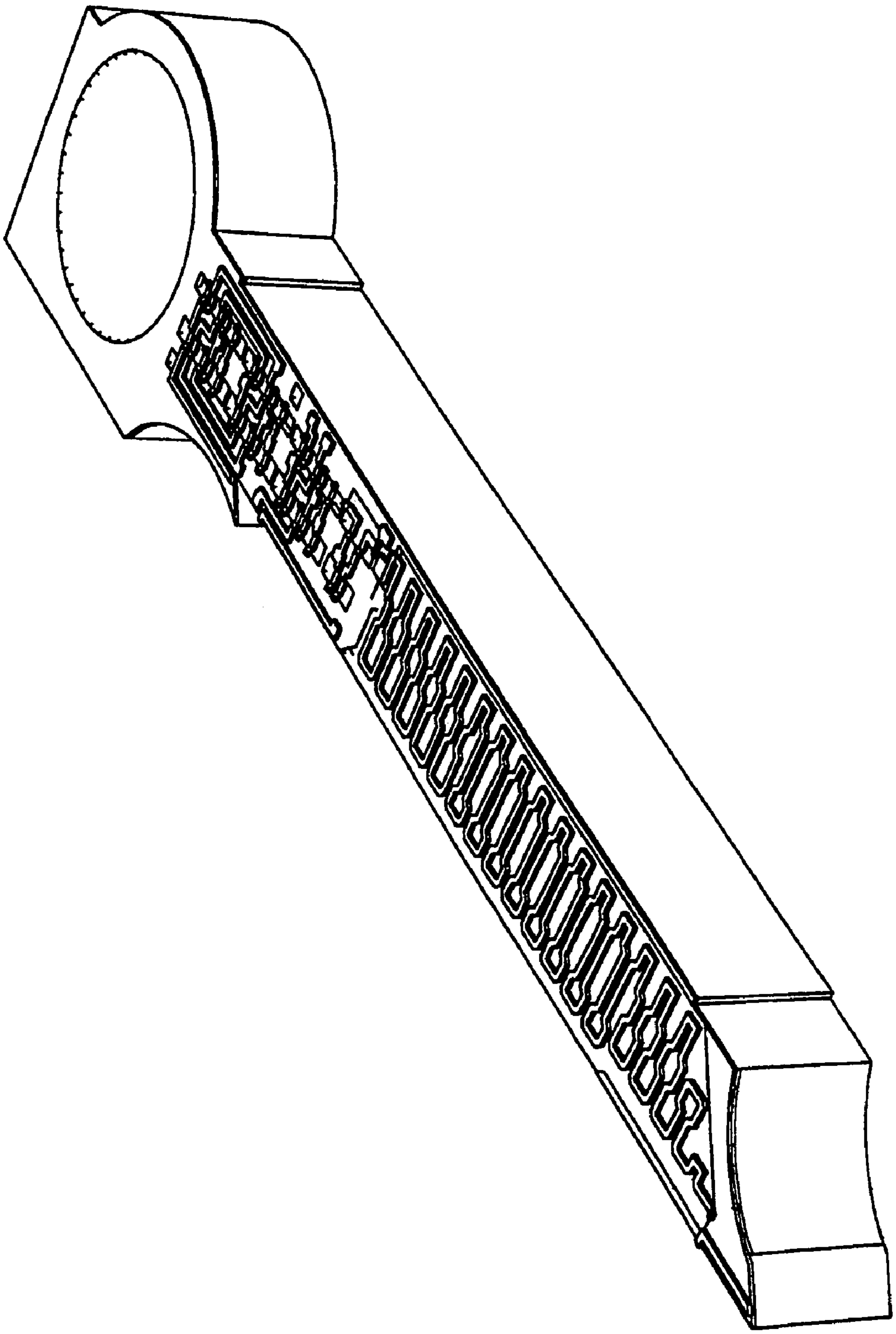
FIG. 33 illustrates a side perspective view partly in section of a single nozzle after p+implant.
Figure 34:
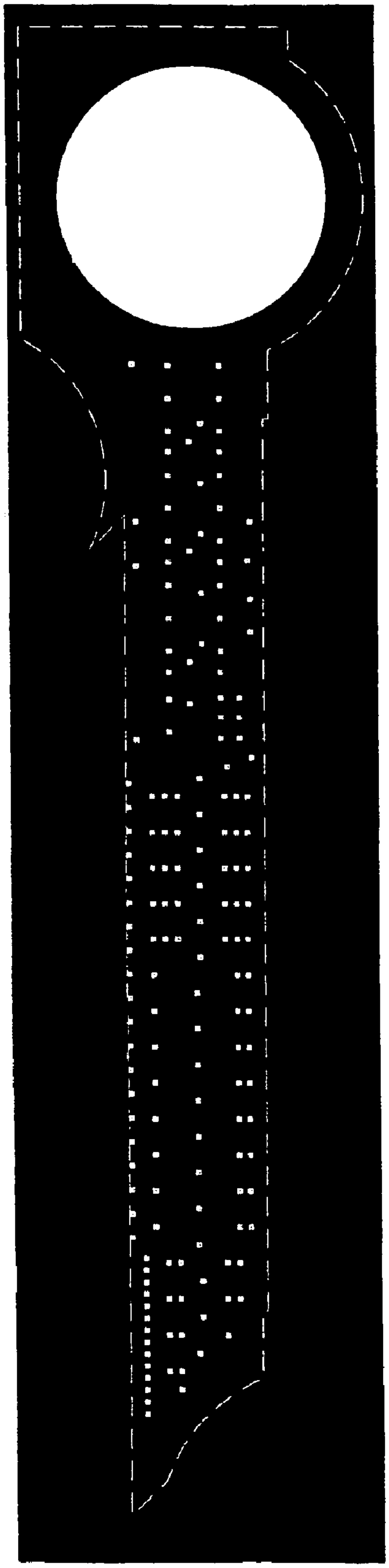
FIG. 34 illustrates the contacts mask.
Figure 35:
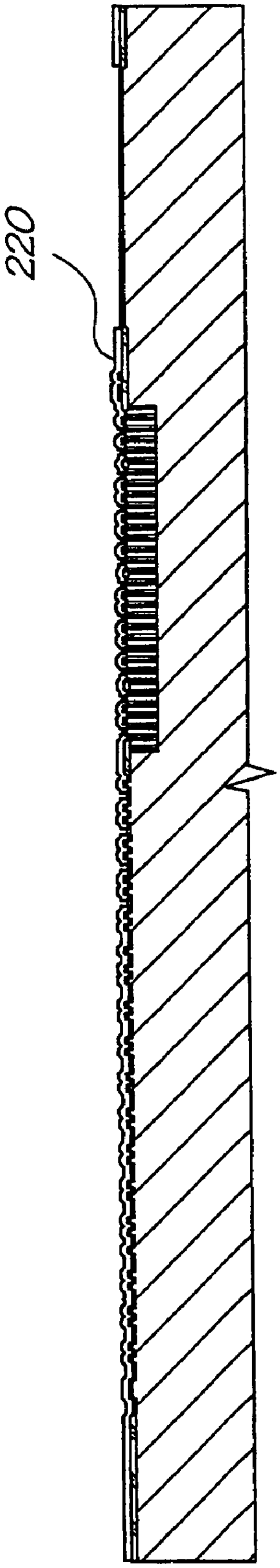
FIG. 35 illustrates a sectional view showing the effects of depositing ILD 1 and etching contact vias.
Figure 36:
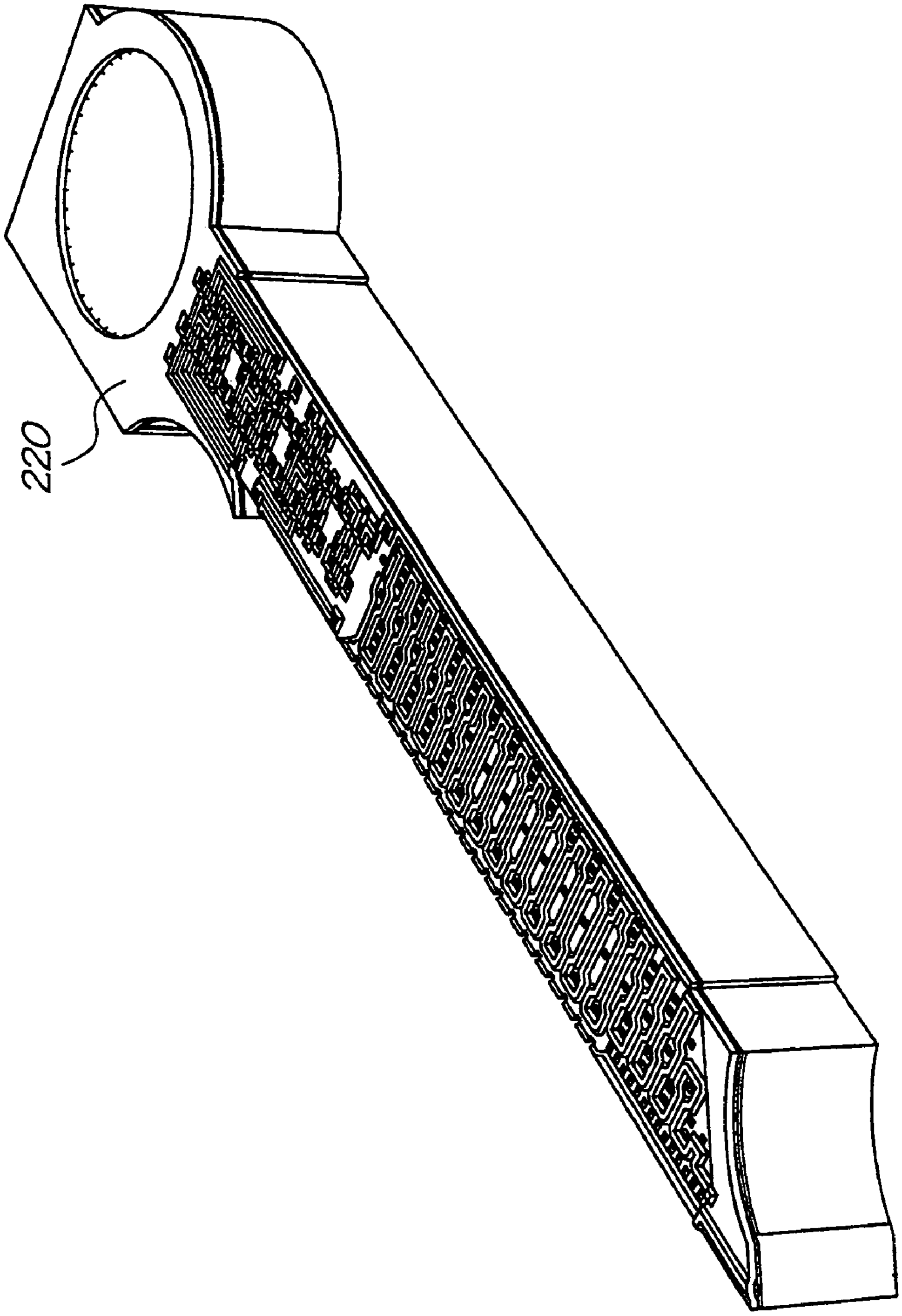
FIG. 36 illustrates a side perspective view partly in section of a single nozzle after depositing ILD 1 and etching contact vias.
Figure 37:
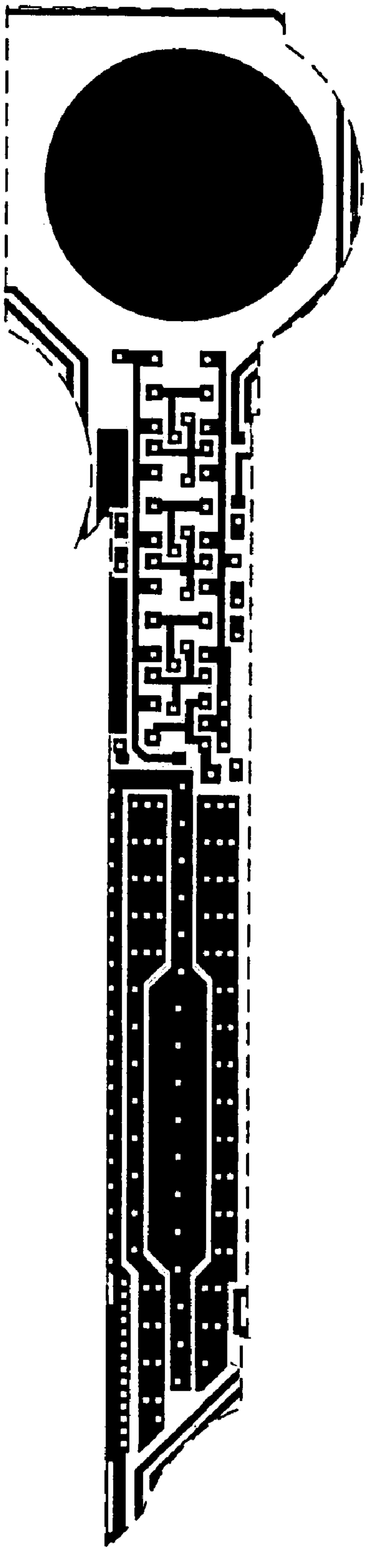
FIG. 37 illustrates the Metal 1 mask.
Figure 38:
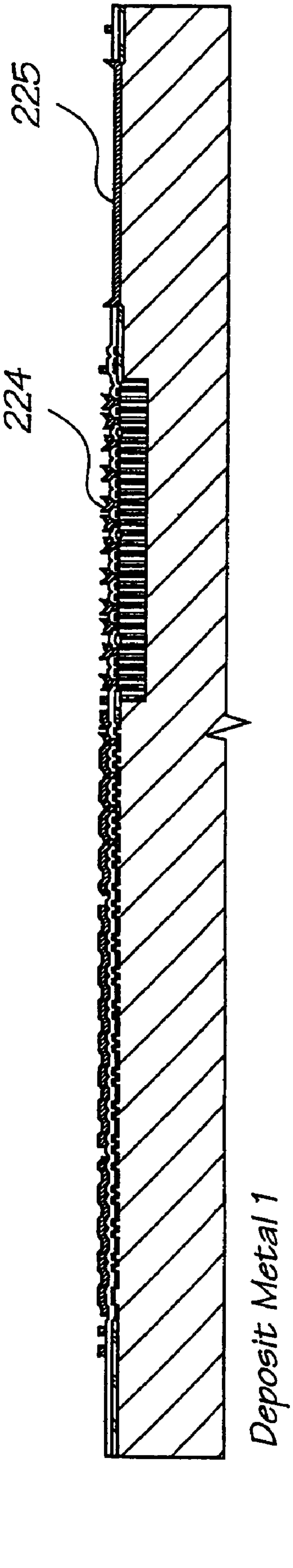
FIG. 38 illustrates a sectional view showing the effect of the metal deposition of the Metal 1 layer.
Figure 39:
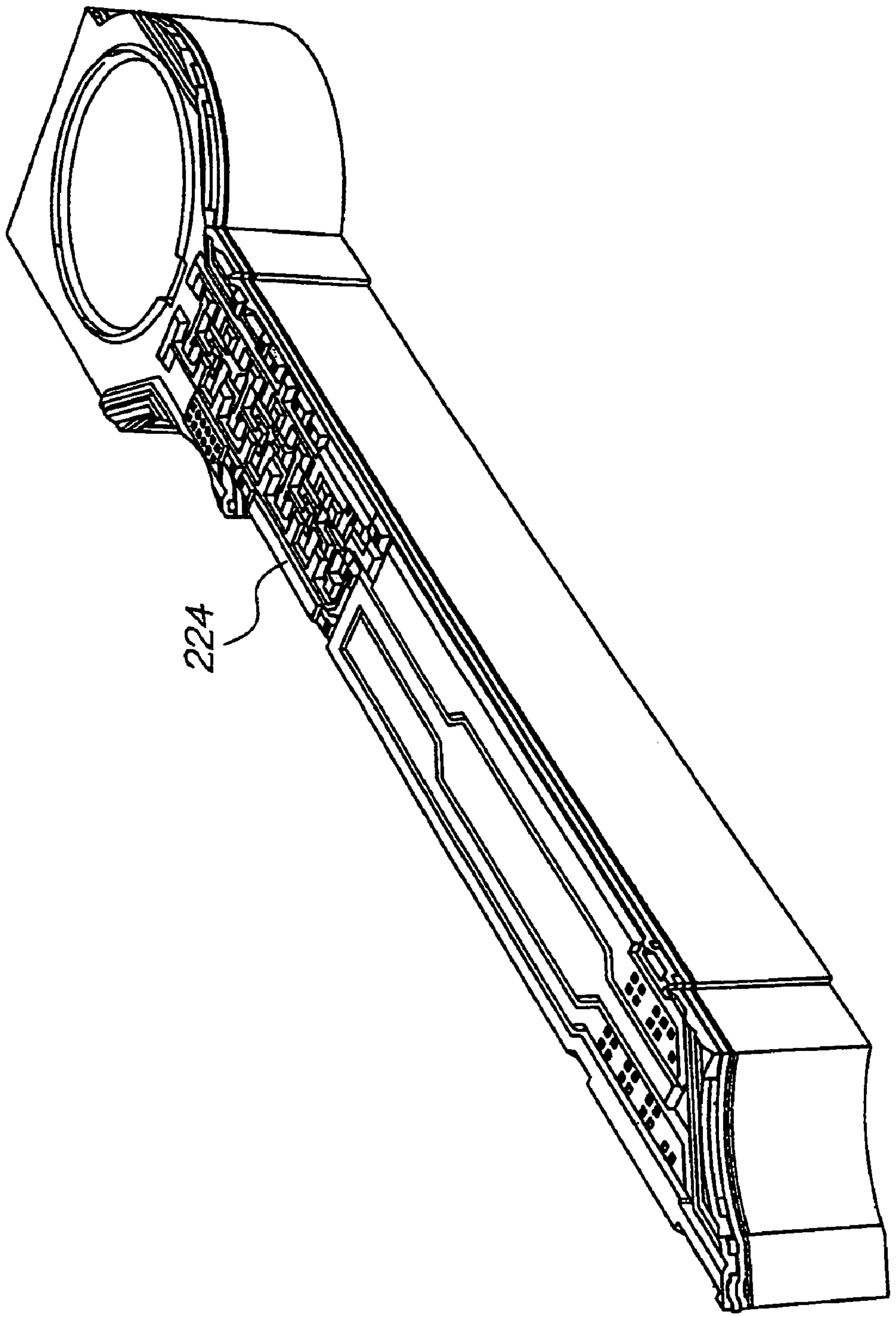
FIG. 39 illustrates a side perspective view partly in section of a single nozzle after metal 1 deposition.
Figure 40:
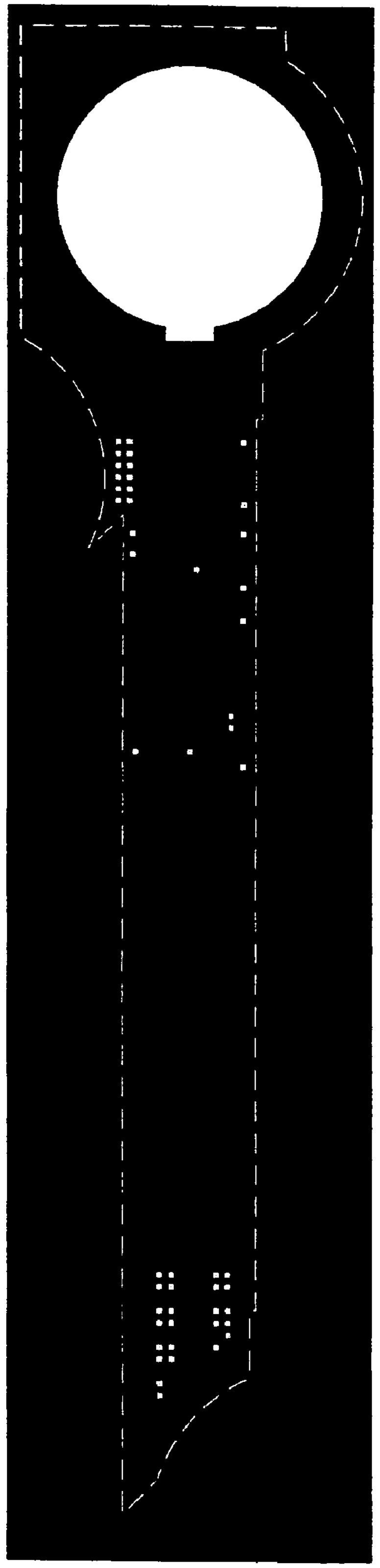
FIG. 40 illustrates the Via 1 mask.
Figure 41:
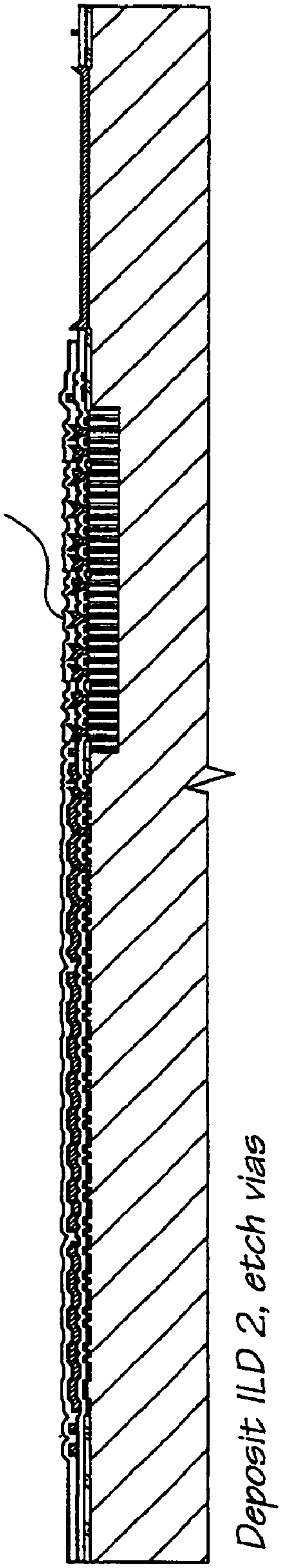
FIG. 41 illustrates a sectional view showing the effects of depositing ILD 2 and etching contact vias.
Figure 42:
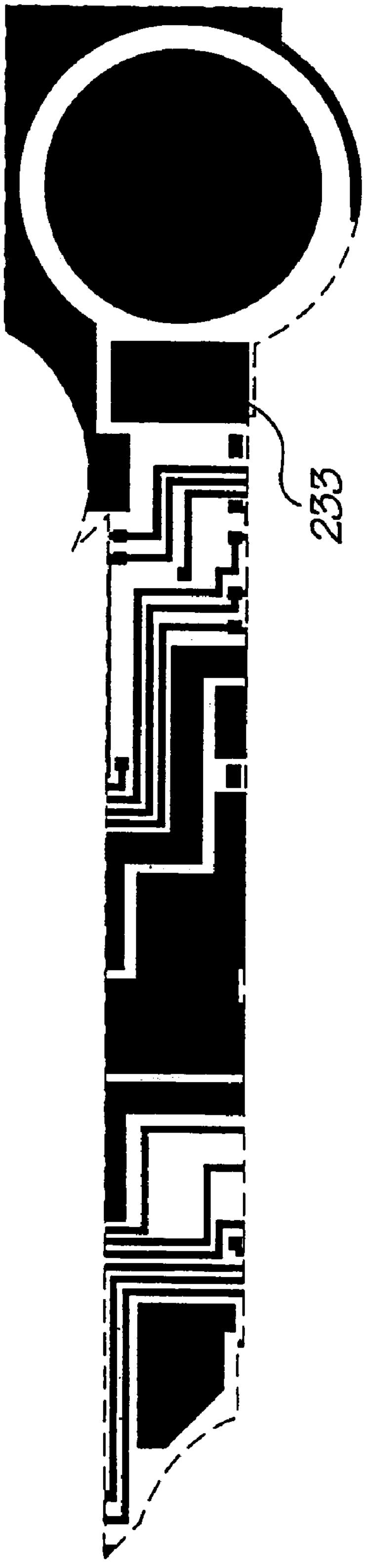
FIG. 42 illustrates the Metal 2 mask.
Figure 43:
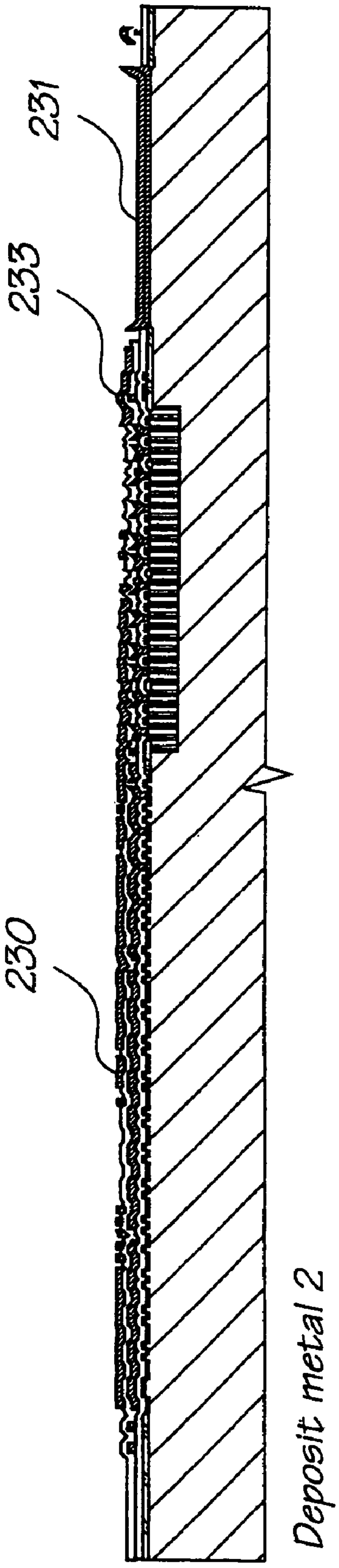
FIG. 43 illustrates a sectional view showing the effects of depositing the Metal 2 layer.
Figure 44:
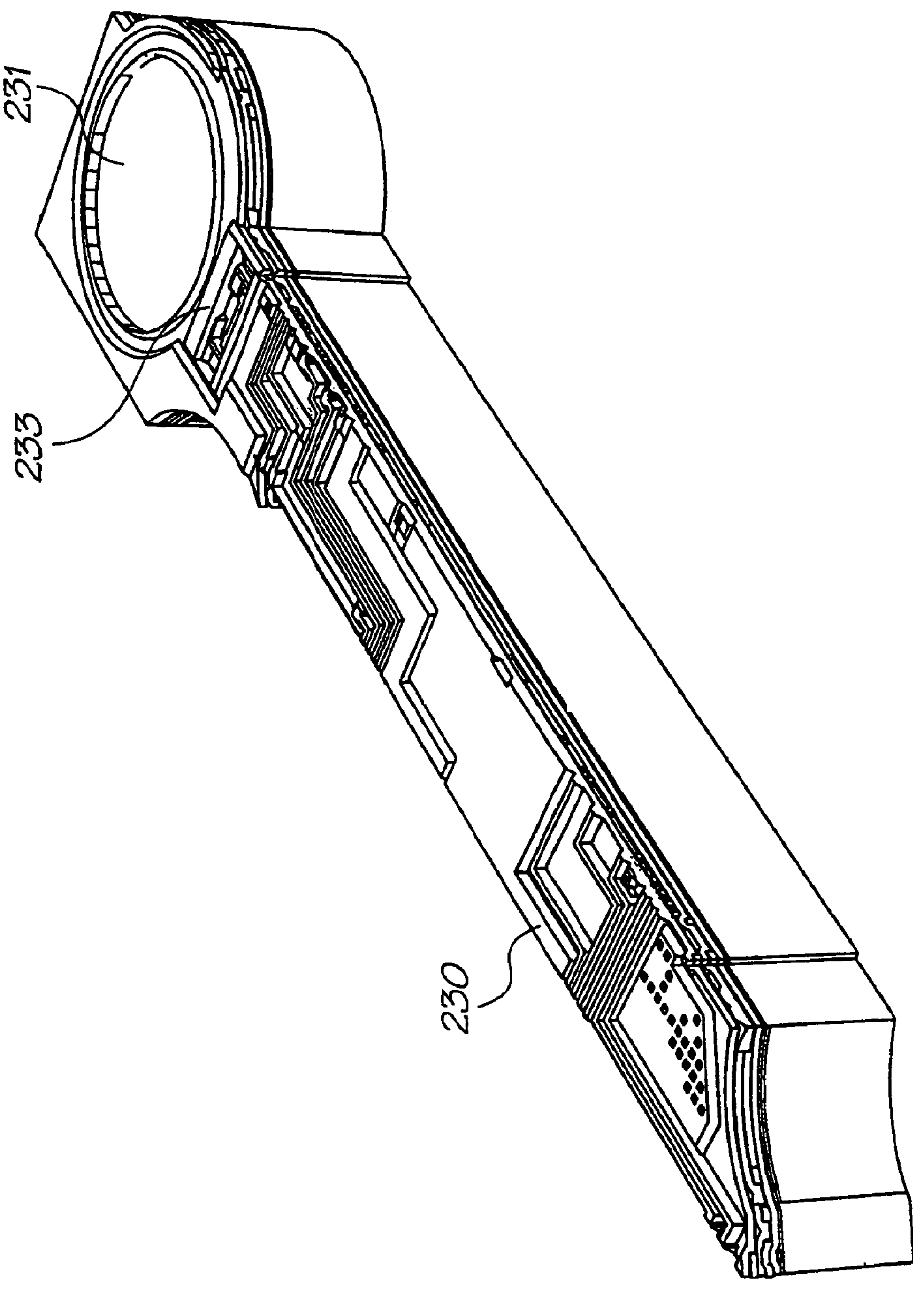
FIG. 44 illustrates a side perspective view partly in section of a single nozzle after metal 2 deposition.

1. As shown in FIG. 18, processing starts with a standard 6" p-type <100> wafers. (8" wafers can also be used, giving a substantial increase in primary yield).
2. Using the n-well mask of FIG. 19, implant the n-well transistor portions 210 of FIG. 20.
3. Grow a thin layer of $SiO_2$ and deposit $Si_3N_4$ forming a field oxide hard mask.
4. Etch the nitride and oxide using the active mask of FIG. 22. The mask is oversized to allow for the LOCOS bird's beak. The nozzle chamber region is incorporated in this mask, as field oxide is excluded from the nozzle chamber. The result is a series of oxide regions 212, illustrated in FIG. 23.
5. Implant the channel-stop using the n-well mask with a negative resist, or using a complement of the n-well mask.
6. Perform any required channel stop implants as required by the CMOS process used.
7. Grow 0.5 micron of field oxide using LOCOS.
8. Perform any required n/p transistor threshold voltage adjustments. Depending upon the characteristics of the CMOS process, it may be possible to omit the threshold adjustments. This is because the operating frequency is only 3.8 MHz, and the quality of the p-devices is not critical. The n-transistor threshold is more significant, as the on-resistance of the n-channel drive transistor has a significant effect on the efficiency and power consumption while printing.
9. Grow the gate oxide
10. Deposit 0.3 microns of poly, and pattern using the poly mask illustrated in FIG. 25 so as to form poly portions 214 shown in FIG. 26.
11. Perform the n+ implant shown e.g. 216 in FIG. 29 using the n+ mask shown in FIG. 28. The use of a drain engineering processes such as LDD should not be required, as the performance of the transistors is not critical.
12. Perform the p+ implant shown e.g. 218 in FIG. 32, using a complement of the n+ mask shown in FIG. 31, or using the n+ mask with a negative resist The nozzle chamber region will be doped either n+ or p+ depending upon whether it is included in the n+ mask or not. The doping of this silicon region is not relevant as it is subsequently etched, and the STS ASE etch process recommended does not use boron as an etch stop.
13. Deposit 0.6 microns of PECVD TEOS glass to form ILD 1, shown e.g. 220 in FIG. 35.
14. Etch the contact cuts using the contact mask of FIG. 34. The nozzle region is treated as a single large contact region, and will not pass typical design rule checks. This region should therefore be excluded from the DRC.
15. Deposit 0.6 microns of aluminum to form metal 1.
16. Etch the aluminum using the metal 1 mask shown in FIG. 37 so as to form metal regions e.g. 224 shown in FIG. 38. The nozzle metal region is covered with metal 1 e.g. 225. This aluminum 225 is sacrificial, and is etched as part of the MEMS sequence. The inclusion of metal 1 in the nozzle is not essential, but helps reduce the step in the neck region of the actuator lever arm.
17. Deposit 0.7 microns of PECVD TEOS glass to form ILD 2 regions e.g. 228 of FIG. 41.
18. Etch the contact cuts using the via 1 mask shown in FIG. 40. The nozzle region is treated as a single large via region, and again it will not pass DRC.
19. Deposit 0.6 microns of aluminum to form metal 2.
20. Etch the aluminum using the metal 2 mask shown in FIG. 42 so as to form metal portions e.g. 230 shown in FIG. 43. The nozzle region 231 is fully covered with metal 2. This aluminum is sacrificial, and is etched as part of the MEMS sequence. The inclusion of metal 2 in the nozzle is not essential, but helps reduce the step in the neck region of the actuator lever arm. Sacrificial metal 2 is also used for another fluid control feature. A relatively large rectangle of metal 2 is included in the neck region 233 of the nozzle chamber. This is connected to the sacrificial metal 3, so is also removed during the MEMS sacrificial aluminum etch. This undercuts the lower rim of the nozzle chamber entrance for the actuator (which is formed from ILD 3). The undercut adds 90 degrees to angle of the fluid control surface, and thus increases the ability of this rim to prevent ink surface spread.

Figure 45:
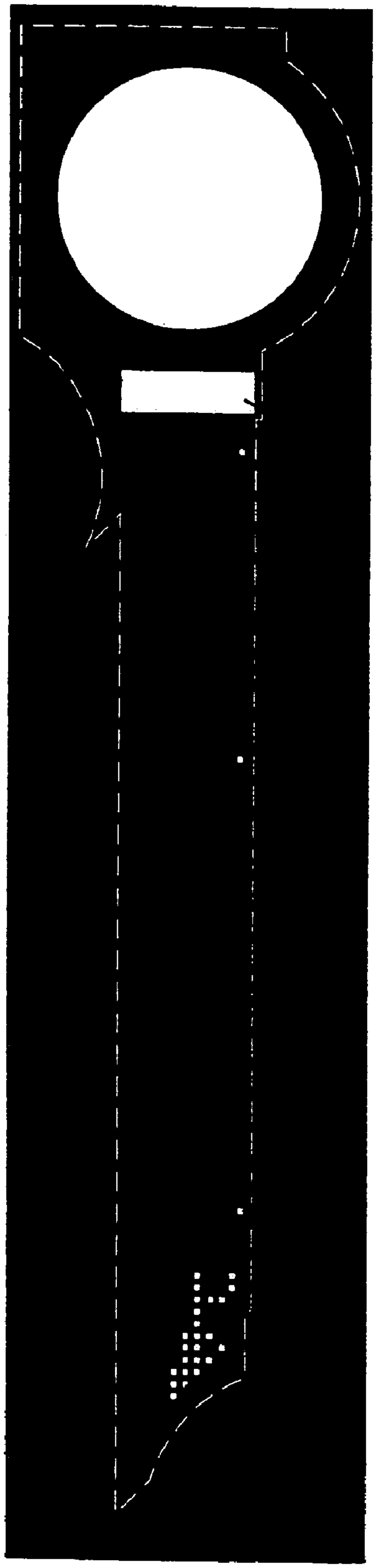
FIG. 45 illustrates the Via 2 mask.
Figure 46:
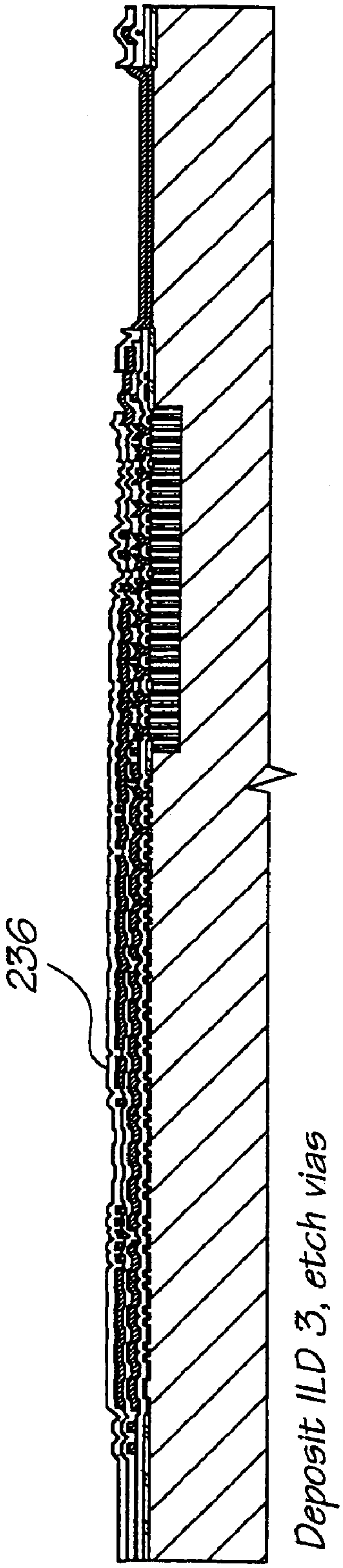
FIG. 46 illustrates a sectional view showing the effects of depositing ILD 3 and etching contact vias.
Figure 47:
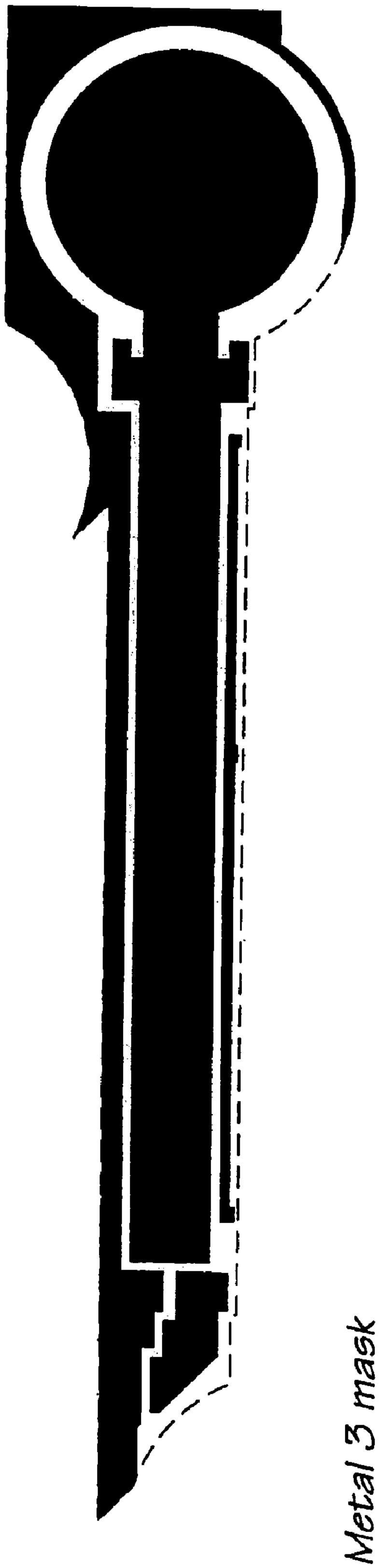
FIG. 47 illustrates the Metal 3 mask.
Figure 48:
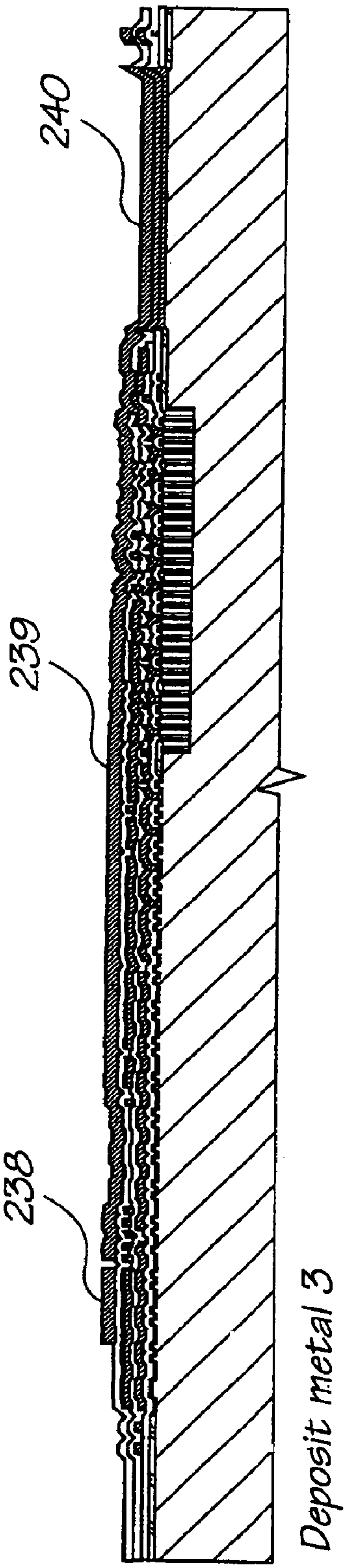
FIG. 48 illustrates a sectional view showing the effects of depositing the Metal 3 layer.
Figure 49:
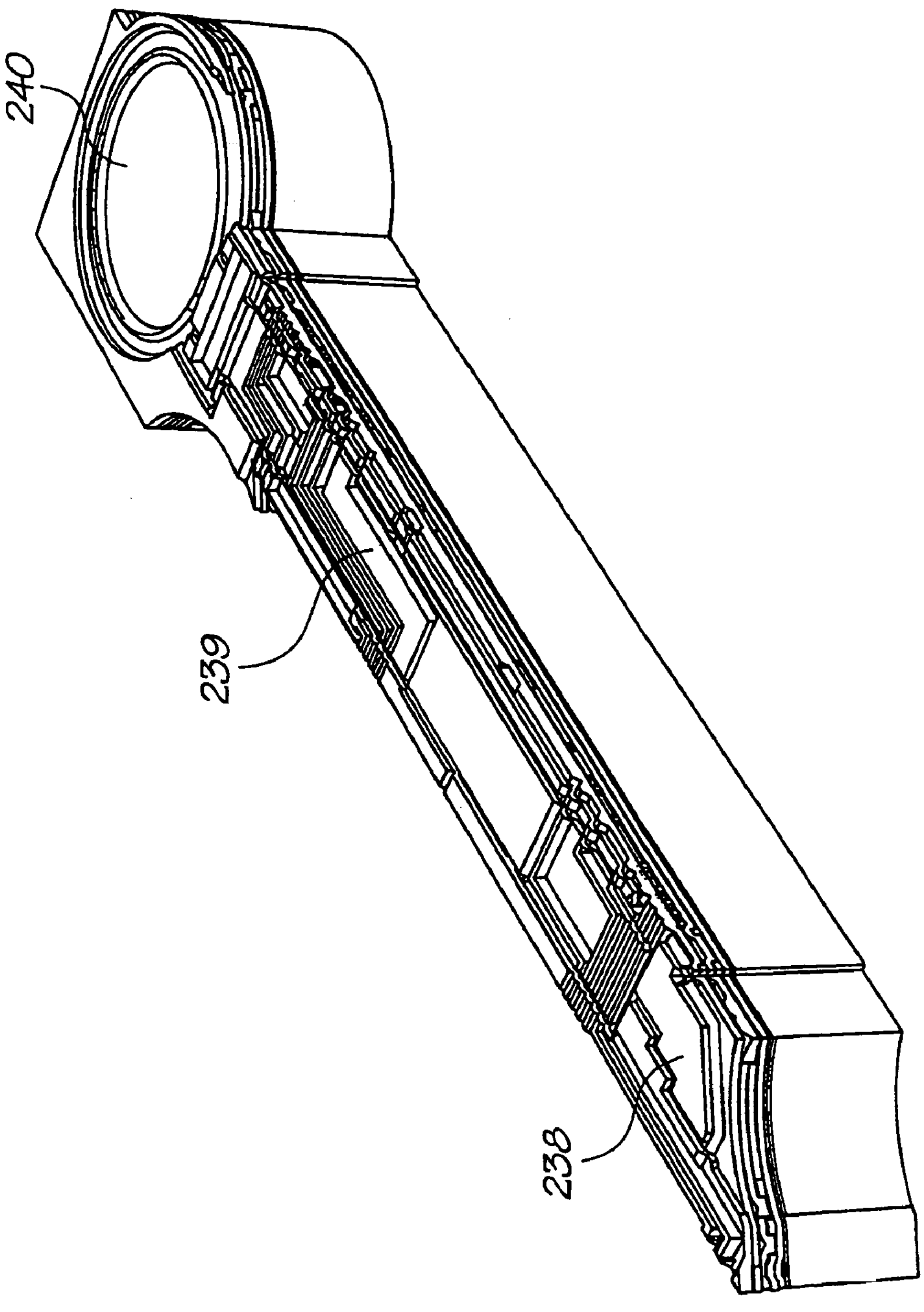
FIG. 49 illustrates a side perspective view partly in section of a single nozzle after metal 3 deposition.
Figure 50:
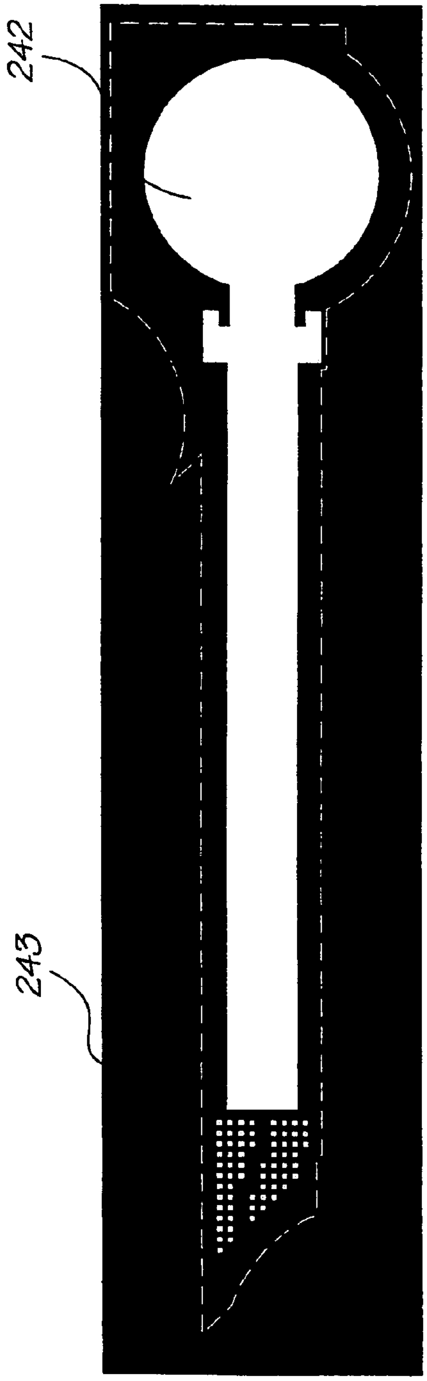
FIG. 50 illustrates the Via 3 mask.
Figure 51:
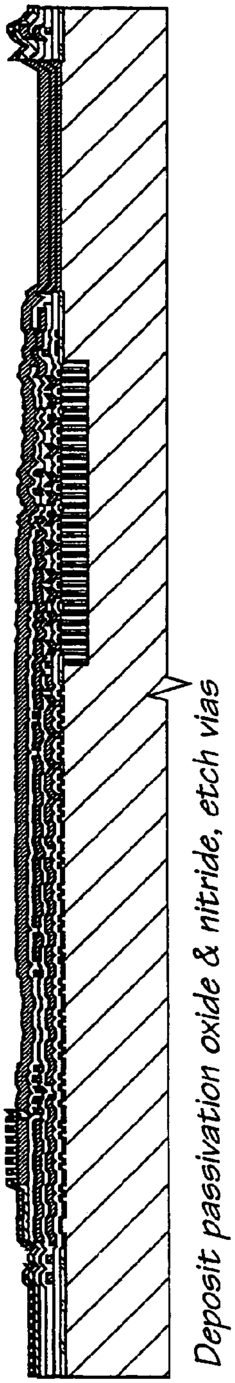
FIG. 51 illustrates a sectional view showing the effects of depositing passivation oxide and nitride and etching vias.
Figure 52:
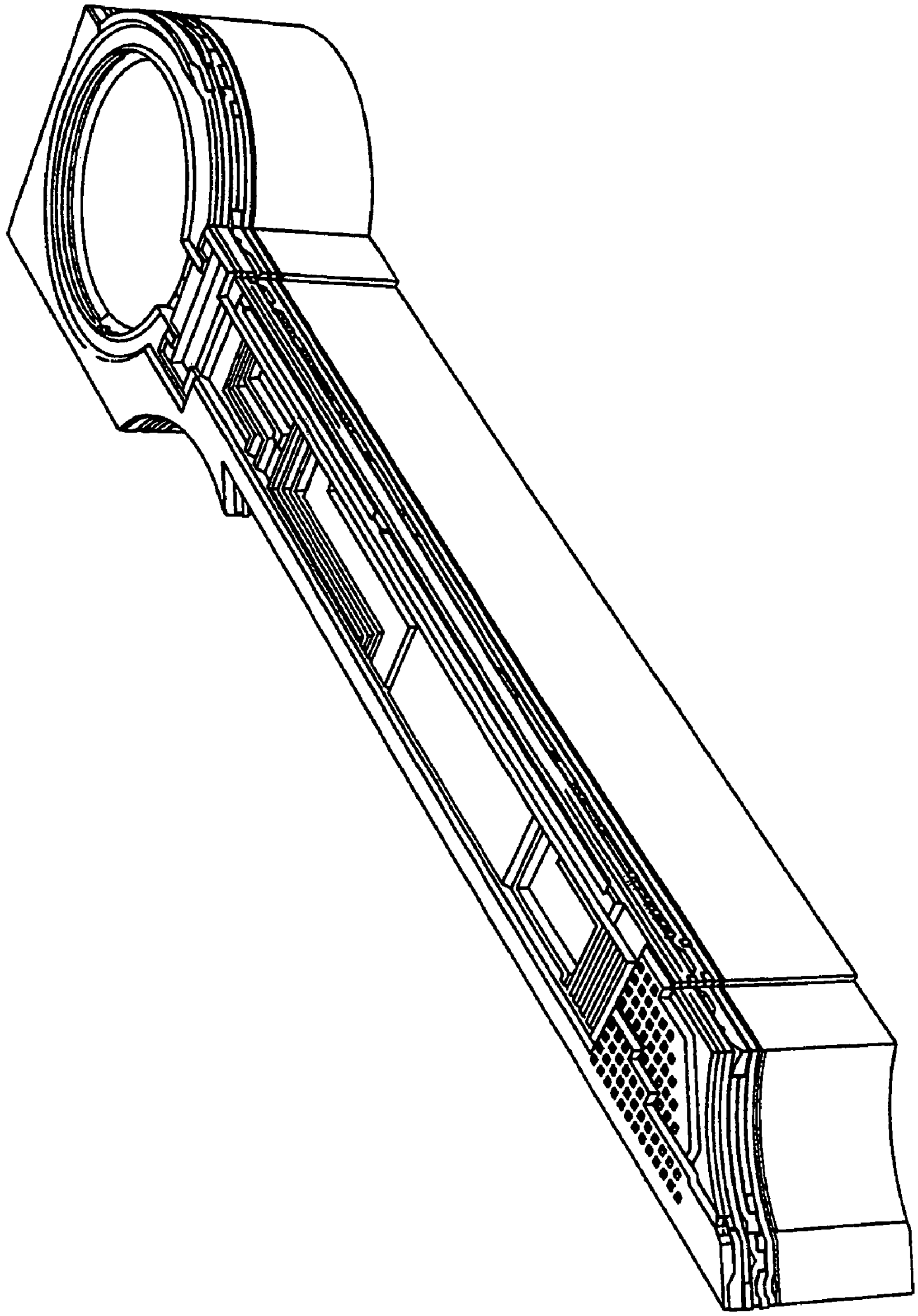
FIG. 52 illustrates a side perspective view partly in section of a single nozzle after depositing passivation oxide and nitride and etching vias.
Figure 53:
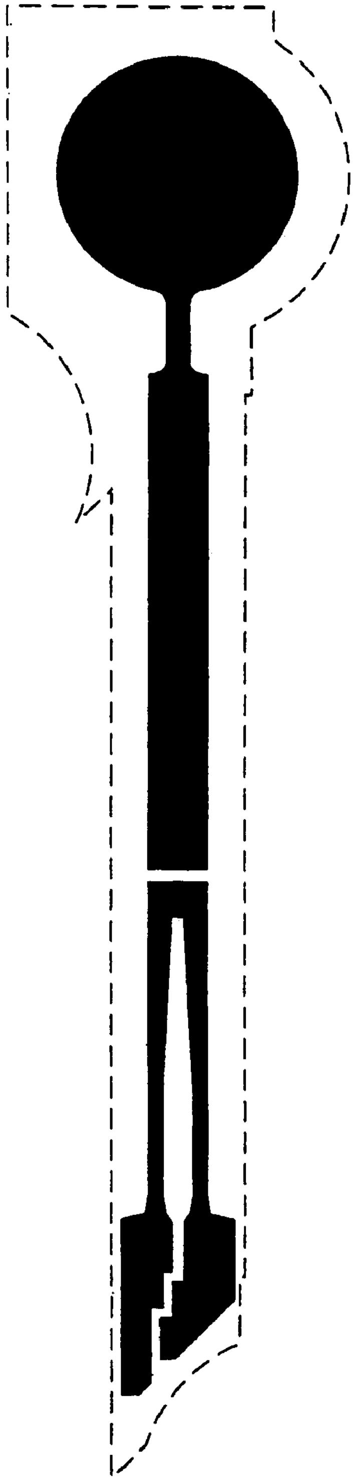
FIG. 53 illustrates the heater mask.
Figure 54:
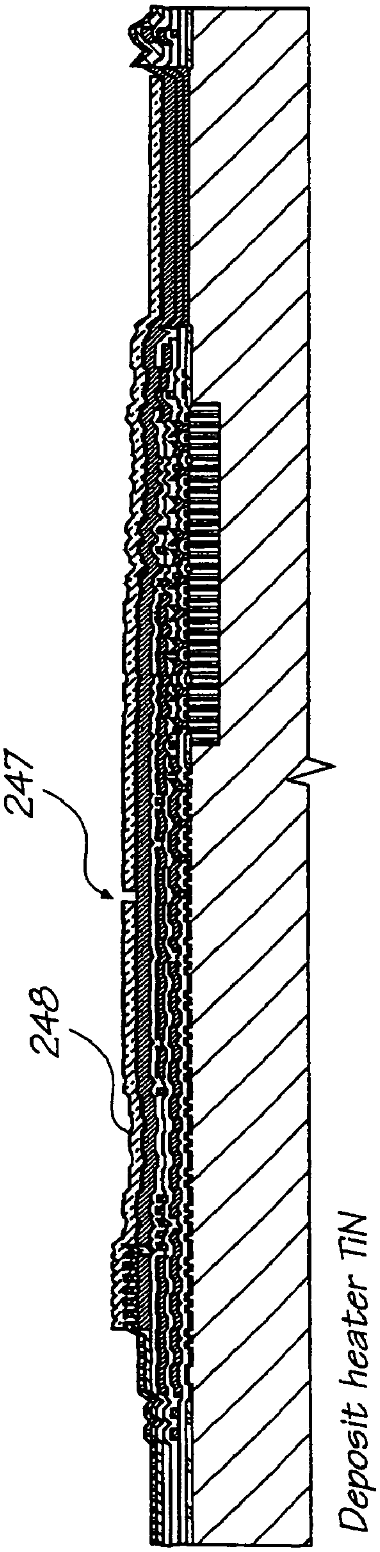
FIG. 54 illustrates a sectional view showing the effect of depositing the heater titanium nitride layer.
Figure 55:
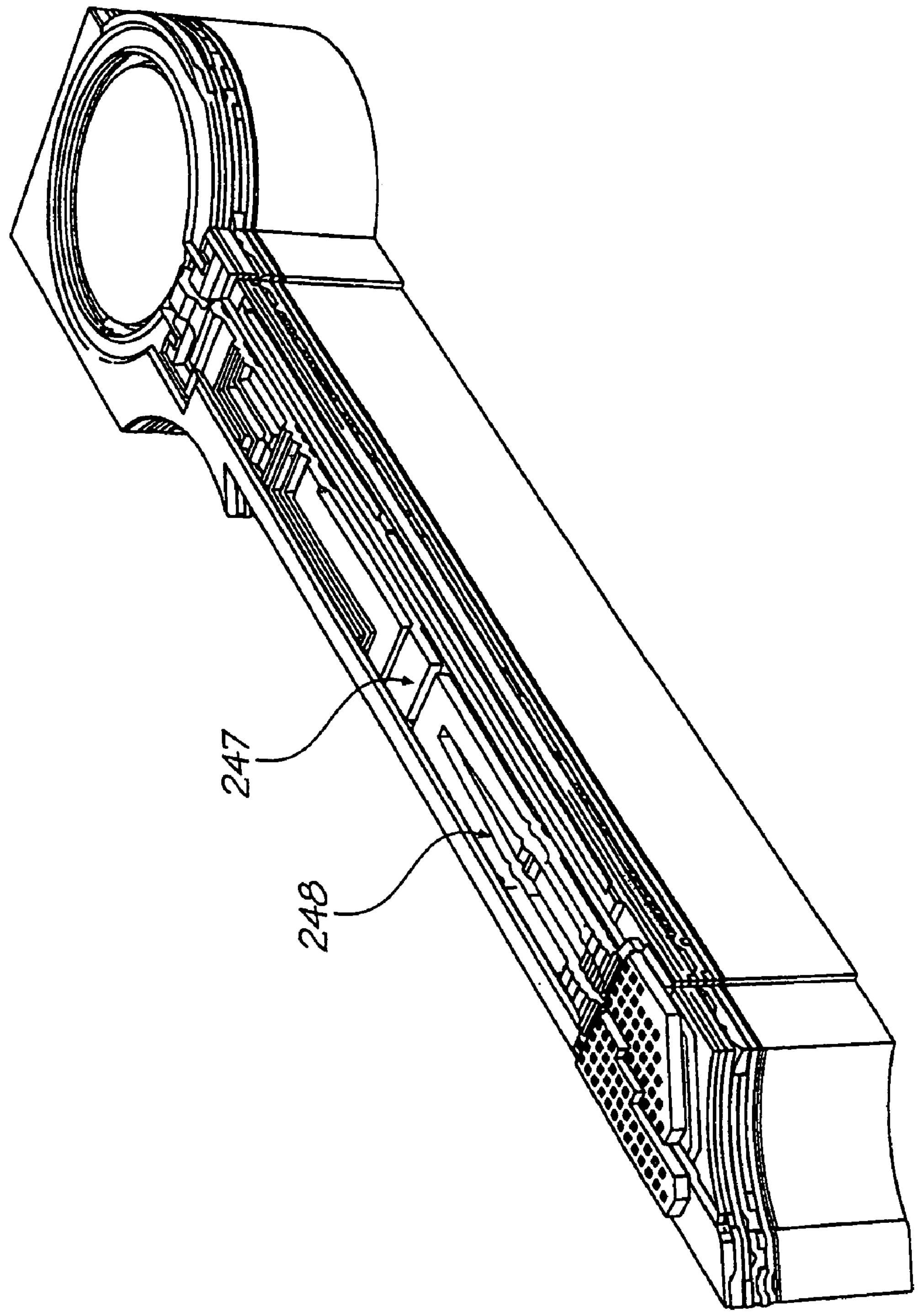
FIG. 55 illustrates a side perspective view partly in section of a single nozzle after depositing the heater titanium nitride layer.
Figure 56:
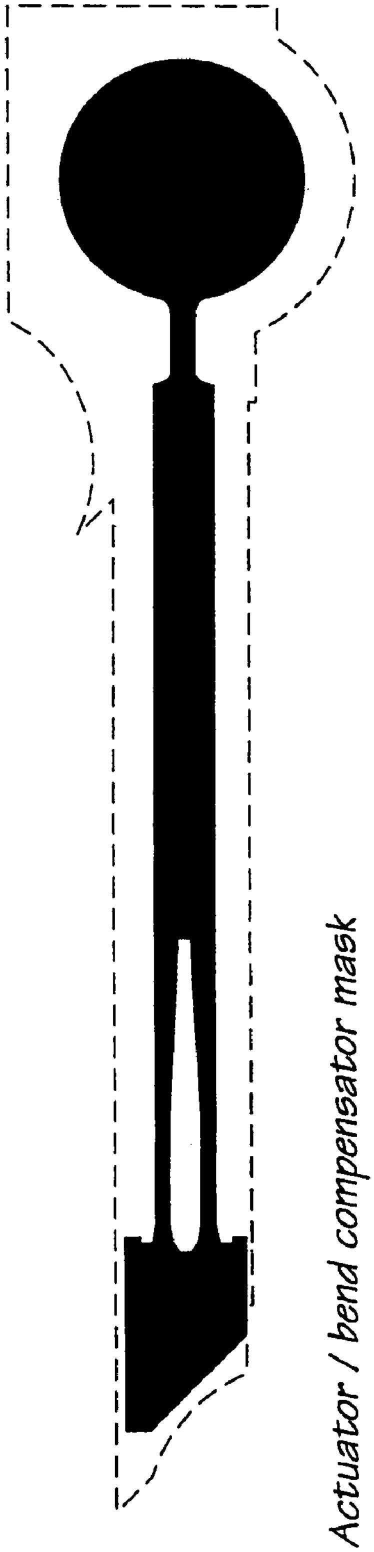
FIG. 56 illustrates the actuator/bend compensator mask.
Figure 57:
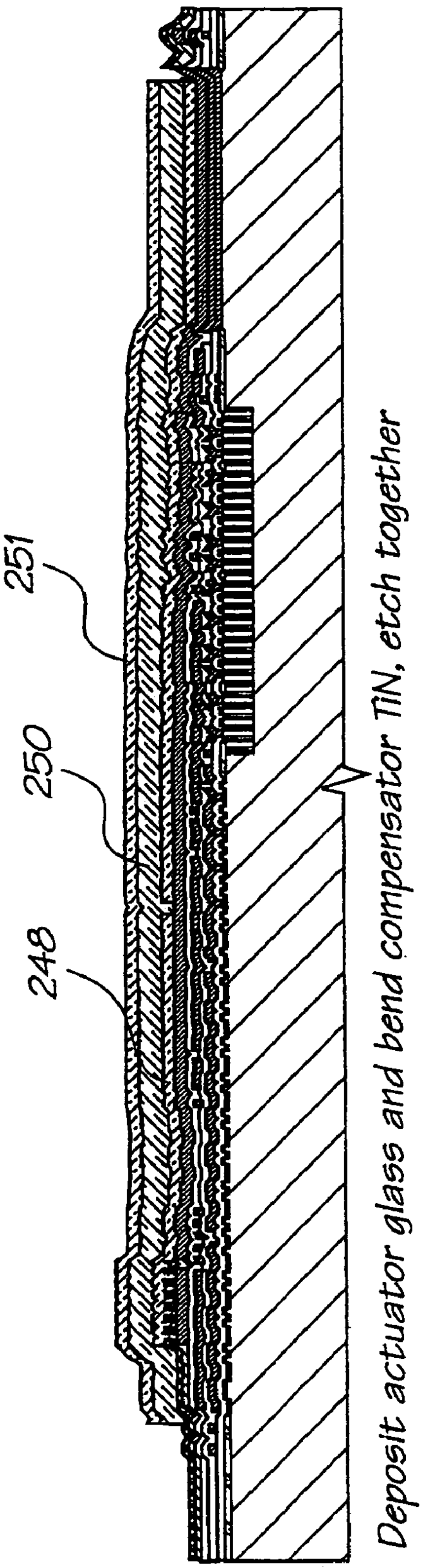
FIG. 57 illustrates a sectional view showing the effect of depositing the actuator glass and bend compensator titanium nitride after etching.
Figure 58:
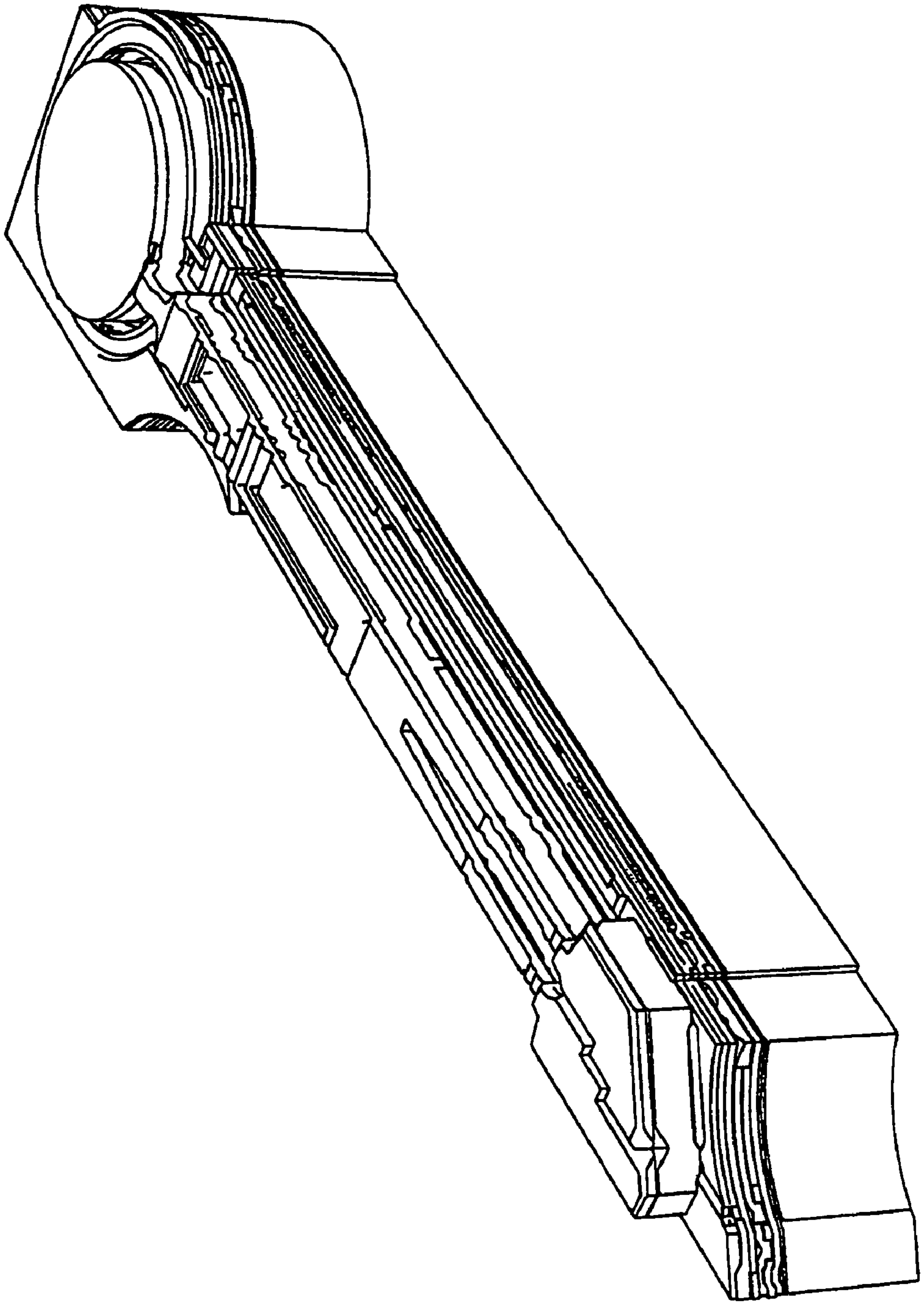
FIG. 58 illustrates a side perspective view partly in section of a single nozzle after depositing and etching the actuator glass and bend compensator titanium nitride layers.
Figure 59:
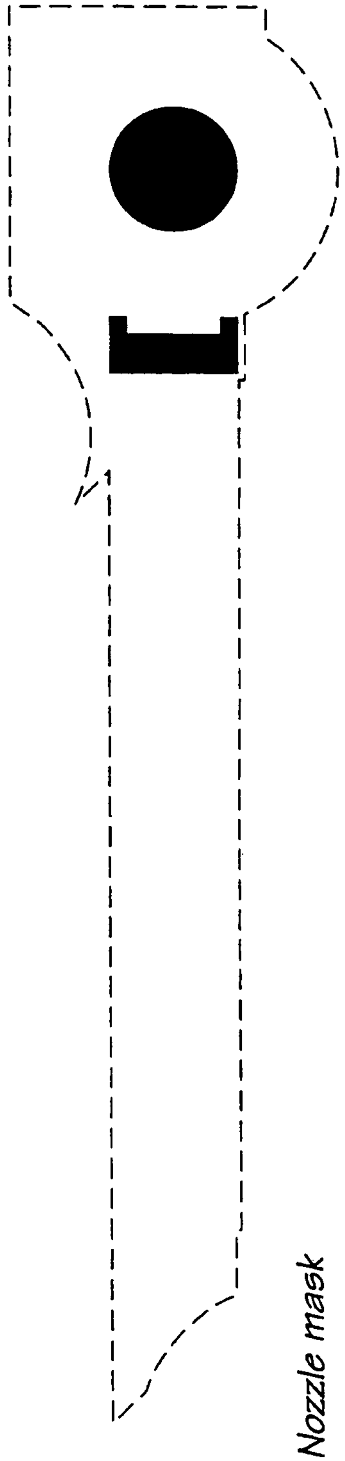
FIG. 59 illustrates the nozzle mask.
Figure 60:
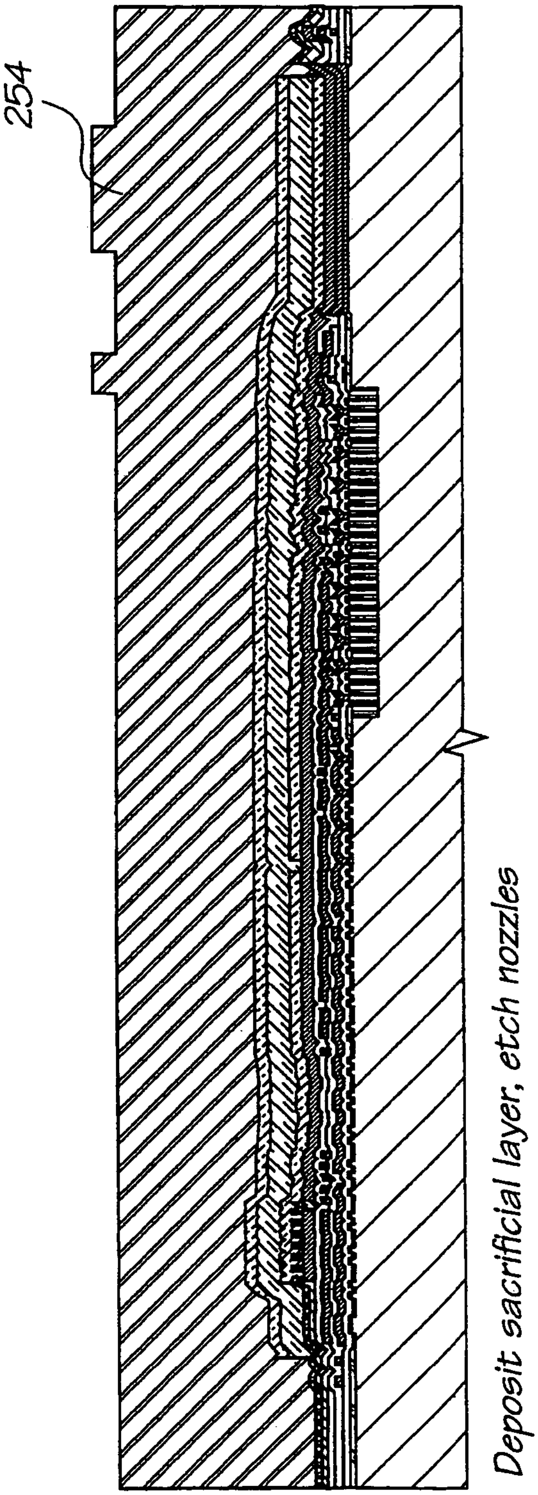
FIG. 60 illustrates a sectional view showing the effect of the depositing of the sacrificial layer and etching the nozzles.
Figure 61:
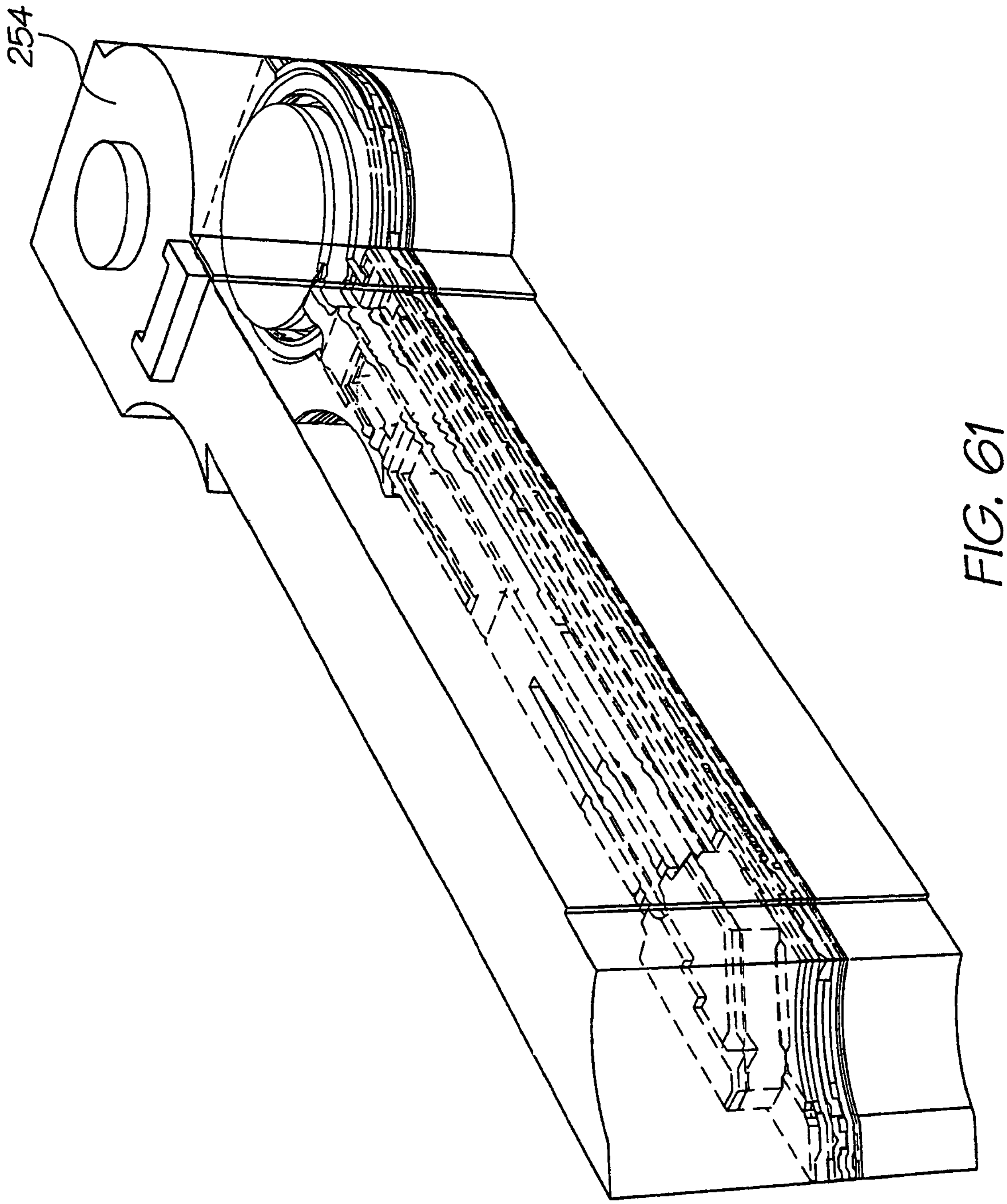
FIG. 61 illustrates a side perspective view partly in section of a single nozzle after depositing and initial etching the sacrificial layer.
Figure 62:
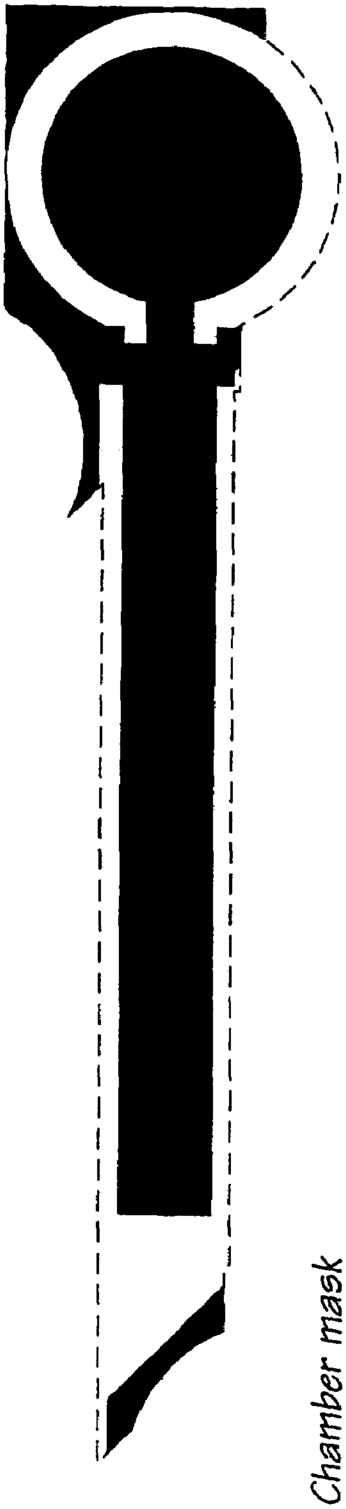
FIG. 62 illustrates the nozzle chamber mask.
Figure 63:
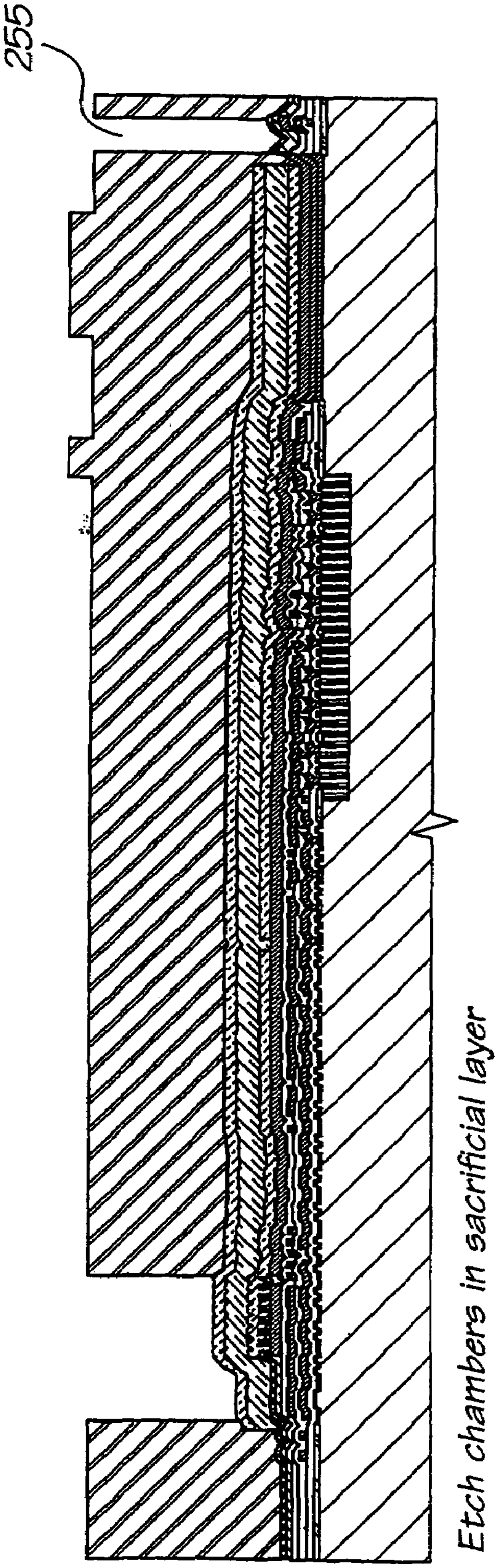
FIG. 63 illustrates a sectional view showing the etched chambers in the sacrificial layer.
Figure 64:
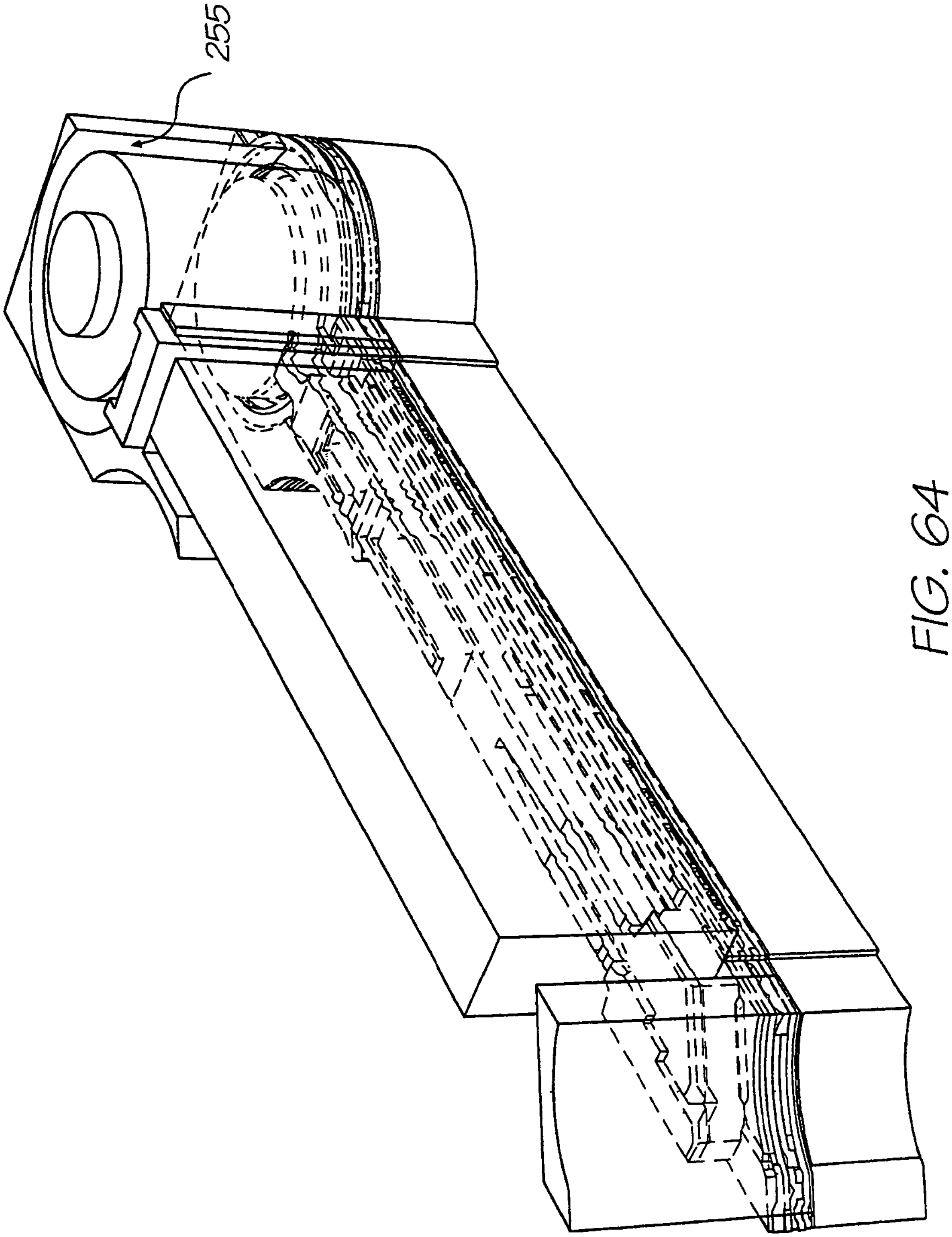
FIG. 64 illustrates a side perspective view partly in section of a single nozzle after further etching of the sacrificial layer.

21. Deposit 0.7 microns of PECVD TEOS glass to form ILD 3.
22. Etch the contact cuts using the via 2 mask shown in FIG. 45 so as to leave portions e.g. 236 shown in FIG. 46. As well as the nozzle chamber, fluid control rims are also formed in ILD 3. These will also not pass DRC.
23. Deposit 1.0 microns of aluminum to form metal 3.
24. Etch the aluminum using the metal 3 mask shown in FIG. 47 so as to leave portions e.g. 238 as shown in FIG. 48. Most of metal 3 e.g. 239 is a sacrificial layer used to separate the actuator and paddle from the chip surface. Metal 3 is also used to distribute V+ over the chip. The nozzle region is fully covered with metal 3 e.g. 240. This aluminum is sacrificial, and is etched as part of the MEMS sequence. The inclusion of metal 3 in the nozzle is not essential, but helps reduce the step in the neck region of the actuator lever arm.
25. Deposit 0.5 microns of PECVD TEOS glass to form the overglass.
26. Deposit 0.5 microns of $Si_3N_4$ to form the passivation layer.
27. Etch the passivation and overglass using the via 3 mask shown in FIG. 50 so as to form the arrangement of FIG. 51. This mask includes access 242 to the metal 3 sacrificial layer, and the vias e.g. 243 to the heater actuator. Lithography of this step has 0.6 micron critical dimensions (for the heater vias) instead of the normally relaxed lithography used for opening bond pads. This is the one process step which is different from the normal CMOS process flow. This step may either be the last process step of the CMOS process, or the first step of the MEMS process, depending upon the fab setup and transport requirements.
28. Wafer Probe. Much, but not all, of the functionality of the chips can be determined at this stage. If more complete testing at this stage is required, an active dummy load can be included on chip for each drive transistor. This can be achieved with minor chip area penalty, and allows complete testing of the CMOS circuitry.
29. Transfer the wafers from the CMOS facility to the MEMS facility. These may be in the same fab, or may be distantly located.
30. Deposit 0.9 microns of magnetron sputtered TiN. Voltage is −65V, magnetron current is 7.5 A, argon gas pressure is 0.3 Pa, temperature is 300° C. This results in a coefficient of thermal expansion of $9.4\times10^{-6}$/° C., and a Young's modulus of 600 GPa [*Thin Solid Films* 270 p 266, 1995], which are the key thin film properties used.
31. Etch the TiN using the heater mask shown in FIG. 53. This mask defines the heater element, paddle arm, and paddle. There is a small gap 247 shown in FIG. 54 between the heater and the TiN layer of the paddle and paddle arm. This is to prevent electrical connection between the heater and the ink, and possible electrolysis problems. Sub-micron accuracy is required in this step to maintain a uniformity of heater characteristics across the wafer. This is the main reason that the heater is not etched simultaneously with the other actuator layers. CD for the heater mask is 0.5 microns. Overlay accuracy is +/− 0.1 microns. The bond pads are also covered with this layer of TiN. This is to prevent the bond pads being etched away during the sacrificial aluminum etch. It also prevents corrosion of the aluminum bond pads during operation. TiN is an excellent corrosion barrier for aluminum. The resistivity of TiN is low enough to not cause problems with the bond pad resistance.
32. Deposit 2 microns of PECVD glass. This is preferably done at around 350° C. to 400° C. to minimize intrinsic stress in the glass. Thermal stress could be reduced by a lower deposition temperature, however thermal stress is actually beneficial, as the glass is sandwiched between two layers of TiN. The TiN/glass/TiN tri-layer cancels bend due to thermal stress, and results in the glass being under constant compressive stress, which increases the efficiency of the actuator.
33. Deposit 0.9 microns of magnetron sputtered TiN. This layer is deposited to cancel bend from the differential thermal stress of the lower TiN and glass layers, and prevent the paddle from curling when released from the sacrificial materials. The deposition characteristics should be identical to the first TN layer.
34. Anisotropically plasma etch the TiN and glass using actuator mask as shown in FIG. 56. This mask defines the actuator and paddle. CD for the actuator mask is 1 micron. Overlay accuracy is +/−0.1 microns. The results of the etching process is illustrated in FIG. 57 with the glass layer 250 sandwiched between TiN layers 251, 248.
35. Electrical testing can be performed by wafer probing at this time. All CMOS tests and heater functionality and resistance tests can be completed at wafer probe.
36. Deposit 15 microns of sacrificial material. There are many possible choices for this material. The essential requirements are the ability to deposit a 15 micron layer without excessive wafer warping, and a high etch selectivity to PECVD glass and TiN. Several possibilities are phosphosilicate glass (PSG), borophosphosilicate glass (BPSG), polymers such as polyimide, and aluminum. Either a close CTE match to silicon (BPSG with the correct doping, filled polyimide) or a low Young's modulus (aluminum) is required. This example uses BPSG. Of these issues, stress is the most demanding due to the extreme layer thickness. BPSG normally has a CTE well below that of silicon, resulting in considerable compressive stress. However, the composition of BPSG can be varied significantly to adjust its CTE close to that of silicon. As the BPSG is a sacrificial layer, its electrical properties are not relevant, and compositions not normally suitable as a CMOS dielectric can be used. Low density, high porosity, and a high water content are all beneficial characteristics as they will increase the etch selectivity versus PECVD glass when using an anhydrous HF etch.
37. Etch the sacrificial layer to a depth of 2 microns using the nozzle mask as defined in FIG. 59 so as to form the structure 254 illustrated in section in FIG. 60. The mask of FIG. 59 defines all of the regions where a subsequently deposited overcoat is to be polished off using CMP. This includes the nozzles themselves, and various other fluid control features. CD for the nozzle mask is 2 microns. Overlay accuracy is +/−0.5 microns.
38. Anisotropically plasma etch the sacrificial layer down to the CMOS passivation layer using the chamber mask as illustrated in FIG. 62. This mask defines the nozzle chamber and actuator shroud including slots 255 as shown in FIG. 63. CD for the chamber mask is 2 microns. Overlay accuracy is +/−0.2 microns.

Figure 65:
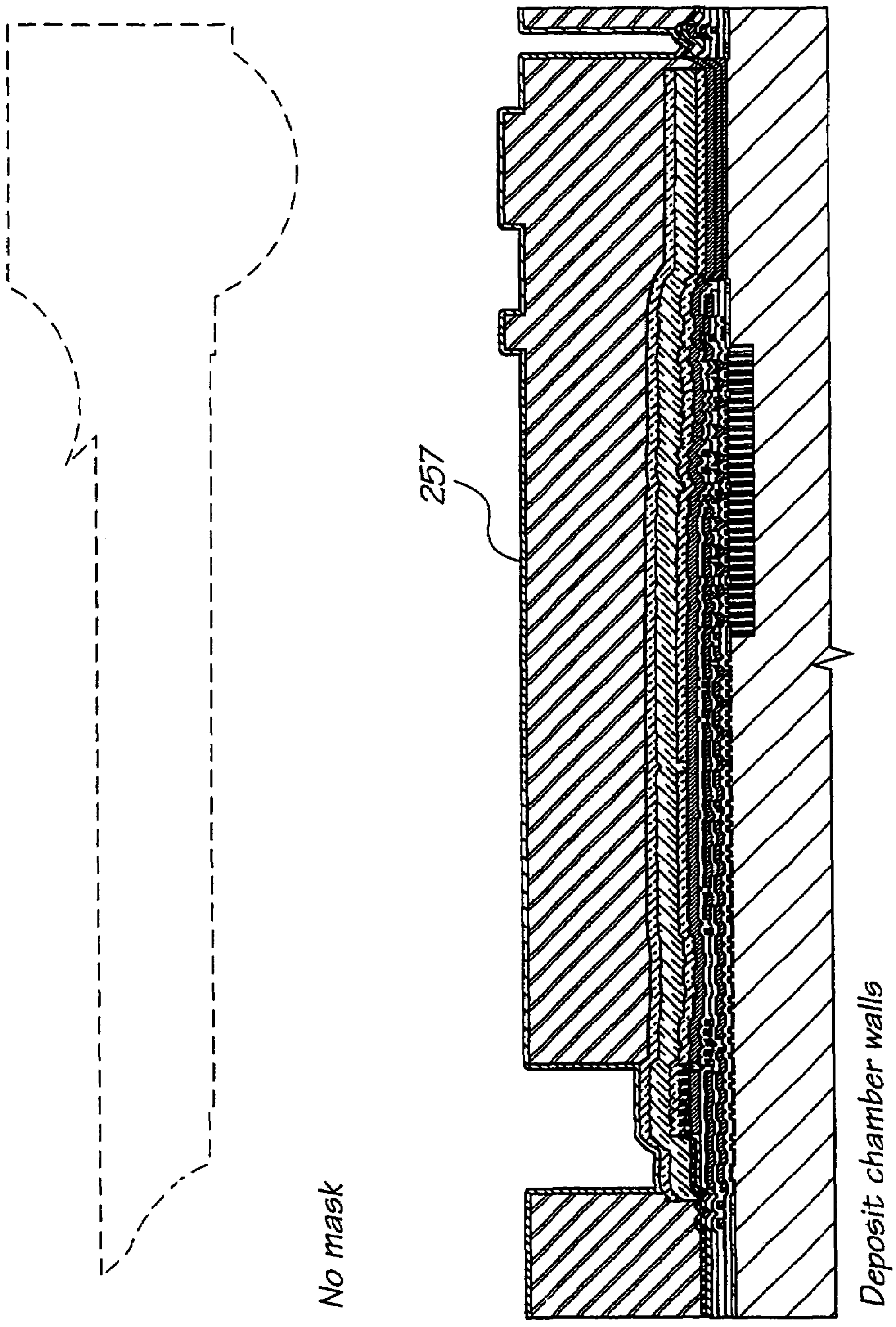
FIG. 65 illustrates a sectional view showing the deposited layer of the nozzle chamber walls.
Figure 66:
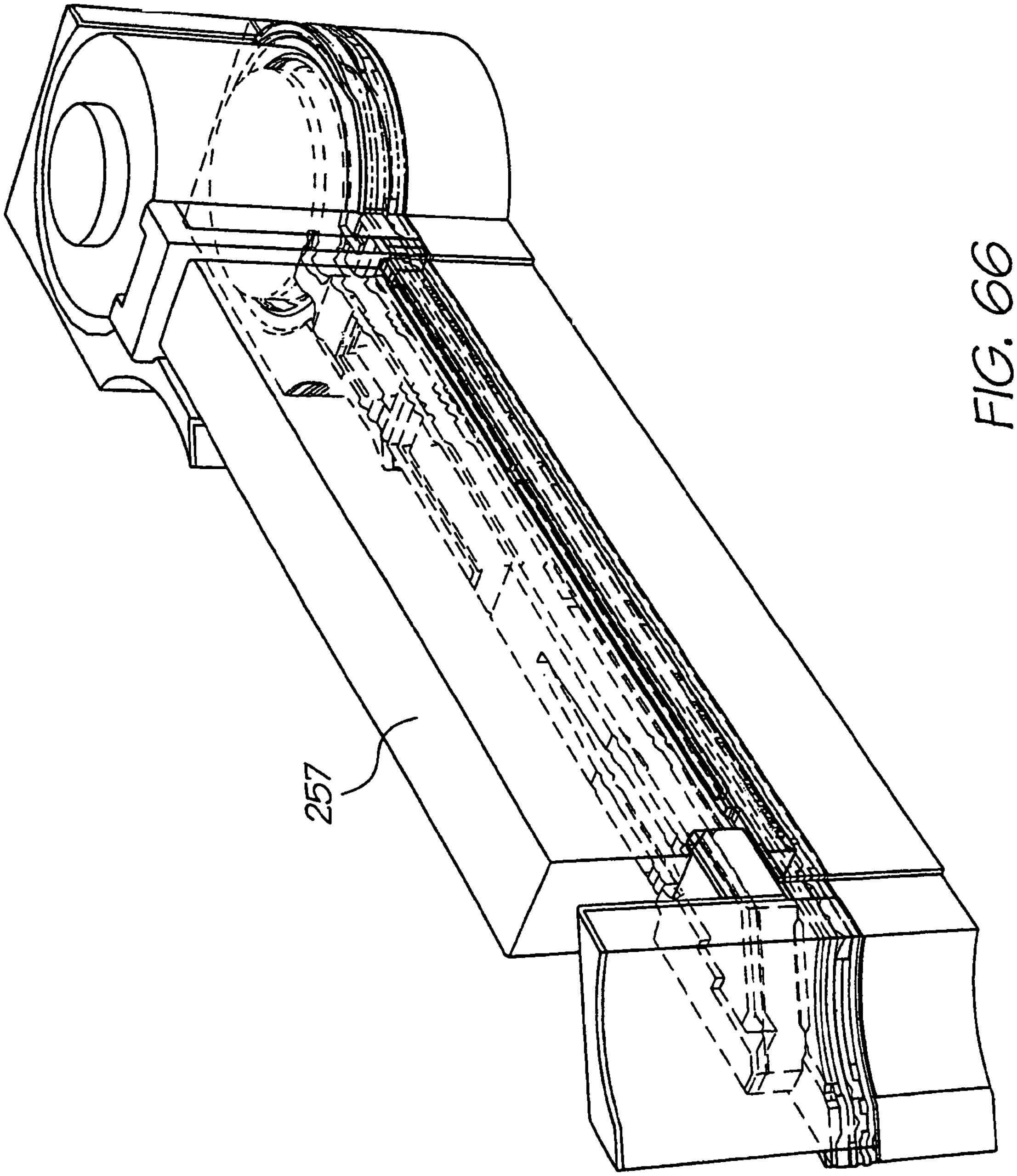
FIG. 66 illustrates a side perspective view partly in section of a single nozzle after further deposition of the nozzle chamber walls.

39. Deposit 0.5 microns of fairly conformal overcoat material 257 as illustrated in FIG. 65. The electrical properties of this material are irrelevant, and it can be a conductor, insulator, or semiconductor. The material should be: chemically inert, strong, highly selective etch with respect to the sacrificial material, be suitable for CMP, and be suitable for conformal deposition at temperatures below 500° C. Suitable materials include: PECVD glass, MOCVD TiN, ECR CVD TiN, PECVD $Si_3N_4$, and many others. The choice for this example is PECVD TEOS glass. This must have a very low water content if BPSG is used as the sacrificial material and anhydrous HF is used as the sacrificial etchant, as the anhydrous HF etch relies on water content to achieve 1000:1 etch selectivity of BPSG over TEOS glass. The conformed overcoat 257 forms a protective covering shell around the operational portions of the thermal bend actuator while permitting movement of the actuator within the shell.

Figure 67:
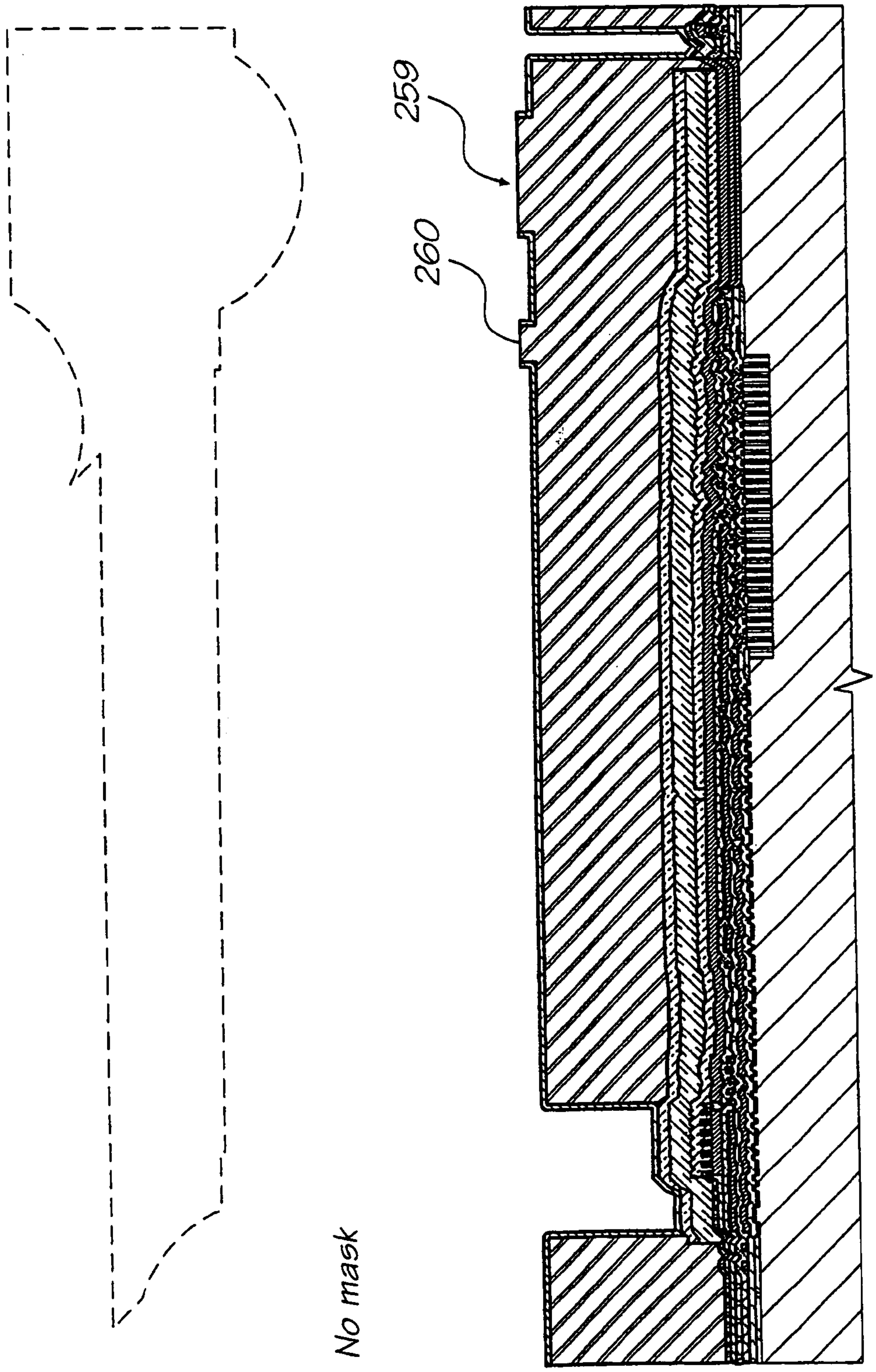
FIG. 67 illustrates a sectional view showing the process of creating self aligned nozzles using Chemical Mechanical Planarization (CMP)
Figure 68:
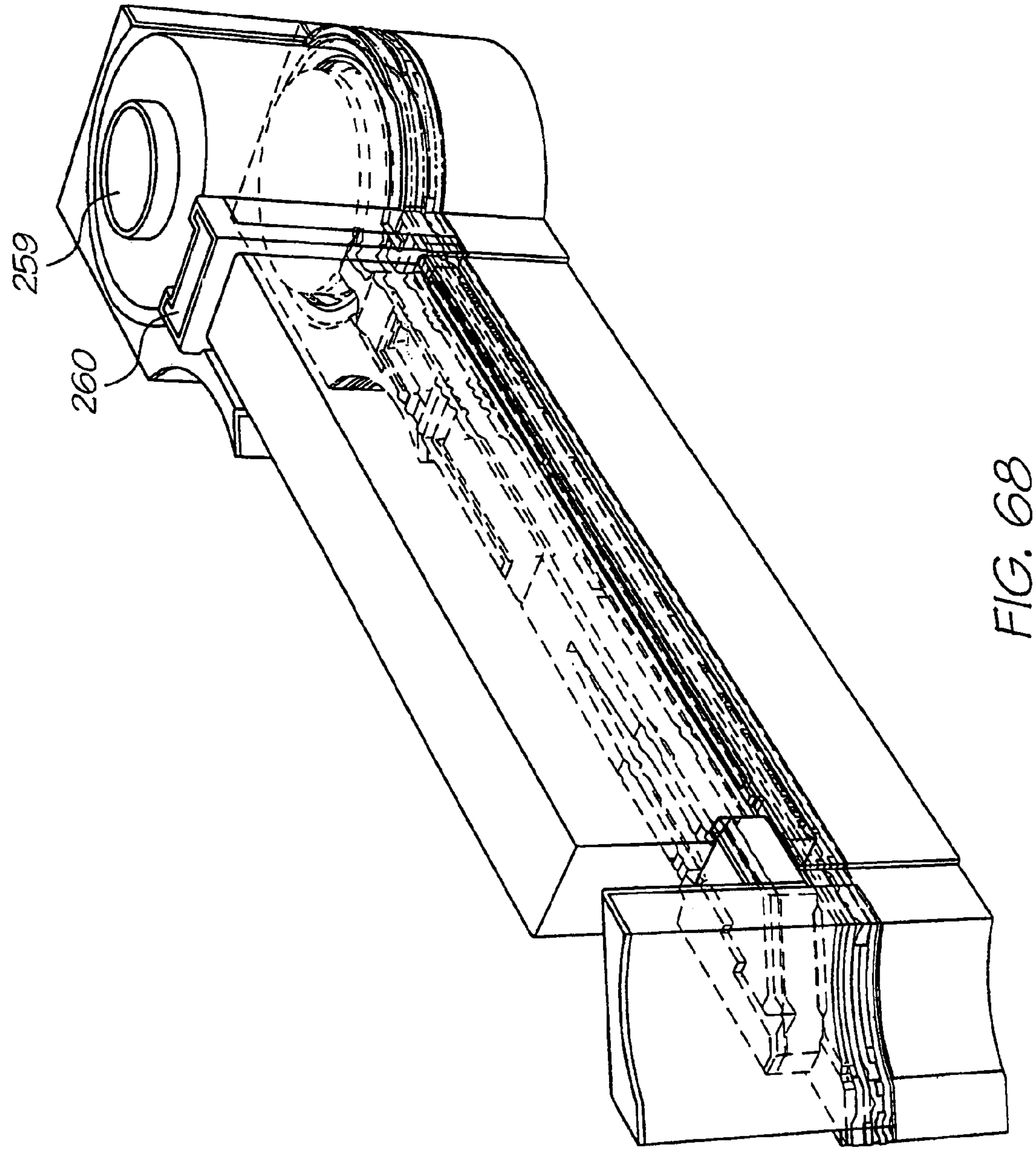
FIG. 68 illustrates a side perspective view partly in section of a single nozzle after CMP of the nozzle chamber walls.
Figure 70:
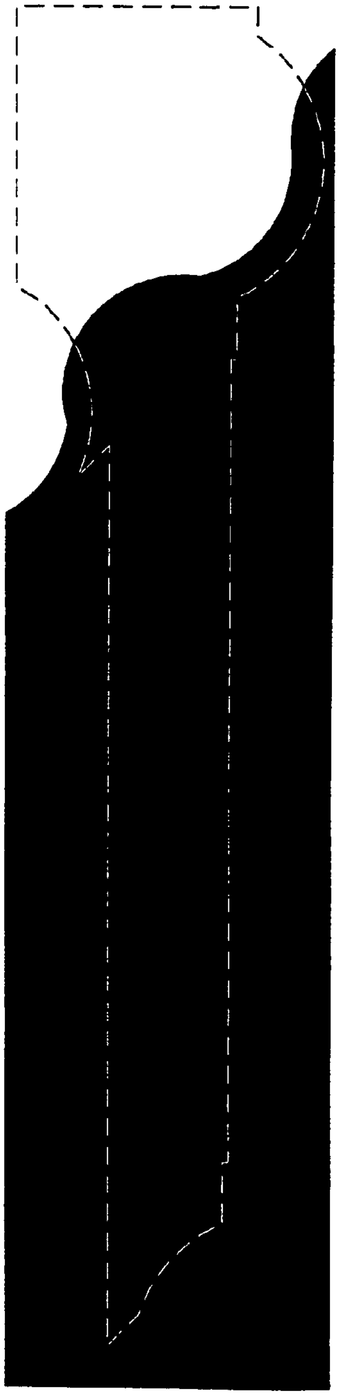
FIG. 70 illustrates the back etch inlet mask.

40. Planarize the wafer to a depth of I micron using CMP as illustrated in FIG. 67. The CMP processing should be maintained to an accuracy of +/−0.5 microns over the wafer surface. Dishing of the sacrificial material is not relevant. This opens the nozzles 259 and fluid control regions e.g. 260. The rigidity of the sacrificial layer relative to the nozzle chamber structures during CMP is one of the key factors which may affect the choice of sacrificial materials.

41. Turn the print head wafer over and securely mount the front surface on an oxidized silicon wafer blank 262 illustrated in FIG. 69 having an oxidized surface 263. The mounting can be by way of glue 265. The blank wafers 262 can be recycled.

42. Thin the print head wafer to 300 microns using back-grinding (or etch) and polish. The wafer thinning is performed to reduce the subsequent processing duration for deep silicon etching from around 5 hours to around 2.3 hours. The accuracy of the deep silicon etch is also improved, and the hard-mask thickness is halved to 2.5 microns. The wafers could be thinned further to improve etch duration and print head efficiency. The limitation to wafer thickness is the print head fragility after sacrificial BPSG etch.

43. Deposit a $SiO_2$ hard mask (2.5 microns of PECVD glass) on the backside of the wafer and pattern using the inlet mask as shown in FIG. 67. The hard mask of FIG. 67 is used for the subsequent deep silicon etch, which is to a depth of 315 microns with a hard mask selectivity of 150:1. This mask defines the ink inlets, which are etched through the wafer. CD for the inlet mask is 4 microns. Overlay accuracy is +/−2 microns. The inlet mask is undersize by 5.25 microns on each side to allow for a reentrant etch angle of 91 degrees over a 300 micron etch depth. Lithography for this step uses a mask aligner instead of a stepper. Alignment is to patterns on the front of the wafer. Equipment is readily available to allow sub-micron front-to-back alignment.

Figure 69:
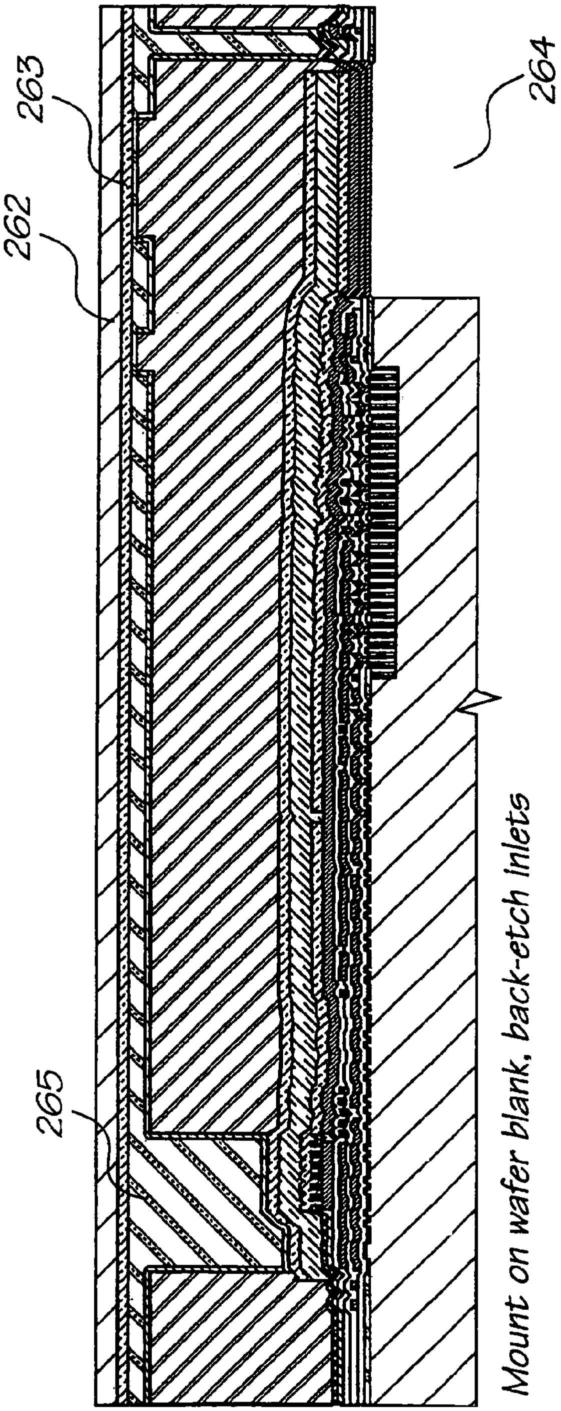
FIG. 69 illustrates a sectional view showing the nozzle mounted on a wafer blank.

44. Back-etch completely through the silicon wafer (using, for example, an ASE Advanced Silicon Etcher from Surface Technology Systems) through the previously deposited hard mask. The STS ASE is capable of etching highly accurate holes through the wafer with aspect ratios of 30:1 and sidewalls of 90 degrees. In this case, a re-entrant sidewall angle of 91 degrees is taken as nominal. A re-entrant angle is chosen because the ASE performs better, with a higher etch rate for a given accuracy, with a slightly re-entrant angle. Also, a re-entrant etch can be compensated by making the holes on the mask undersize. Non-re-entrant etch angles cannot be so easily compensated, because the mask holes would merge. The wafer is also preferably diced by this etch. The final result is as illustrated in FIG. 69 including back etched ink channel portions 264.

45. Etch all exposed aluminum. Aluminum on all three layers is used as sacrificial layers in certain places.

Figure 71:
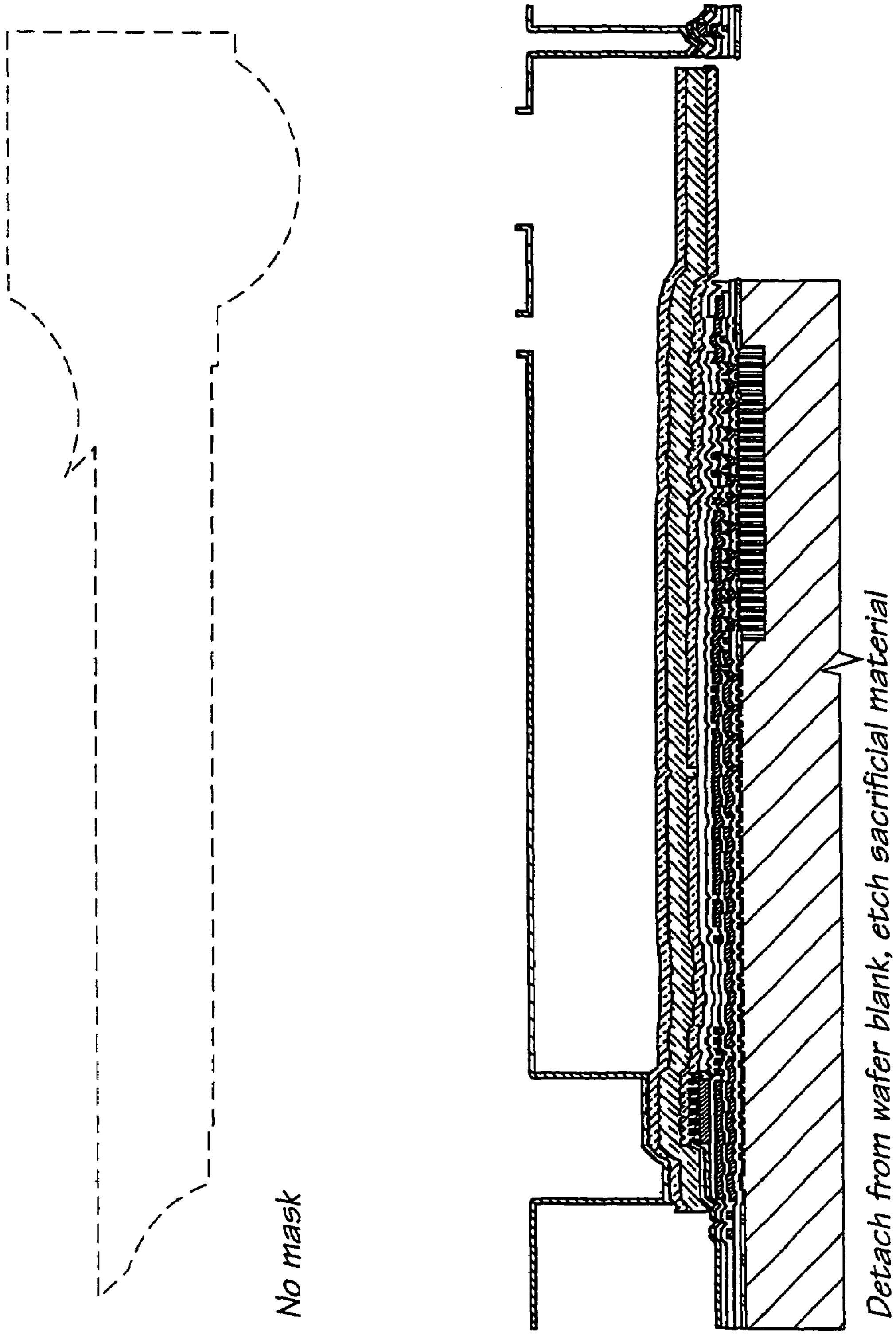
FIG. 71 illustrates a sectional view showing the etching away of the sacrificial layers.
Figure 72:
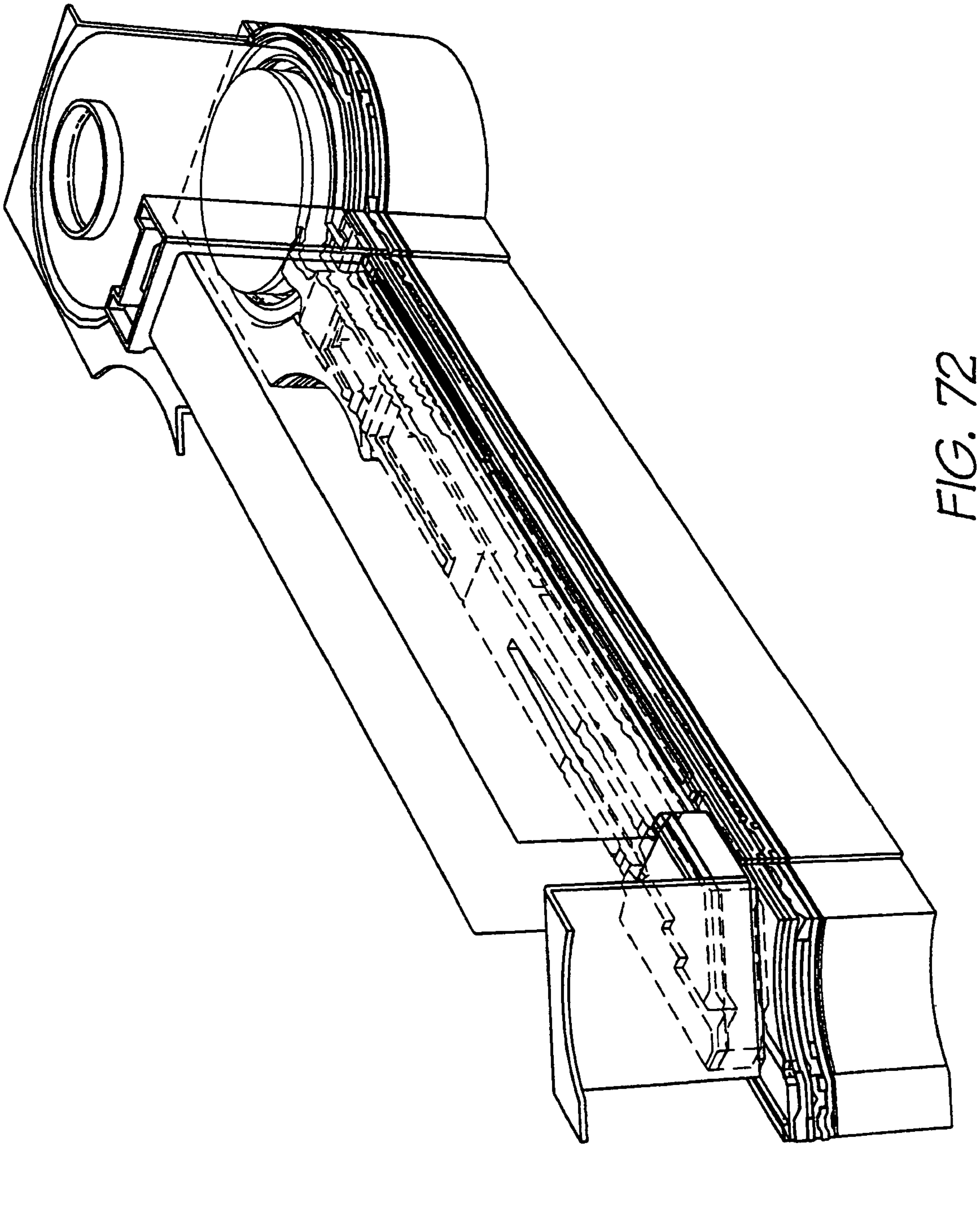
FIG. 72 illustrates a side perspective view partly in section of a single nozzle after etching away of the sacrificial layers.
Figure 73:
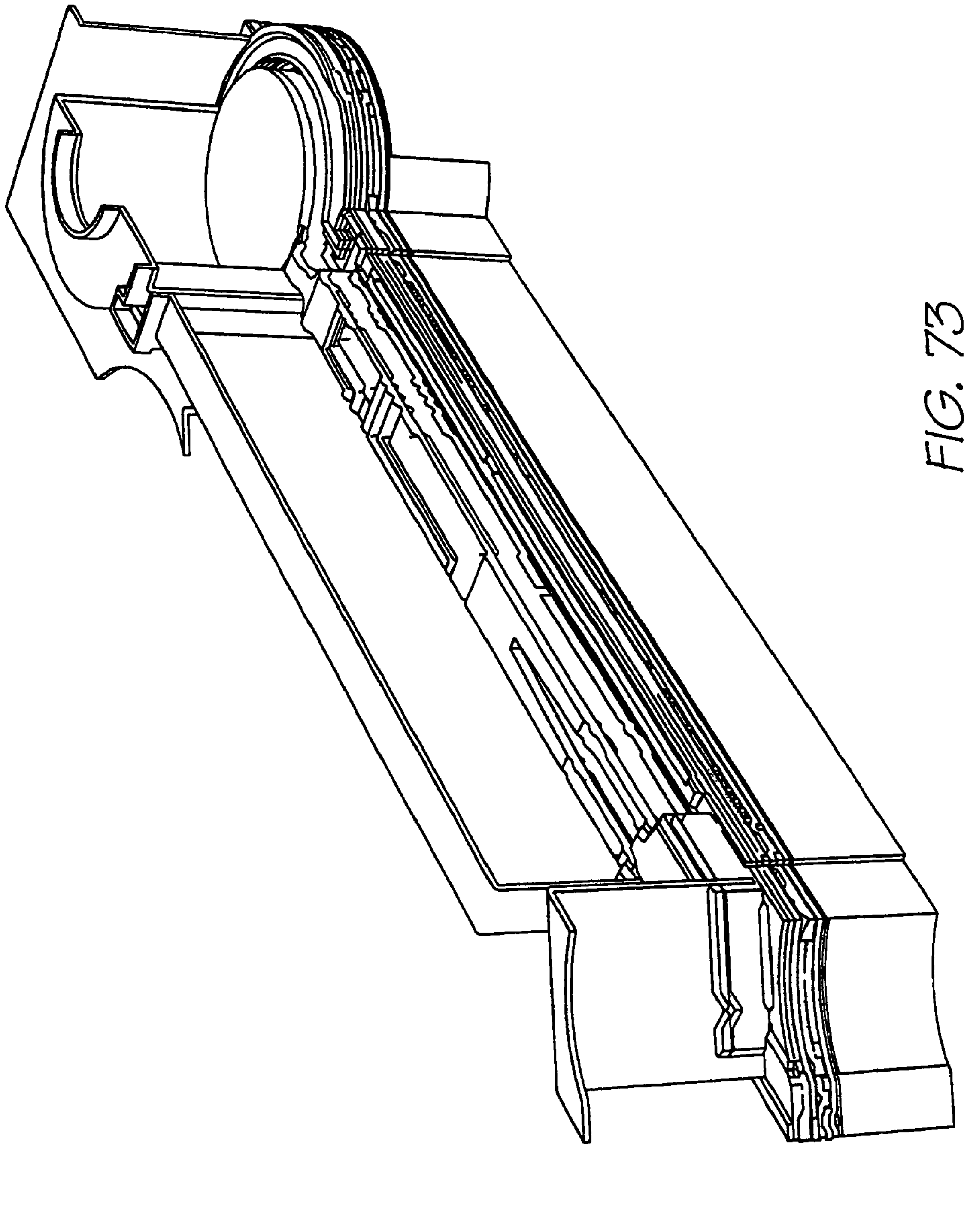
FIG. 73 illustrates a side perspective view partly in section of a single nozzle after etching away of the sacrificial layers taken along a different section line.

46. Etch all of the sacrificial material. The nozzle chambers are cleared by this etch with the result being as shown in FIG. 71. If BPSG is used as the sacrificial material, it can be removed without etching the CMOS glass layers or the actuator glass. This can be achieved with 1000:1 selectivity against undoped glass such as TEOS, using anhydrous HF at 1500 sccm in a $N_2$ atmosphere at 60° C. [L. Chang et al, “Anhydrous HF etch reduces processing steps for DRAM capacitors”, *Solid State Technology Vol.* 41 No. 5, pp 71-76, 1998]. The actuators are freed and the chips are separated from each other, and from the blank wafer, by this etch. If aluminum is used as the sacrificial layer instead of BPSG, then its removal is combined with the previous step, and this step is omitted.

47. Pick up the loose print heads with a vacuum probe, and mount the print heads in their packaging. This must be done carefully, as the unpackaged print heads are fragile. The front surface of the wafer is especially fragile, and should not be touched. This process should be performed manually, as it is difficult to automate. The package is a custom injection molded plastic housing incorporating ink channels that supply the appropriate color ink to the ink inlets at the back of the print head. The package also provides mechanical support to the print head. The package is especially designed to place minimal stress on the chip, and to distribute that stress evenly along the length of the package. The print head is glued into this package with a compliant sealant such as silicone.

48. Form the external connections to the print head chip. For a low profile connection with minimum disruption of airflow, tape automated bonding (TAB) may be used. Wire bonding may also be used if the printer is to be operated with sufficient clearance to the paper. All of the bond pads are along one 100 mm edge of the chip. There are a total of 504 bond pads, in 8 identical groups of 63 (as the chip is fabricated using 8 stitched stepper steps). Each bond pad is 100×100 micron, with a pitch of 200 micron. 256 of the bond pads are used to provide power and ground connections to the actuators, as the peak current is 6.58 Amps at 3V. There are a total of 40 signal connections to the entire print head (24 data and 16 control), which are mostly bussed to the eight identical sections of the print head.

49. Hydrophobize the front surface of the print heads. This can be achieved by the vacuum deposition of 50 nm or more of polytetrafluoroethylene (PTFE). However, there are also many other ways to achieve this. As the fluid is fully controlled by mechanical protuberances formed in previous steps, the hydrophobic layer is an ‘optional extra’ to prevent ink spreading on the surface if the print head becomes contaminated by dust.

Figure 74:
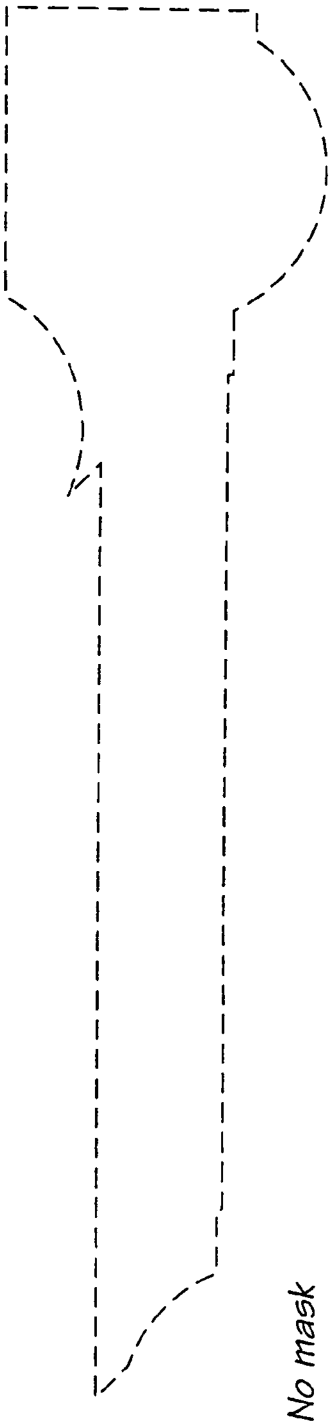
FIG. 74 illustrates a sectional view showing a nozzle filled with ink.
Figure 74:
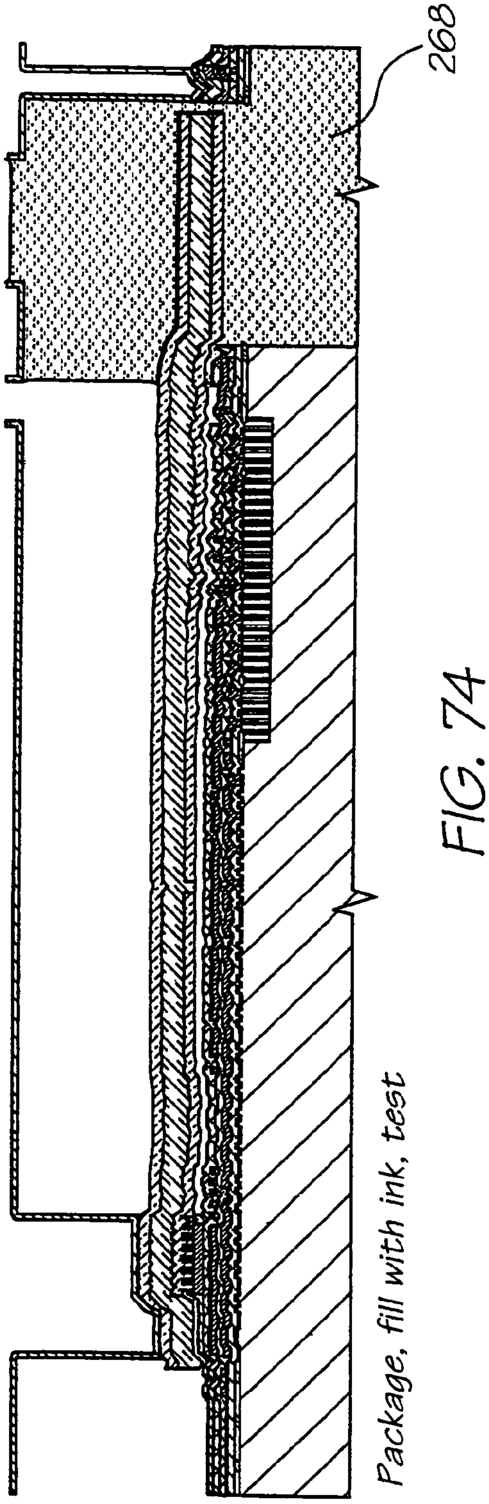
Figure 75:
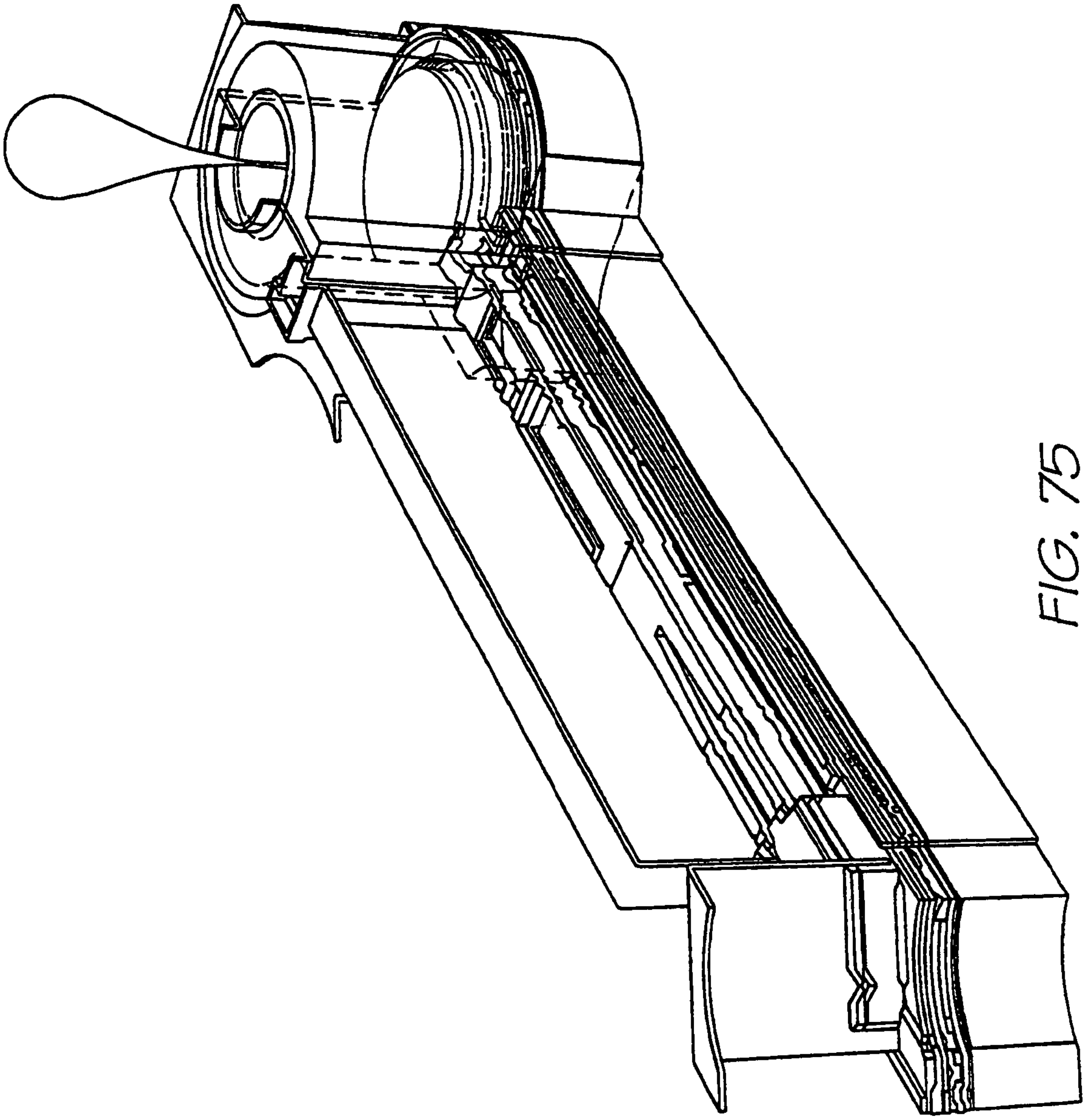
FIG. 75 illustrates a side perspective view partly in section of a single nozzle ejecting ink.

50. Plug the print heads into their sockets. The socket provides power, data, and ink. The ink fills the print-head by capillarity. Allow the completed print heads to fill with ink, and test. FIG. 74 illustrates the filling of ink 268 into the nozzle chamber.

Process Parameters Used for this Implementation Example

The CMOS process parameters utilized can be varied to suit any CMOS process of 0.5 micron dimensions or better. The MEMS process parameters should not be varied beyond the tolerances shown below. Some of these parameters affect the actuator performance and fluidics, while others have more obscure relationships. For example, the wafer thin stage affects the cost and accuracy of the deep silicon etch, the thickness of the back-side hard mask, and the dimensions of the associated plastic ink channel molding. Suggested process parameters can be as follows:

| Parameter | Type | Min. | Nom. | Max. | Units | Tol. |
|---|---|---|---|---|---|---|
| Wafer resistivity | CMOS | 15 | 20 | 25 | Ω cm | ±25% |
| Wafer thickness | CMOS | 600 | 650 | 700 | μm | ±8% |
| N-Well Junction depth | CMOS | 2 | 2.5 | 3 | μm | ±20% |
| n+ Junction depth | CMOS | 0.15 | 0.2 | 0.25 | μm | ±25% |
| p+ Junction depth | CMOS | 0.15 | 0.2 | 0.25 | μm | ±25% |
| Field oxide thickness | CMOS | 0.45 | 0.5 | 0.55 | μm | ±10% |
| Gate oxide thickness | CMOS | 12 | 13 | 14 | nm | ±7% |
| Poly thickness | CMOS | 0.27 | 0.3 | 0.33 | μm | ±10% |
| ILD 1 thickness (PECVD glass) | CMOS | 0.5 | 0.6 | 0.7 | μm | ±16% |
| Metal 1 thickness (aluminum) | CMOS | 0.55 | 0.6 | 0.65 | μm | ±8% |
| ILD 2 thickness (PECVD glass) | CMOS | 0.6 | 0.7 | 0.8 | μm | ±14% |
| Metal 2 thickness (aluminum) | CMOS | 0.55 | 0.6 | 0.65 | μm | ±8% |
| ILD 3 thickness (PECVD glass) | CMOS | 0.6 | 0.7 | 0.8 | μm | ±14% |
| Metal 3 thickness (aluminum) | CMOS | 0.9 | 1.0 | 1.1 | μm | ±10% |
| Overcoat (PECVD glass) | CMOS | 0.4 | 0.5 | 0.6 | μm | ±20% |
| Passivation ($Si_3N_4$) | CMOS | 0.4 | 0.5 | 0.6 | μm | ±20% |
| Heater thickness (TiN) | MEMS | 0.85 | 0.9 | 0.95 | μm | ±5% |
| Actuator thickness (PECVD glass) | MEMS | 1.9 | 2.0 | 2.1 | μm | ±5% |
| Bend compensator thickness (TiN) | MEMS | 0.85 | 0.9 | 0.95 | μm | ±5% |
| Sacrificial layer thickness (low stress BPSG) | MEMS | 13.5 | 15 | 16.5 | μm | ±10% |
| Nozzle etch (BPSG) | MEMS | 1.6 | 2.0 | 2.4 | μm | ±20% |
| Nozzle chamber and shroud (PECVD glass) | MEMS | 0.3 | 0.5 | 0.7 | μm | ±40% |
| Nozzle CMP depth | MEMS | 0.7 | 1 | 1.3 | μm | ±30% |
| Wafer thin (back-grind and polish) | MEMS | 295 | 300 | 305 | μm | ±1.6% |
| Back-etch hard mask ($SiO_2$) | MEMS | 2.25 | 2.5 | 2.75 | μm | ±10% |
| STS ASE back-etch (stop on aluminum) | MEMS | 305 | 325 | 345 | μm | ±6% |

Control Logic

Figure 76:
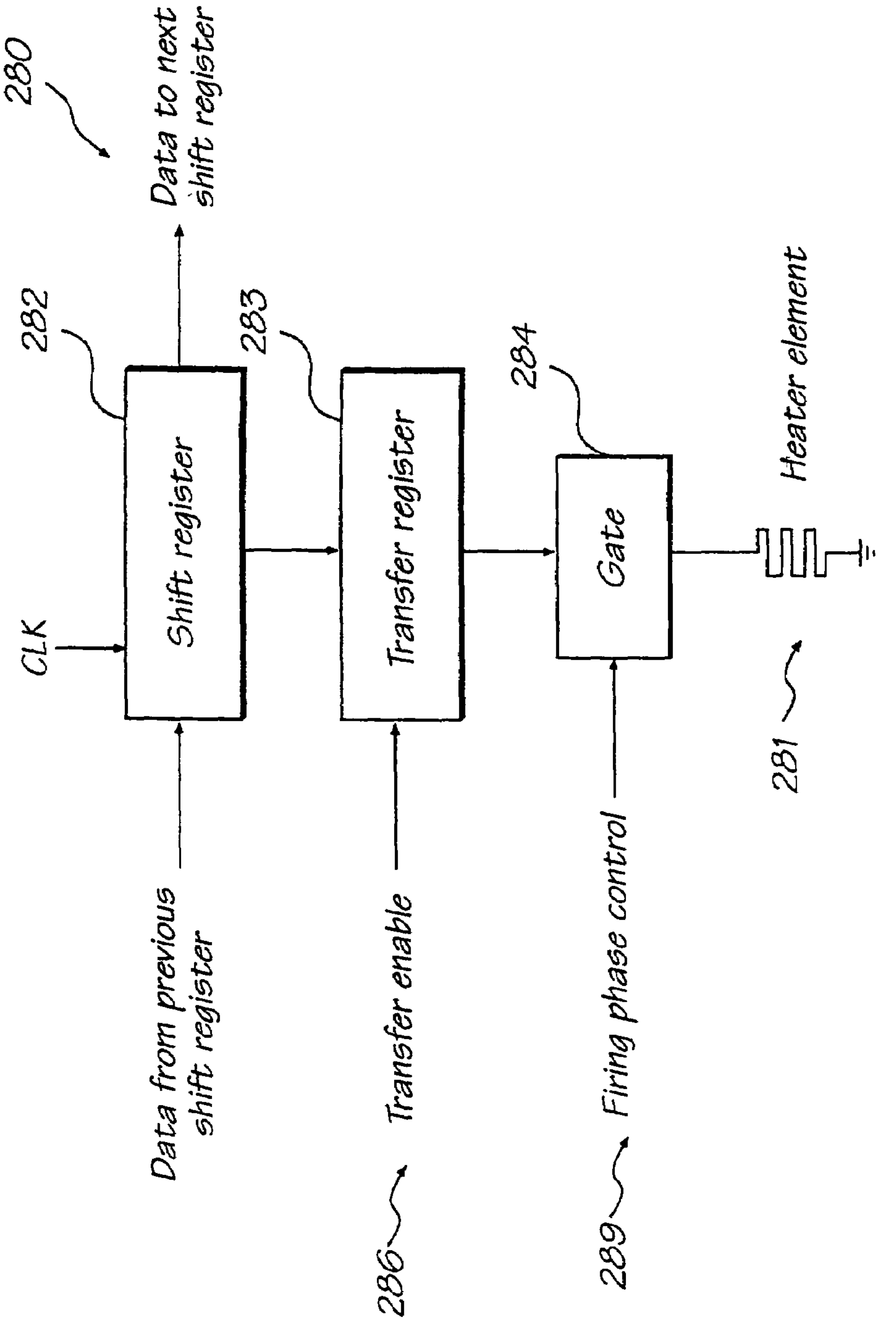
FIG. 76 illustrates a schematic of the control logic for a single nozzle.

Turning over to FIG. 76, there is illustrated the associated control logic for a single ink jet nozzle. The control logic 280 is utilized to activate a heater element 281 on demand. The control logic 280 includes a shift register 282, a transfer register 283 and a firing control gate 284. The basic operation is to shift data from one shift register 282 to the next until it is in place. Subsequently, the data is transferred to a transfer register 283 upon activation of a transfer enable signal 286. The data is latched in the transfer register 283 and subsequently, a firing phase control signal 289 is utilized to activate a gate 284 for output of a heating pulse to heat an element 281.

Figure 77:
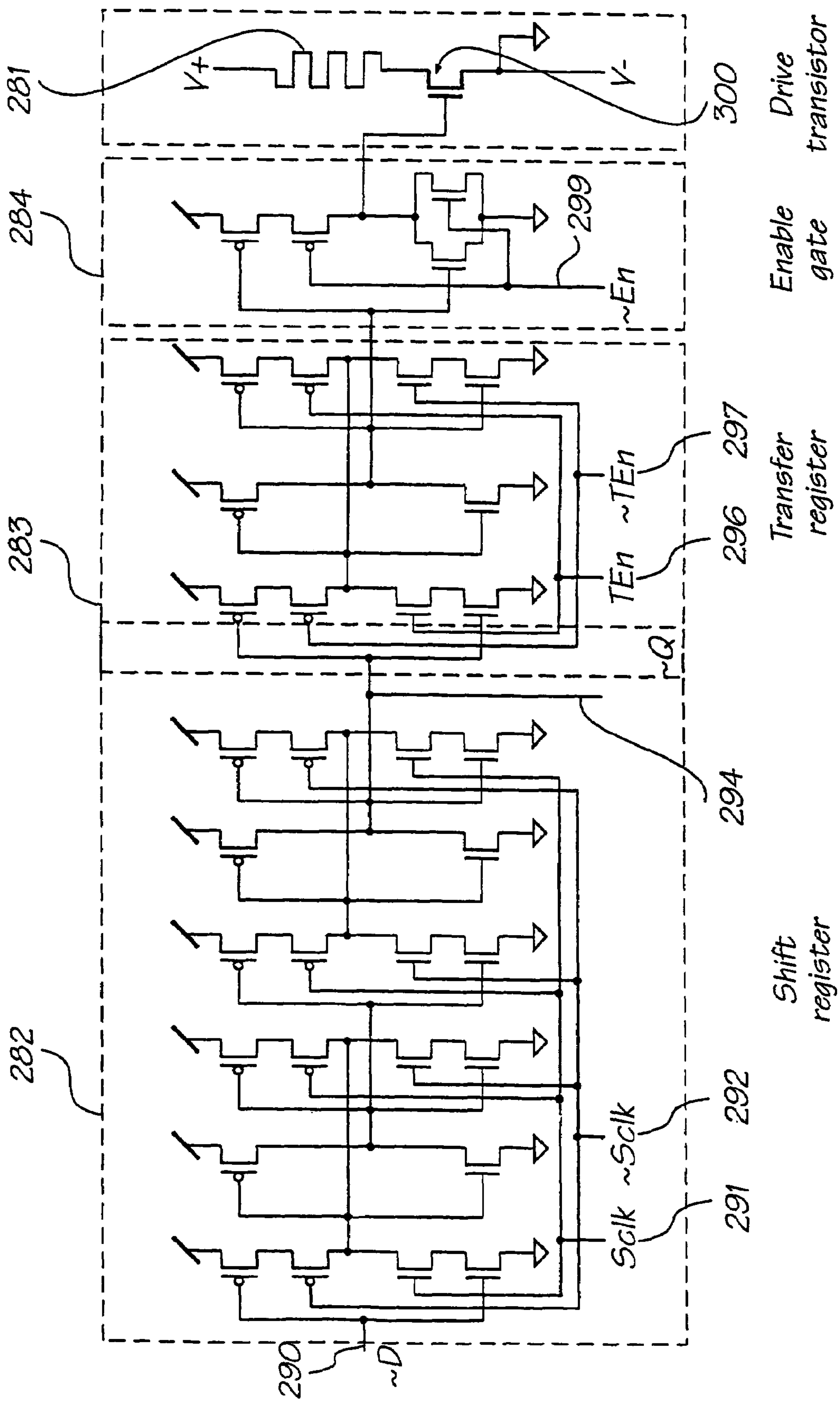
FIG. 77 illustrates a CMOS implementation of the control logic of a single nozzle.

As the preferred implementation utilizes a CMOS layer for implementation of all control circuitry, one form of suitable CMOS implementation of the control circuitry will now be described. Turning now to FIG. 77, there is illustrated a schematic block diagram of the corresponding CMOS circuitry. Firstly, shift register 282 takes an inverted data input and latches the input under control of shift clocking signals 291, 292. The data input 290 is output 294 to the next shift register and is also latched by a transfer register 283 under control of transfer enable signals 296, 297. The enable gate 284 is activated under the control of enable signal 299 so as to drive a power transistor 300 which allows for resistive heating of resistor 281. The functionality of the shift register 282, transfer register 283 and enable gate 284 are standard CMOS components well understood by those skilled in the art of CMOS circuit design.

Replicated Units

The ink jet print head can consist of a large number of replicated unit cells each of which has basically the same design. This design will now be discussed.

Figure 78:
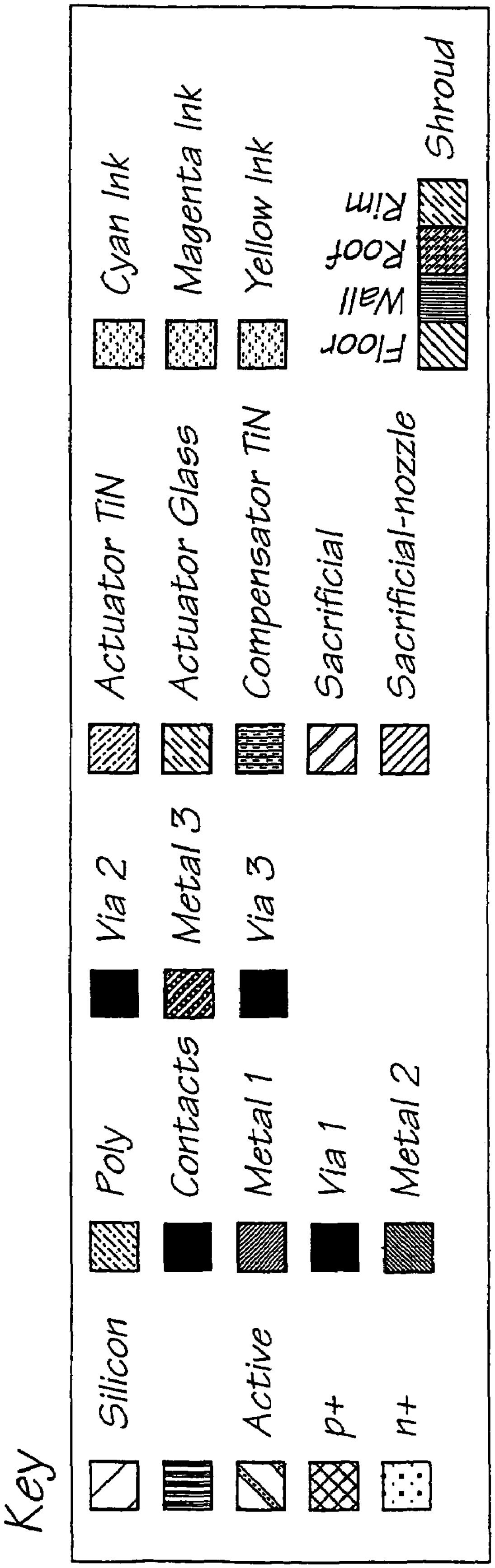
FIG. 78 illustrates a legend or key of the various layers utilized in the described CMOS/MEMS implementation.

Turning initially to FIG. 78, there is illustrated a general key or legend of different material layers utilized in subsequent discussions.

Figure 79:
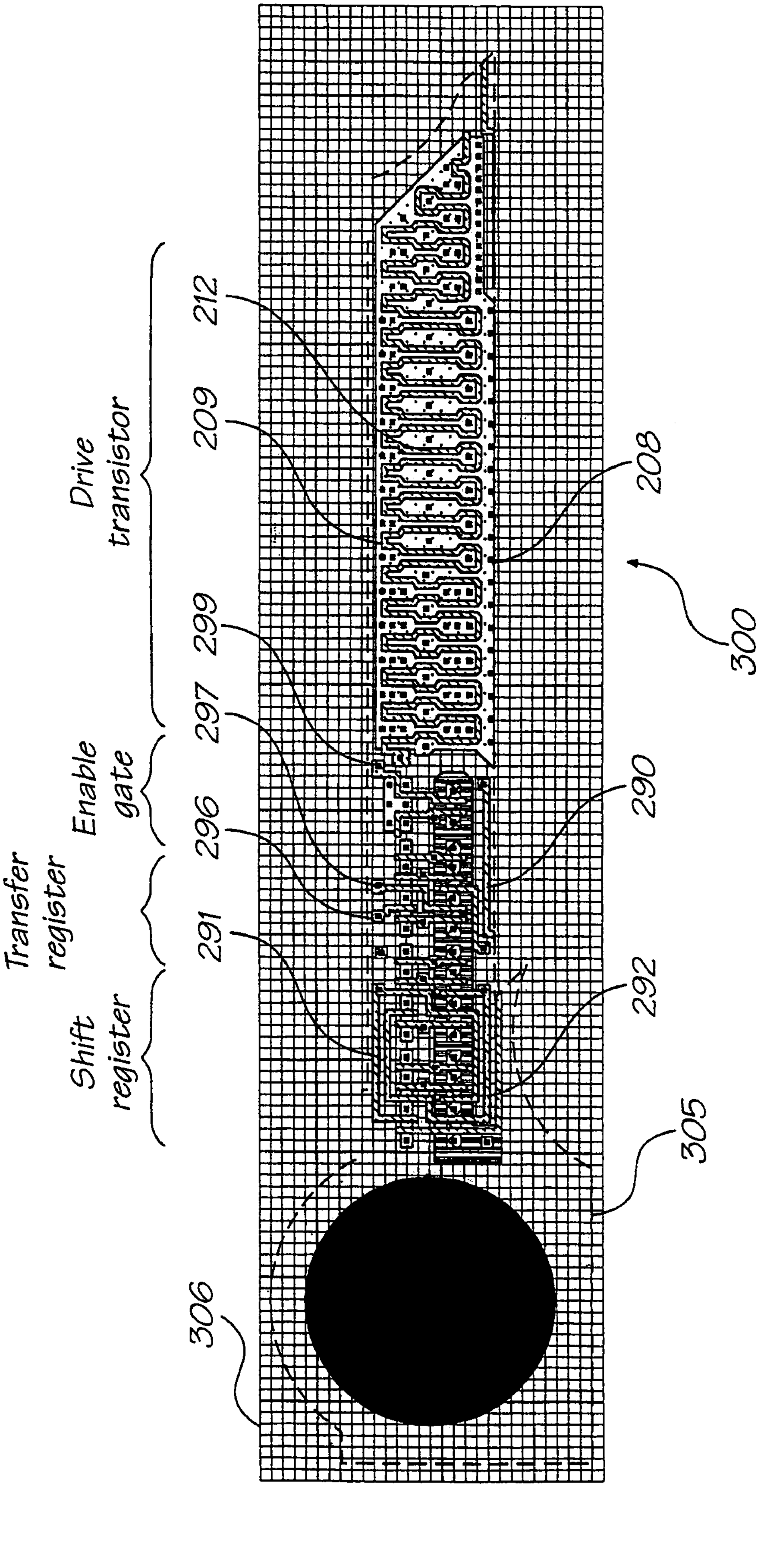
FIG. 79 illustrates the CMOS levels up to the poly level.

FIG. 79 illustrates the unit cell 305 on a 1 micron grid 306. The unit cell 305 is copied and replicated a large number of times with FIG. 79 illustrating the diffusion and poly-layers in addition to vias e.g. 308. The signals 290, 291, 292, 296, 297 and 299 are as previously discussed with reference to FIG. 77. A number of important aspects of FIG. 79 include the general layout including the shift register, transfer register and gate and drive transistor. Importantly, the drive transistor 300 includes an upper poly-layer e.g. 309 which is laid out having a large number of perpendicular traces e.g. 312. The perpendicular traces are important in ensuring that the corrugated nature of a heater element formed over the power transistor 300 will have a corrugated bottom with corrugations running generally in the perpendicular direction of trace 112. This is best shown in FIGS. 69, 71 and 74. Consideration of the nature and directions of the corrugations, which arise unavoidably due to the CMOS wiring underneath, is important to the ultimate operational efficiency of the actuator. In the ideal situation, the actuator is formed without corrugations by including a planarization step on the upper surface of the substrate step prior to forming the actuator. However, the best compromise that obviates the additional process step is to ensure that the corrugations extend in a direction that is transverse to the bending axis of the actuator as illustrated in the examples, and preferably constant along its length. This results in an actuator that may only be 2% less efficient than a flat actuator, which in many situations will be an acceptable result. By contrast, corrugations that extend longitudinally would reduce the efficiency by about 20% compared to a flat actuator.

Figure 80:
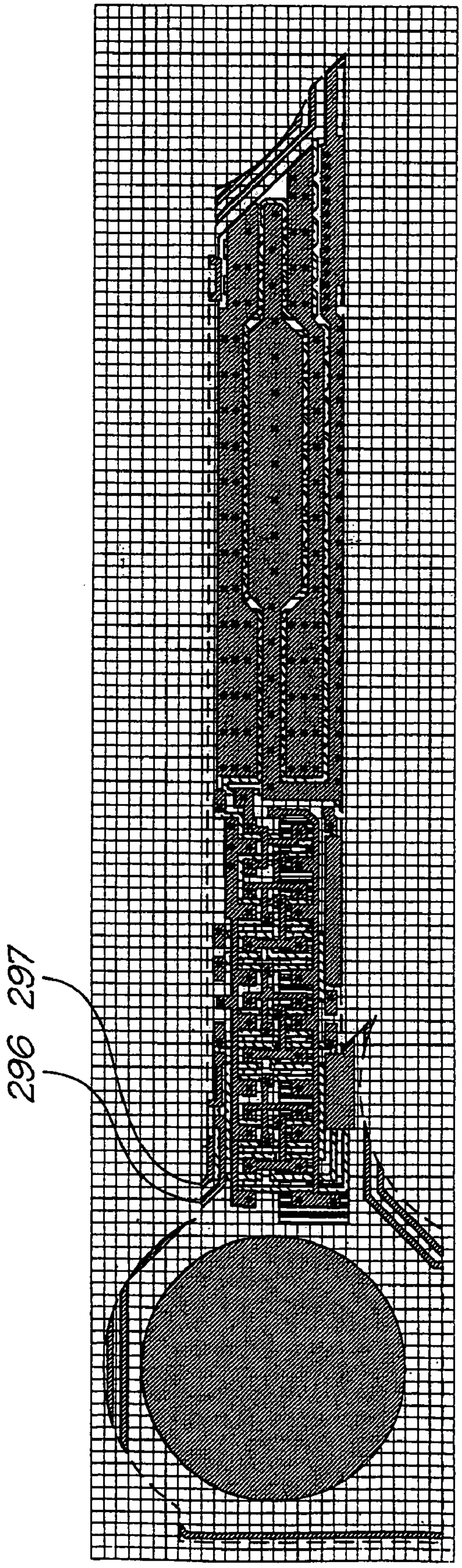
FIG. 80 illustrates the CMOS levels up to the metal 1 level.

In FIG. 80, there is illustrated the addition of the first level metal layer which includes enable lines 296, 297.

Figure 81:
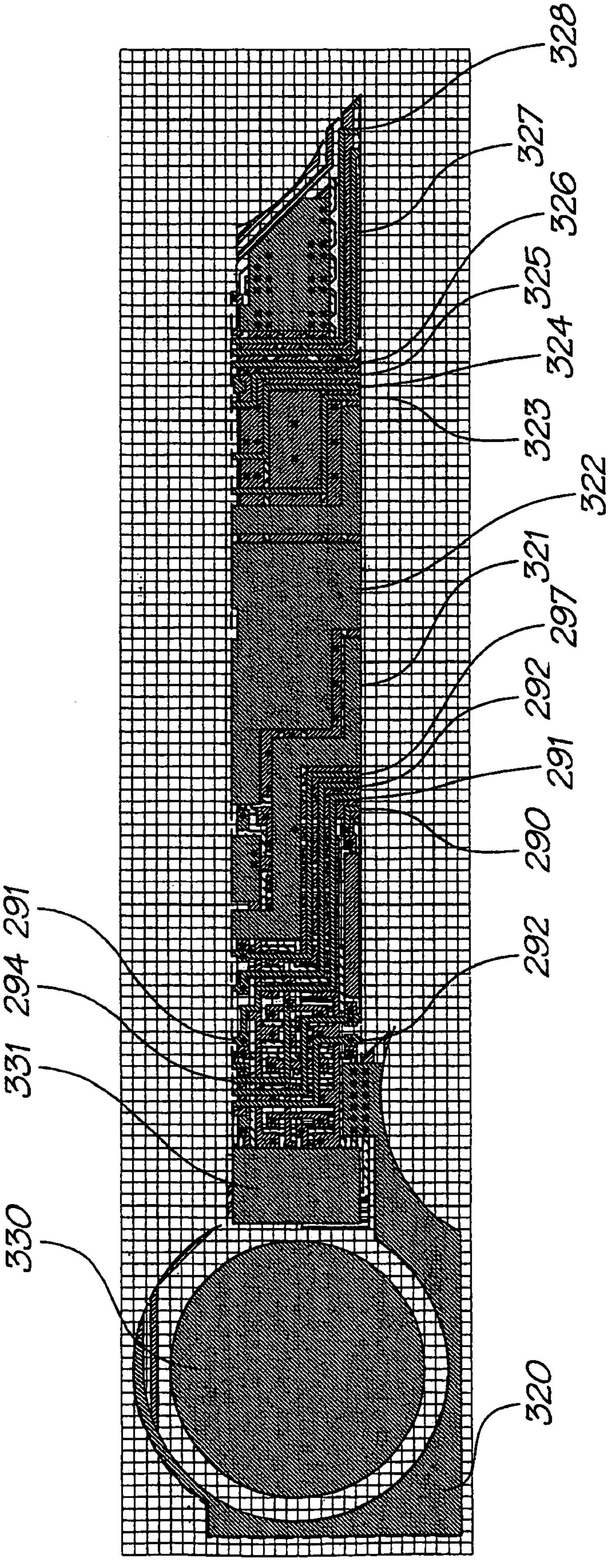
FIG. 81 illustrates the CMOS levels up to the metal 2 level.

In FIG. 81, there is illustrated the second level metal layer which includes data in-line 290, SClock line 91, SClock 292, Q 294, TEn 296 and TEn 297, V-320, $V_{DD}$ 321, $V_S$ 322, in addition to associated reflected components 323 to 328. The portions 330 and 331 are utilized as a sacrificial etch.

Figure 82:
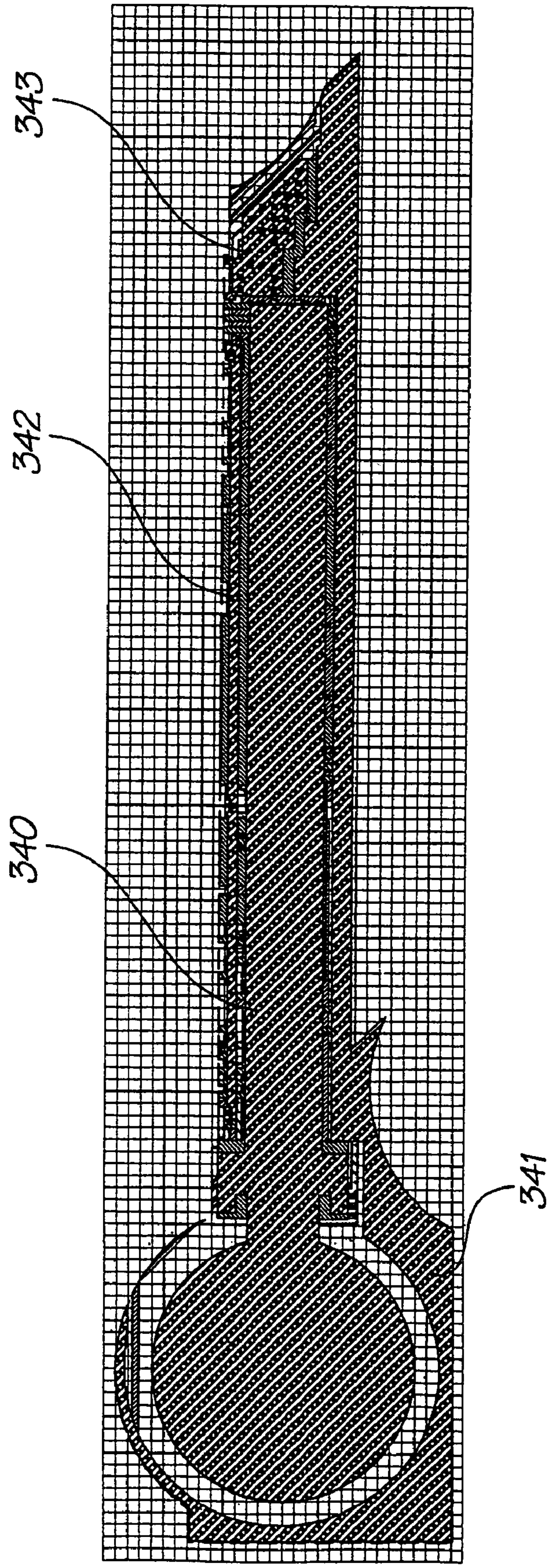
FIG. 82 illustrates the CMOS levels up to the metal 3 level.

Turning now to FIG. 82 there is illustrated the third level metal layer which includes a portion 340 which is utilized as a sacrificial etch layer underneath the heater actuator. The portion 341 is utilized as part of the actuator structure with the portions 342 and 343 providing electrical interconnections.

Figure 83:
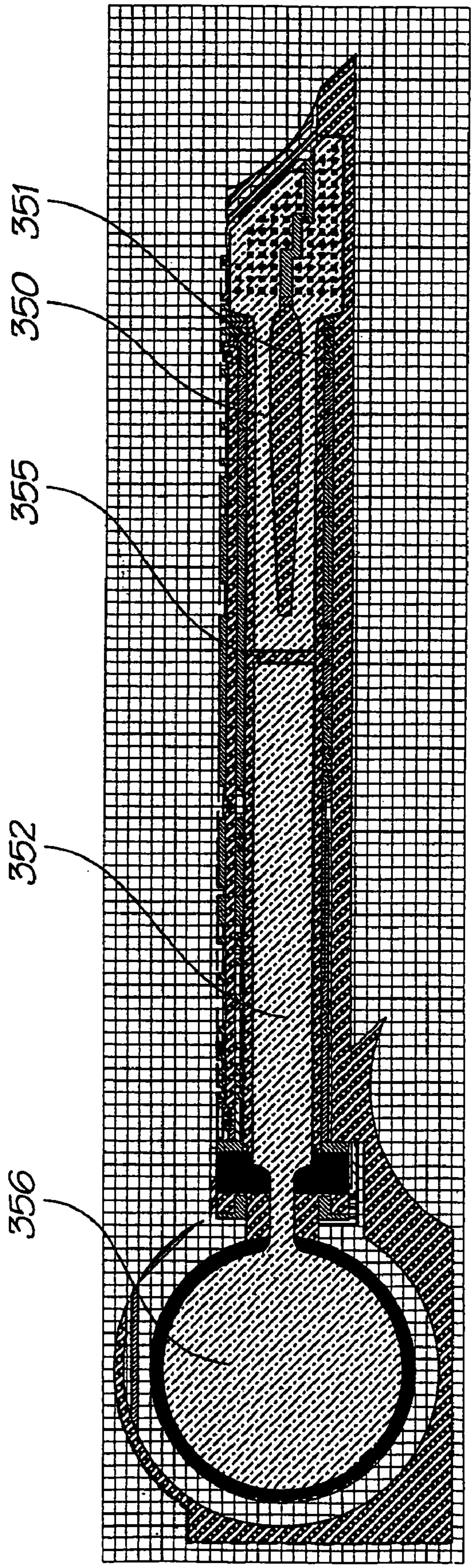
FIG. 83 illustrates the CMOS and MEMS levels up to the MEMS heater level.

Turning now to FIG. 83, there is illustrated the planar conductive heating circuit layer including heater arms 350 and 351 which are interconnected to the lower layers. The heater arms are formed on either side of a tapered slot so that they are narrower toward the fixed or proximal end of the actuator arm, giving increased resistance and therefore heating and expansion in that region. The second portion of the heating circuit layer 352 is electrically isolated from the arms 350 and 351 by a discontinuity 355 and provides for structural support for the main paddle 356. The discontinuity may take any suitable form but is typically a narrow slot as shown at 355.

Each color group 361, 363 consists of two spaced apart rows of ink ejection nozzles e.g. 367 each having a heater actuator element.

Figure 87:
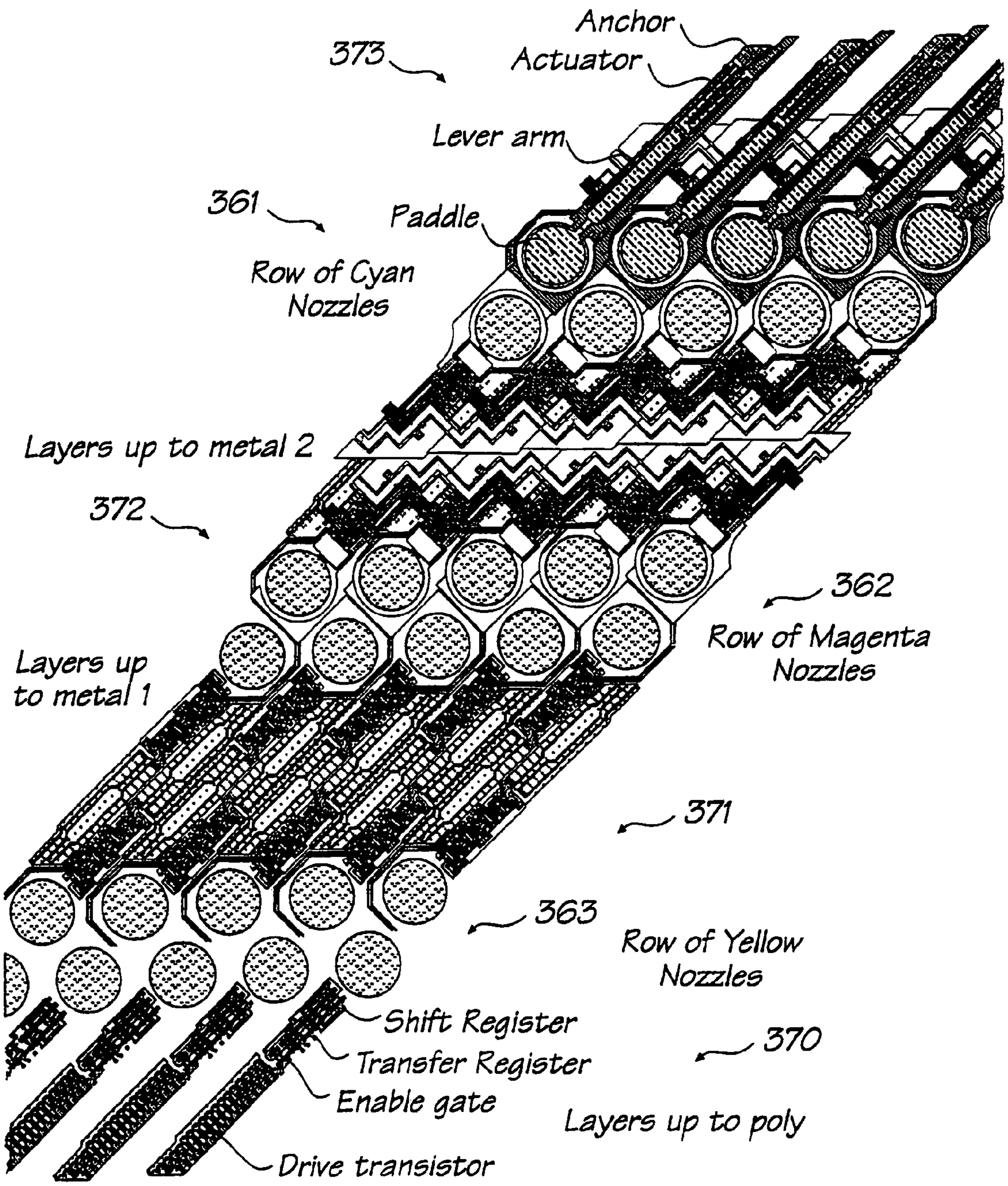
FIG. 87 illustrates a number of layers formed in the construction of a series of actuators.

FIG. 87 illustrates one form of overall layout in a cut away manner with a first area 370 illustrating the layers up to the polysilicon level. A second area 371 illustrating the layers up to the first level metal, the area 372 illustrating the layers up to the second level metal and the area 373 illustrating the layers up to the heater actuator layer.

Figure 88:
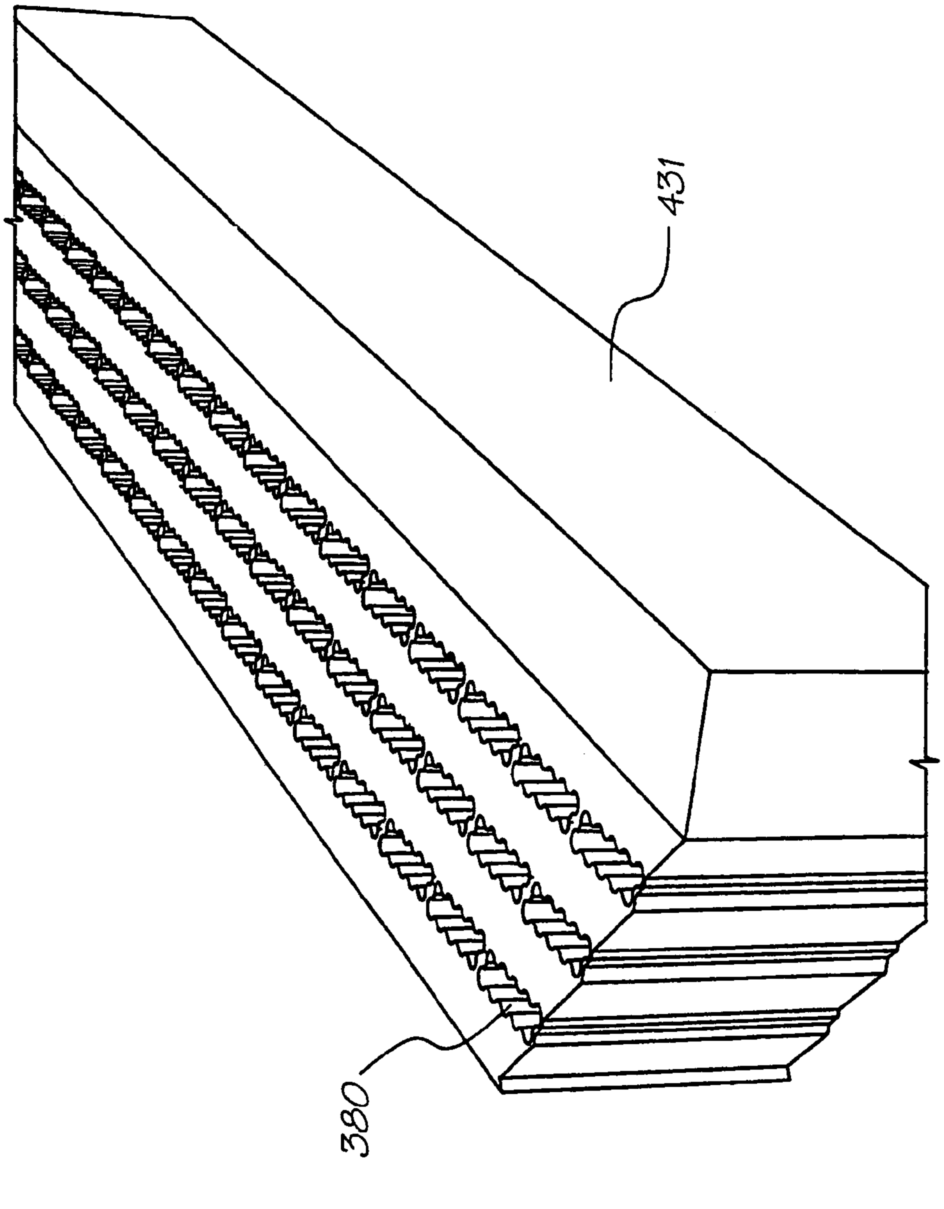
FIG. 88 illustrates a portion of the back surface of a wafer showing the through wafer ink supply channels.

The ink ejection nozzles are grouped in two groups of 10 nozzles sharing a common ink channel through the wafer. Turning to FIG. 88, there is illustrated the back surface of the wafer which includes a series of ink supply channels 380 for supplying ink to a front surface.

Replication

The unit cell is replicated 19,200 times on the 4" print head, in the hierarchy as shown in the replication hierarchy table below. The layout grid is ½ 1 at 0.5 micron (0.125 micron). Many of the ideal transform distances fall exactly on a grid point. Where they do not, the distance is rounded to the nearest grid point. The rounded numbers are shown with an asterisk. The transforms are measured from the center of the corresponding nozzles in all cases. The transform of a group of five even nozzles into five odd nozzles also involves a 180° rotation. The translation for this step occurs from a position where all five pairs of nozzle centers are coincident.

Replication Hierarchy Table

| Replication | Replication Stage | Rotation (°) | Replication Ratio | Total Nozzles | X Transform pixels | Y Transform Grid units | Actual microns | Pixels | Grid units | Actual microns |
|---|---|---|---|---|---|---|---|---|---|---|
| 0 | Initial rotation | 45 | 1:1 | 1 | 0 | 0 | 0 | 0 | 0 | 0 |
| 1 | Even nozzles in a pod | 0 | 5:1 | 5 | 2 | 254 | 31.75 | 1/10 | 13* | 1.625* |
| 2 | Odd nozzles in a pod | 180 | 2:1 | 10 | 1 | 127 | 15.875 | 1 9/16 | 198* | 24.75* |
| 3 | Pods in a CMY tripod | 0 | 3:1 | 30 | 5½ | 699* | 87.375* | 7 | 889 | 111.125 |
| 4 | Tripods per podgroup | 0 | 10:1 | 300 | 10 | 1270 | 158.75 | 0 | 0 | 0 |
| 5 | Podgroups per firegroup | 0 | 2:1 | 600 | 100 | 12700 | 1587.5 | 0 | 0 | 0 |
| 6 | Firegroups per segment | 0 | 4:1 | 2400 | 200 | 25400 | 3175 | 0 | 0 | 0 |
| 7 | Segments per print head | 0 | 8:1 | 19200 | 800 | 101600 | 12700 | 0 | 0 | 0 |

Figure 84:
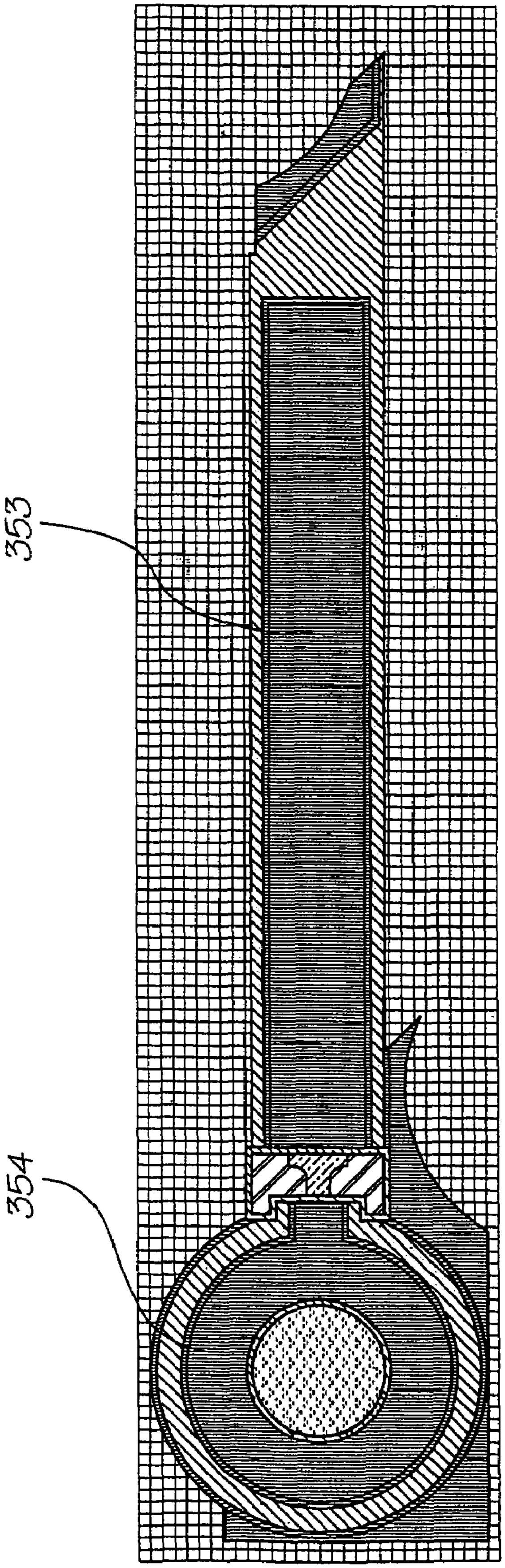
FIG. 84 illustrates the Actuator Shroud Level.

In FIG. 84 there is illustrated the portions of the shroud and nozzle layer including shroud 353 and outer nozzle chamber 354.

Figure 85:
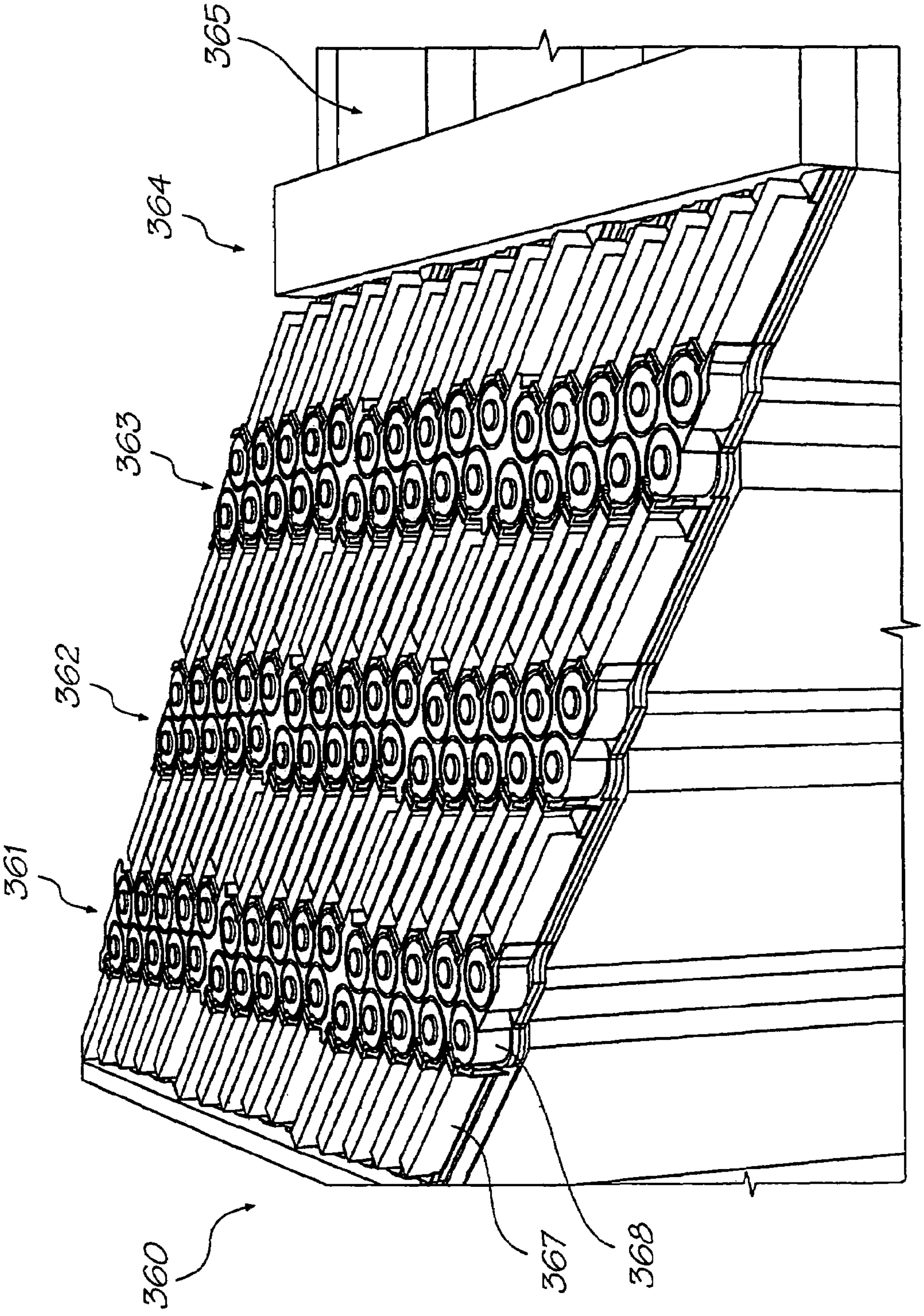
FIG. 85 illustrates a side perspective partly in section of a portion of an ink jet head.
Figure 86:
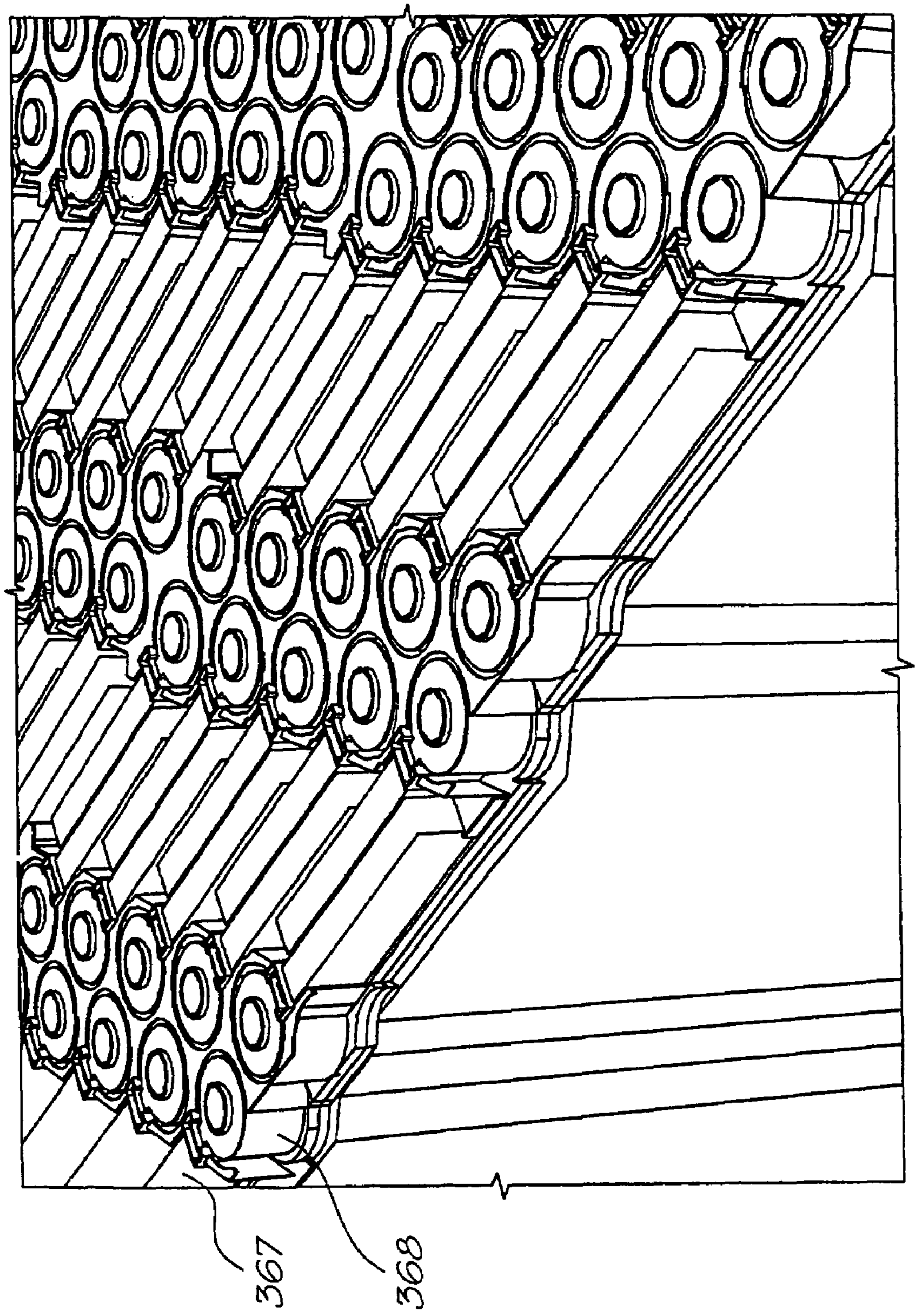
FIG. 86 illustrates an enlarged view of a side perspective partly in section of a portion of an ink jet head.

Turning to FIG. 85, there is illustrated a portion 360 of a array of ink ejection nozzles which are divided into three groups 361-363 with each group providing separate color output (cyan, magenta and yellow) so as to provide full three color printing. A series of standard cell clock buffers and address decoders 364 is also provided in addition to bond pads 365 for interconnection with the external circuitry.

Composition

Figure 89:
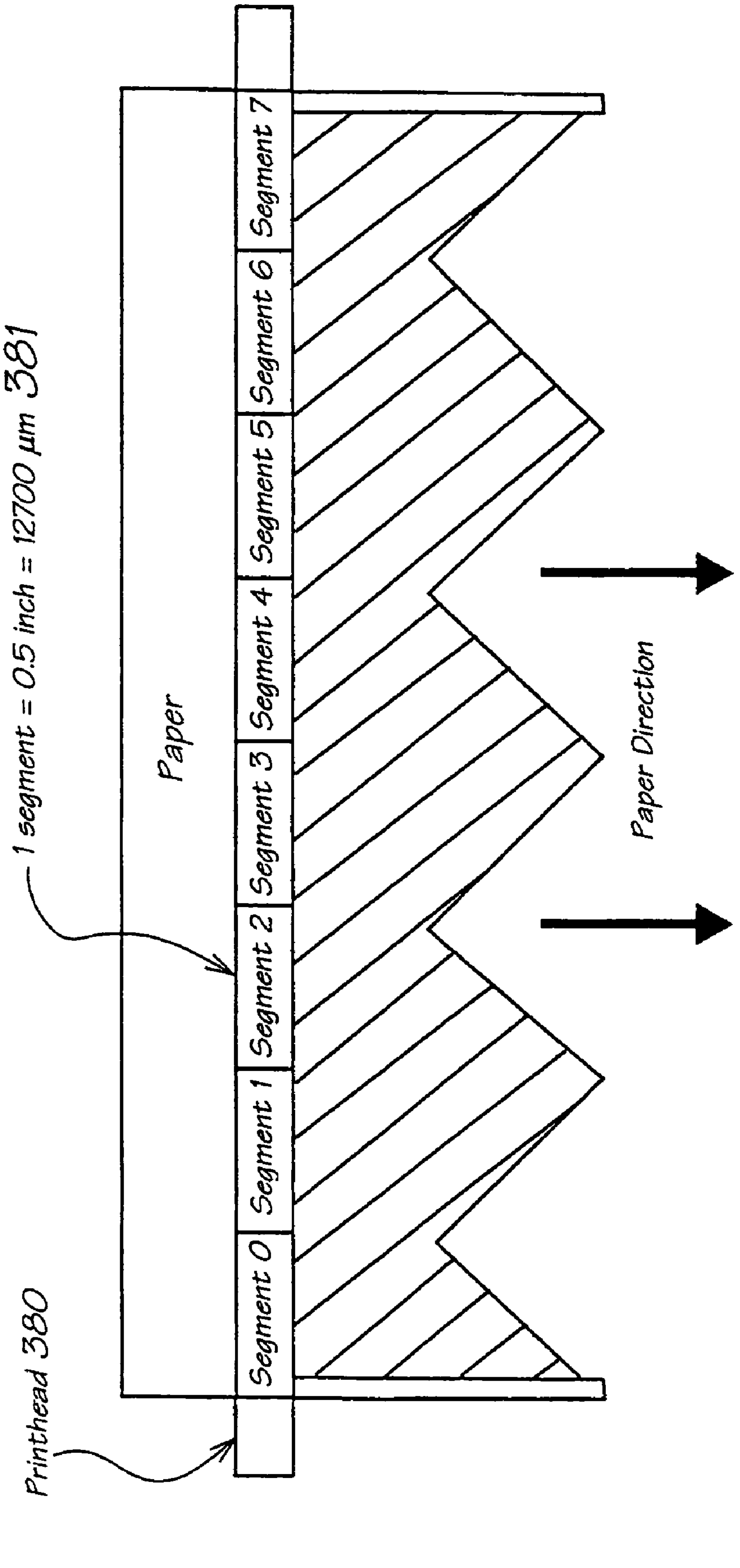
FIG. 89 illustrates the arrangement of segments in a print head.

Taking the example of a 4-inch print head suitable for use in camera photoprinting as illustrated in FIG. 89, a 4-inch print head 380 consists of 8 segments eg. 381, each segment is ½ an inch in length. Consequently each of the segments prints bi-level cyan, magenta and yellow dots over a different part of the page to produce the final image. The positions of the 8 segments are shown in FIG. 89. In this example, the print head is assumed to print dots at 1600 dpi, each dot is 15.875 microns in diameter. Thus each half-inch segment prints 800 dots, with the 8 segments corresponding to positions as illustrated in the following table:

| Segment | First dot | Last dot |
|---|---|---|
| 0 | 0 | 799 |
| 1 | 800 | 1599 |
| 2 | 1600 | 2399 |
| 3 | 2400 | 3199 |
| 4 | 3200 | 3999 |
| 5 | 4000 | 4799 |
| 6 | 4800 | 5599 |
| 7 | 5600 | 6399 |

Although each segment produces 800 dots of the final image, each dot is represented by a combination of bi-level cyan, magenta, and yellow ink. Because the printing is bi-level, the input image should be dithered or error-diffused for best results.

Each segment 381 contains 2,400 nozzles: 800 each of cyan, magenta, and yellow. A four-inch print head contains 8 such segments for a total of 19,200 nozzles.

The nozzles within a single segment are grouped for reasons of physical stability as well as minimization of power consumption during printing. In terms of physical stability, as shown in FIG. 88 groups of 10 nozzles are grouped together and share the same ink channel reservoir. In terms of power consumption, the groupings are made so that only 96 nozzles are fired simultaneously from the entire print head. Since the 96 nozzles should be maximally distant, 12 nozzles are fired from each segment. To fire all 19,200 nozzles, 200 different sets of 96 nozzles must be fired.

Figure 90:
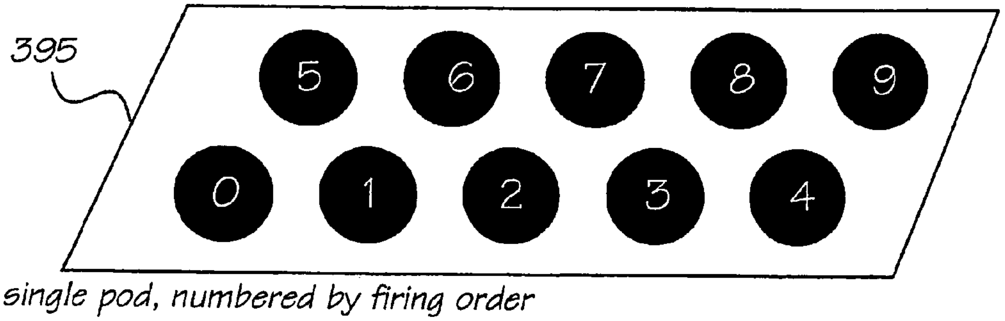
FIG. 90 illustrates schematically a single pod numbered by firing order.

FIG. 90 shows schematically, a single pod 395 which consists of 10 nozzles numbered 1 to 10 sharing a common ink channel supply. 5 nozzles are in one row, and 5 are in another. Each nozzle produces dots 15.875 μm in diameter. The nozzles are numbered according to the order in which they must be fired.

Figure 91:
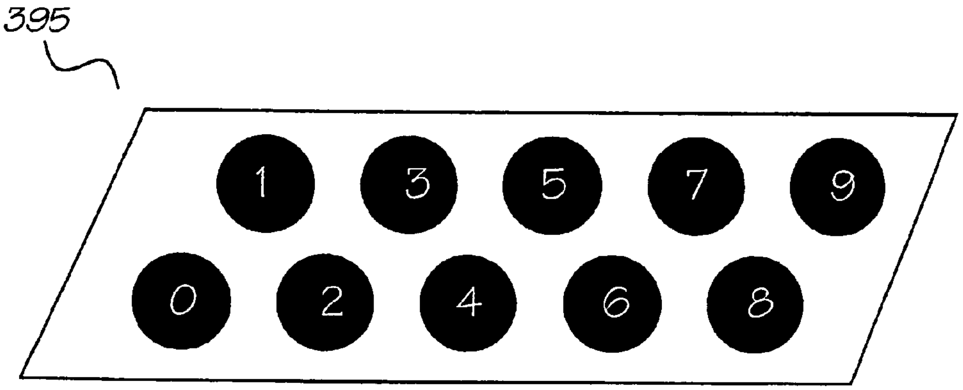
FIG. 91 illustrates schematically a single pod numbered by logical order.

Although the nozzles are fired in this order, the relationship of nozzles and physical placement of dots on the printed page is different. The nozzles from one row represent the even dots from one line on the page, and the nozzles on the other row represent the odd dots from the adjacent line on the page. FIG. 91 shows the same pod 395 with the nozzles numbered according to the order in which they must be loaded.

The nozzles within a pod are therefore logically separated by the width of 1 dot. The exact distance between the nozzles will depend on the properties of the ink jet firing mechanism. In the best case, the print head could be designed with staggered nozzles designed to match the flow of paper. In the worst case there is an error of 1/3200 dpi. While this error would be viewable under a microscope for perfectly straight lines, it certainly will not be an apparent in a photographic image.

Figure 92:
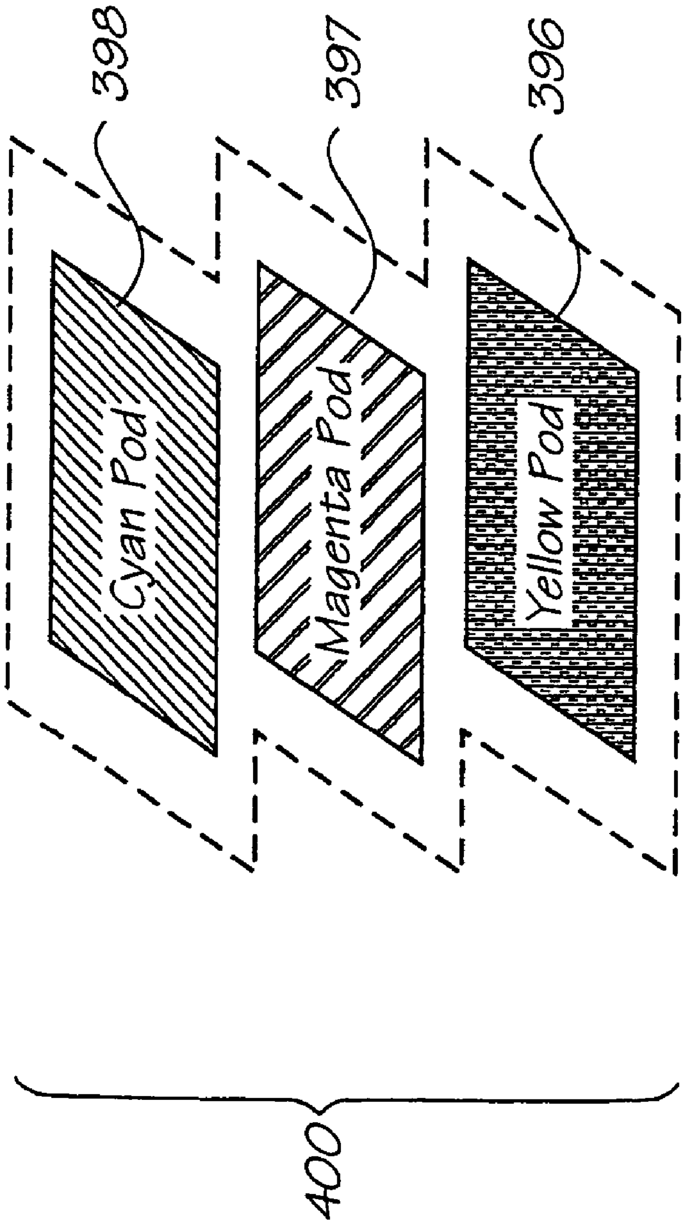
FIG. 92 illustrates schematically a single tripod containing one pod of each color.

As shown in FIG. 92, three pods representing Cyan 398, Magenta 197, and Yellow 396 units, are grouped into a tripod 400. A tripod represents the same horizontal set of 10 dots, but on different lines. The exact distance between different color pods depends on the ink jet operating parameters, and may vary from one ink jet to another. The distance can be considered to be a constant number of dot-widths, and must therefore be taken into account when printing: the dots printed by the cyan nozzles will be for different lines than those printed by the magenta or yellow nozzles. The printing algorithm must allow for a variable distance up to about 8 dot-widths.

Figure 93:
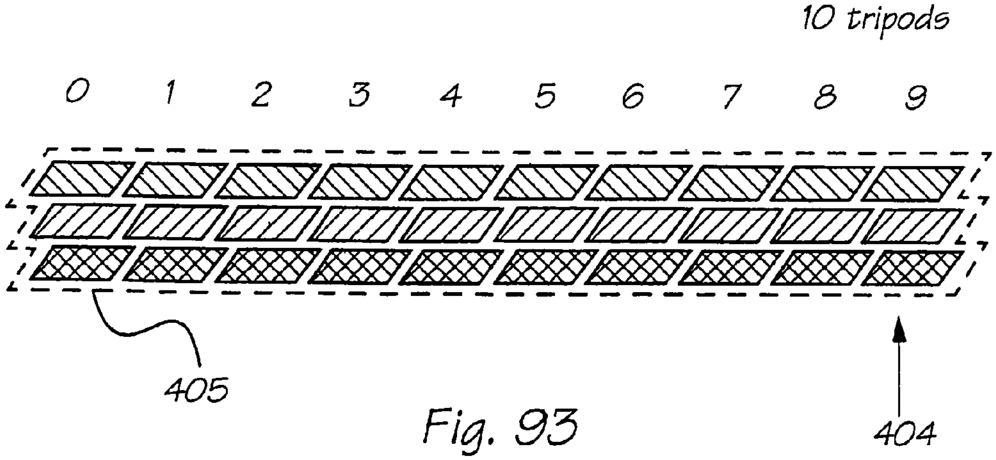
FIG. 93 illustrates schematically a single podgroup containing 10 tripods.

As illustrated in FIG. 93, 10 tripods eg. 404 are organized into a single podgroup 405. Since each tripod contains 30 nozzles, each podgroup contains 300 nozzles: 100 cyan, 100 magenta and 100 yellow nozzles. The arrangement is shown schematically in FIG. 93, with tripods numbered 0-9. The distance between adjacent tripods is exaggerated for clarity.

Figure 94:
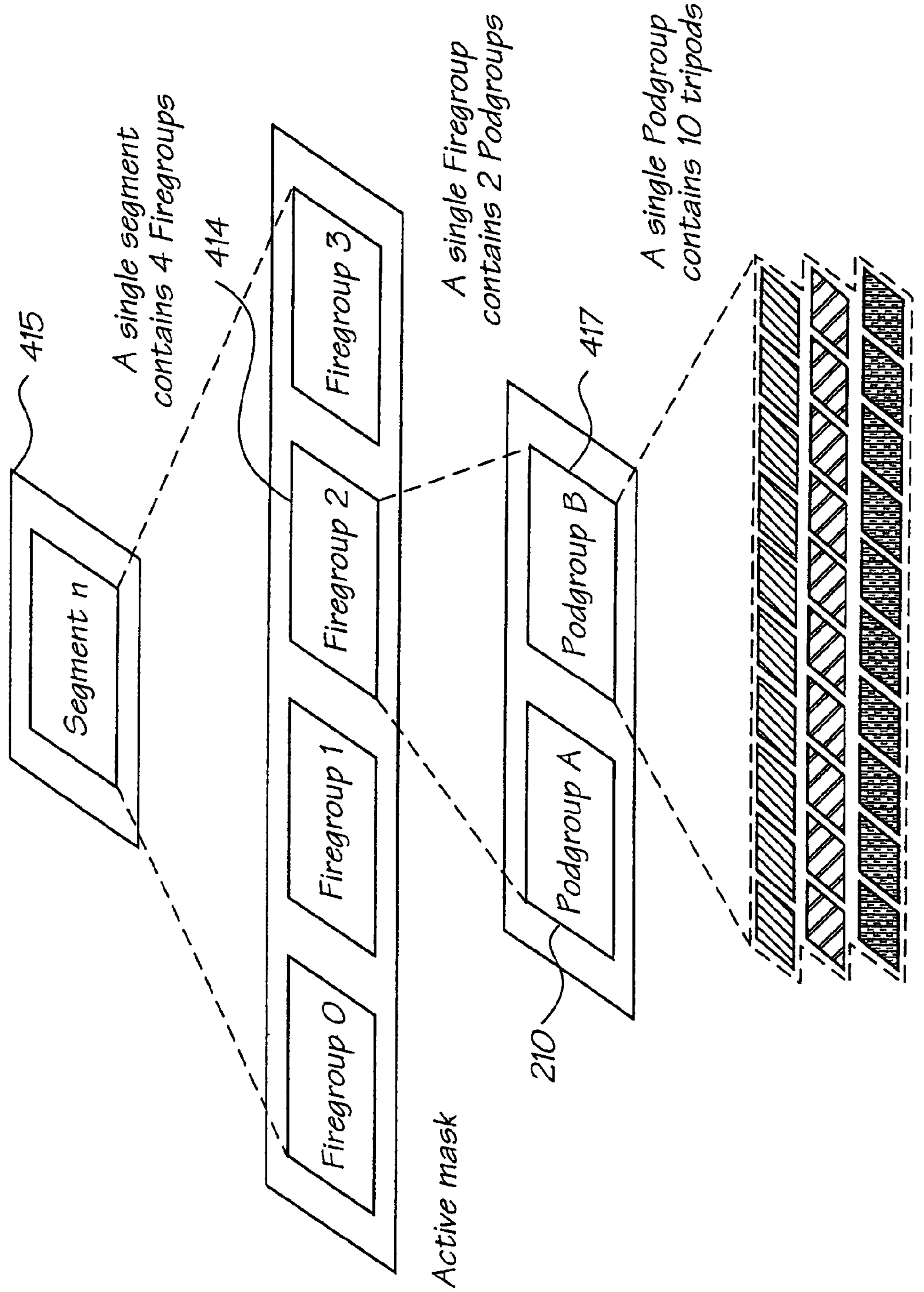
FIG. 94 illustrates schematically, the relationship between segments, firegroups and tripods.

As shown in FIG. 94, two podgroups (PodgroupA 410 and PodgroupB 411) are organized into a single firegroup 414, with 4 firegroups in each segment 415. Each segment 415 contains 4 firegroups. The distance between adjacent firegroups is exaggerated for clarity.

| Name of Grouping | Composition | Replication Ratio | Nozzle Count |
|---|---|---|---|
| Nozzle | Base unit | 1:1 | 1 |
| Pod | Nozzles per pod | 10:1 | 10 |
| Tripod | Pods per CMY tripod | 3:1 | 30 |
| Podgroup | Tripods per podgroup | 10:1 | 300 |
| Firegroup | Podgroups per firegroup | 2:1 | 600 |
| Segment | Firegroups per segment | 4:1 | 2,400 |
| Print head | Segments per print head | 8:1 | 19,200 |

Load and Print Cycles

The print head contains a total of 19,200 nozzles. A Print Cycle involves the firing of up to all of these nozzles, dependent on the information to be printed. A Load Cycle involves the loading up of the print head with the information to be printed during the subsequent Print Cycle.

Each nozzle has an associated NozzleEnable (289 of FIG. 76) bit that determines whether or not the nozzle will fire during the Print Cycle. The NozzleEnable bits (one per nozzle) are loaded via a set of shift registers.

Logically there are 3 shift registers per color, each 800 deep. As bits are shifted into the shift register they are directed to the lower and upper nozzles on alternate pulses. Internally, each 800-deep shift register is comprised of two 400-deep shift registers: one for the upper nozzles, and one for the lower nozzles. Alternate bits are shifted into the alternate internal registers. As far as the external interface is concerned however, there is a single 800 deep shift register.

Once all the shift registers have been fully loaded (800 pulses), all of the bits are transferred in parallel to the appropriate NozzleEnable bits. This equates to a single parallel transfer of 19,200 bits. Once the transfer has taken place, the Print Cycle can begin. The Print Cycle and the Load Cycle can occur simultaneously as long as the parallel load of all NozzleEnable bits occurs at the end of the Print Cycle.

In order to print a 6"×4" image at 1600 dpi in say 2 seconds, the 4" print head must print 9,600 lines (6×1600). Rounding up to 10,000 lines in 2 seconds yields a line time of 200 microseconds. A single Print Cycle and a single Load Cycle must both finish within this time. In addition, a physical process external to the print head must move the paper an appropriate amount.

Load Cycle

The Load Cycle is concerned with loading the print head's shift registers with the next Print Cycle's NozzleEnable bits.

Each segment has 3 inputs directly related to the cyan, magenta, and yellow pairs of shift registers. These inputs are called CDataIn, MDataIn, and YDataIn. Since there are 8 segments, there are a total of 24 color input lines per print head. A single pulse on the SRClock line (shared between all 8 segments) transfers 24 bits into the appropriate shift registers. Alternate pulses transfer bits to the lower and upper nozzles respectively. Since there are 19,200 nozzles, a total of 800 pulses are required for the transfer. Once all 19,200 bits have been transferred, a single pulse on the shared PTransfer line causes the parallel transfer of data from the shift registers to the appropriate NozzleEnable bits. The parallel transfer via a pulse on PTransfer must take place after the Print Cycle has finished. Otherwise the NozzleEnable bits for the line being printed will be incorrect.

Since all 8 segments are loaded with a single SRClock pulse, the printing software must produce the data in the correct sequence for the print head. As an example, the first SRClock pulse will transfer the C, M, and Y bits for the next Print Cycle's dot 0, 800, 1600, 2400, 3200, 4000, 4800, and 5600. The second SRClock pulse will transfer the C, M, and Y bits for the next Print Cycle's dot 1, 801, 1601, 2401, 3201, 4001, 4801 and 5601. After 800 SRClock pulses, the PTransfer pulse can be given.

It is important to note that the odd and even C, M, and Y outputs, although printed during the same Print Cycle, do not appear on the same physical output line. The physical separation of odd and even nozzles within the print head, as well as separation between nozzles of different colors ensures that they will produce dots on different lines of the page. This relative difference must be accounted for when loading the data into the print head. The actual difference in lines depends on the characteristics of the ink jet used in the print head. The differences can be defined by variables $D_1$ and $D_2$ where $D_1$ is the distance between nozzles of different colors (likely value 4 to 8), and $D_2$ is the distance between nozzles of the same color (likely value=1). Table 3 shows the dots transferred to segment n of a print head on the first 4 pulses.

signals). The 12 nozzles from a given segment come equally from each firegroup. Since there are 4 firegroups, 3 nozzles fire from each firegroup. The 3 nozzles are one per color. The nozzles are determined by:

4 Bits NozzleSelect (Select 1 of 10 Nozzles from a Pod)

The duration of the firing pulse is given by the AEnable and BEnable lines, which fire the PodgroupA and PodgroupB nozzles from all firegroups respectively. The duration of a pulse depends on the viscosity of the ink (dependent on temperature and ink characteristics) and the amount of power available to the print head. The AEnable and BEnable are separate lines in order that the firing pulses can overlap. Thus the 200 phases of a Print Cycle consist of 100 A phases and 100 B phases, effectively giving 100 sets of Phase A and Phase B.

When a nozzle fires, it takes approximately 100 microseconds to refill. This is not a problem since the entire Print Cycle takes 200 microseconds. The firing of a nozzle also causes perturbations for a limited time within the common ink channel of that nozzle's pod. The perturbations can interfere with the firing of another nozzle within the same pod. Consequently, the firing of nozzles within a pod should be offset by at least this amount. The procedure is to therefore fire three nozzles from a tripod (one nozzle per color) and then move onto the next tripod within the podgroup. Since there are 10 tripods in a given podgroup, 9 subsequent tripods must fire before the original tripod must fire its next three nozzles. The 9 firing intervals of 2 microseconds gives an ink settling time of 18 microseconds.

Consequently, the firing order is:

TripodSelect 0, NozzleSelect 0 (Phases A and B)
TripodSelect 1, NozzleSelect 0 (Phases A and B)
TripodSelect 2, NozzleSelect 0 (Phases A and B)
TripodSelect 9, NozzleSelect 0 (Phases A and B)
TripodSelect 0, NozzleSelect 1 (Phases A and B)

| | Yellow | | Magenta | | Cyan | |
|---|---|---|---|---|---|---|
| Pulse | Line | Dot | Line | Dot | Line | Dot |
| 1 | N | 800S | N + $D_1$ | 800S | N + 2D1 | 800S |
| 2 | N + $D_2$ | 800S + 1 | N + $D_1$ + $D_2$ | 800S + 1 | N + 2$D_1$ + $D_2$ | 800S + 1 |
| 3 | N | 800S + 2 | N + $D_1$ | 800S + 2 | N + 2$D_1$ | 800S + 2 |
| 4 | N + $D_2$ | 800S + 3 | N + $D_1$ + $D_2$ | 800S + 3 | N + 2$D_1$ + $D_2$ | 800S + 3 |

And so on for all 800 pulses. The 800 SRClock pulses (each clock pulse transferring 24 bits) must take place within the 200 microseconds line time. Therefore the average time to calculate the bit value for each of the 19,200 nozzles must not exceed 200 microseconds/19200=10 nanoseconds. Data can be clocked into the print head at a maximum rate of 10 MHz, which will load the data in 80 microseconds. Clocking the data in at 4 MHz will load the data in 200 microseconds.

Print Cycle

The print head contains 19,200 nozzles. To fire them all at once would consume too much power and be problematic in terms of ink refill and nozzle interference. A single print cycle therefore consists of 200 different phases. 96 maximally distant nozzles are fired in each phase, for a total of 19,200 nozzles.

4 bits TripodSelect (Select 1 of 10 Tripods from a Firegroup)

The 96 nozzles fired each round equate to 12 per segment (since all segments are wired up to accept the same print TripodSelect 1, NozzleSelect 1 (Phases A and B)
TripodSelect 2, NozzleSelect 1 (Phases A and B)
TripodSelect 8, NozzleSelect 9 (Phases A and B)
TripodSelect 9, NozzleSelect 9 (Phases A and B)

Figure 95:
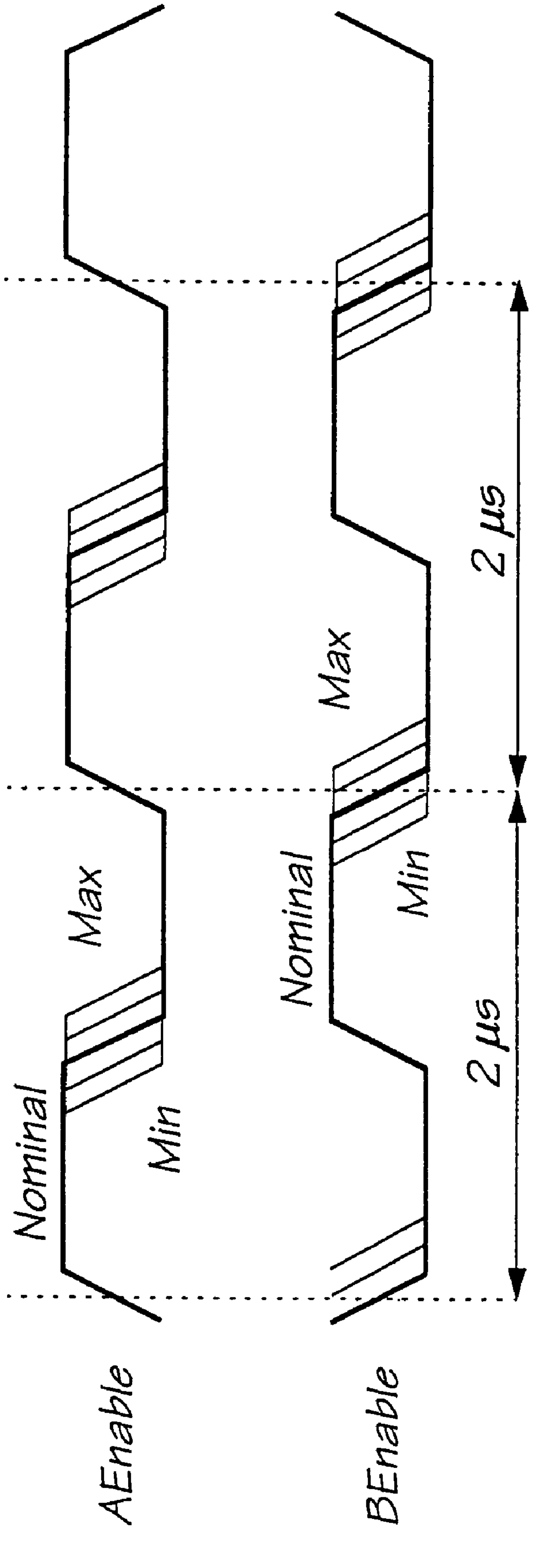
FIG. 95 illustrates clocking for AEnable and BEnable during a typical print cycle.

Note that phases A and B can overlap. The duration of a pulse will also vary due to battery power and ink viscosity (which changes with temperature). FIG. 95 shows the AEnable and BEnable lines during a typical Print Cycle.

Feedback from the Print Head

The print head produces several lines of feedback (accumulated from the 8 segments). The feedback lines can be used to adjust the timing of the firing pulses. Although each segment produces the same feedback, the feedback from all segments share the same tri-state bus lines. Consequently only one segment at a time can provide feedback. A pulse on the SenseEnable line ANDed with data on CYAN enables the sense lines for that segment. The feedback sense lines are as follows:

Tsense informs the controller how hot the print head is. This allows the controller to adjust timing of firing pulses, since temperature affects the viscosity of the ink.

Vsense informs the controller how much voltage is available to the actuator. This allows the controller to compensate for a flat battery or high voltage source by adjusting the pulse width.

Rsense informs the controller of the resistivity (Ohms per square) of the actuator heater. This allows the controller to adjust the pulse widths to maintain a constant energy irrespective of the heater resistivity.

Wsense informs the controller of the width of the critical part of the heater, which may vary up to ±5% due to lithographic and etching variations. This allows the controller to adjust the pulse width appropriately.

Preheat Mode

The printing process has a strong tendency to stay at the equilibrium temperature. To ensure that the first section of the printed photograph has a consistent dot size, ideally the equilibrium temperature should be met before printing any dots. This is accomplished via a preheat mode.

The Preheat mode involves a single Load Cycle to all nozzles with Is (i.e. setting all nozzles to fire), and a number of short firing pulses to each nozzle. The duration of the pulse must be insufficient to fire the drops, but enough to heat up the ink surrounding the heaters. Altogether about 200 pulses for each nozzle are required, cycling through in the same sequence as a standard Print Cycle.

Feedback during the Preheat mode is provided by Tsense, and continues until an equilibrium temperature is reached (about 30° C. above ambient). The duration of the Preheat mode can be around 50 milliseconds, and can be tuned in accordance with the ink composition.

Print Head Interface Summary

The print head has the following connections:

| Name | #Pins | Description |
|---|---|---|
| Tripod Select | 4 | Select which tripod will fire (0-9) |
| NozzleSelect | 4 | Select which nozzle from the pod will fire (0-9) |
| AEnable | 1 | Firing pulse for podgroup A |
| BEnable | 1 | Firing pulse for podgroup B |
| CDataIn[0-7] | 8 | Cyan input to cyan shift register of segments 0-7 |
| MDataIn[0-7] | 8 | Magenta input to magenta shift register of segments 0-7 |
| YDataIn[0-7] | 8 | Yellow input to yellow shift register of segments 0-7 |
| SRClock | 1 | A pulse on SRClock (ShiftRegisterClock) loads the current values from CDataIn[0-7], MdataIn [0-7] and YDataIn[0-CDataIn[0-7], MDataIn[0-7] and YDataIn[0-7] into the 24 shift registers. |
| PTransfer | 1 | Parallel transfer of data from the shift registers to the internal NozzleEnable bits (one per nozzle). |
| SenseEnable | 1 | A pulse on SenseEnable ANDed with data on CDataIn[n] enables the sense lines for segment n. |
| Tsense | 1 | Temperature sense |
| Vsense | 1 | Voltage sense |
| Rsense | 1 | Resistivity sense |
| Wsense | 1 | Width sense |

-continued

| Name | #Pins | Description |
|---|---|---|
| Logic GND | 1 | Logic ground |
| Logic PWR | 1 | Logic power |
| V− | Bus bars | |
| V+ | | |
| TOTAL | 43 | |

Internal to the print head, each segment has the following connections to the bond pads:

Pad Connections

Although an entire print head has a total of 504 connections, the mask layout contains only 63. This is because the chip is composed of eight identical and separate sections, each 12.7 micron long. Each of these sections has 63 pads at a pitch of 200 microns. There is an extra 50 microns at each end of the group of 63 pads, resulting in an exact repeat distance of 12,700 microns (12.7 micron, ½")

| Pads | | |
|---|---|---|
| No. | Name | Function |
| 1 | V− | Negative actuator supply |
| 2 | $V_{ss}$ | Negative drive logic supply |
| 3 | V+ | Positive actuator supply |
| 4 | $V_{dd}$ | Positive drive logic supply |
| 5 | V− | Negative actuator supply |
| 6 | SClk | Serial data transfer clock |
| 7 | V+ | Positive actuator supply |
| 8 | TEn | Parallel transfer enable |
| 9 | V− | Negative actuator supply |
| 10 | EPEn | Even phase enable |
| 11 | V+ | Positive actuator supply |
| 12 | OPEn | Odd phase enable |
| 13 | V− | Negative actuator supply |
| 14 | NA[0] | Nozzle Address [0] (in pod) |
| 15 | V+ | Positive actuator supply |
| 16 | NA[1] | Nozzle Address [1] (in pod) |
| 17 | V− | Negative actuator supply |
| 18 | NA[2] | Nozzle Address [2] (in pod) |
| 19 | V+ | Positive actuator supply |
| 20 | NA[3] | Nozzle Address [3] (in pod) |
| 21 | V− | Negative actuator supply |
| 22 | PA[0] | Pod Address [0] (1 of 10) |
| 23 | V+ | Positive actuator supply |
| 24 | PA[1] | Pod Address [1] (1 of 10) |
| 25 | V− | Negative actuator supply |
| 26 | PA[2] | Pod Address [2] (1 of 10) |
| 27 | V+ | Positive actuator supply |
| 28 | PA[3] | Pod Address [3] (1 of 10) |
| 29 | V− | Negative actuator supply |
| 30 | PGA[0] | Podgroup Address [0] |
| 31 | V+ | Positive actuator supply |
| 32 | FGA[0] | Firegroup Address [0] |
| 33 | V− | Negative actuator supply |
| 34 | FGA[1] | Firegroup Address [1] |
| 35 | V+ | Positive actuator supply |
| 36 | SEn | Sense Enable |
| 37 | V− | Negative actuator supply |
| 38 | Tsense | Temperature sense |
| 39 | V+ | Positive actuator supply |
| 40 | Rsense | Actuator resistivity sense |
| 41 | V− | Negative actuator supply |
| 42 | Wsense | Actuator width sense |
| 43 | V+ | Positive actuator supply |
| 44 | Vsense | Power supply voltage sense |
| 45 | V− | Negative actuator supply |
| 46 | N/C | Spare |
| 47 | V+ | Positive actuator supply |
| 48 | D[C] | Cyan serial data in |

-continued

| Pads | | |
|---|---|---|
| No. | Name | Function |
| 49 | V− | Negative actuator supply |
| 50 | D[M} | Magenta serial data in |
| 51 | V+ | Positive actuator supply |
| 52 | D[Y] | Yellow serial data in |
| 53 | V− | Negative actuator supply |
| 54 | Q[C] | Cyan data out (for testing) |
| 55 | V+ | Positive actuator supply |
| 56 | Q[M} | Magenta data out (for testing) |

-continued

| Pads | | |
|---|---|---|
| No. | Name | Function |
| 57 | V− | Negative actuator supply |
| 58 | Q[Y] | Yellow data out (for testing) |
| 59 | V+ | Positive actuator supply |
| 60 | $V_{ss}$ | Negative drive logic supply |
| 61 | V− | Negative actuator supply |
| 62 | $V_{dd}$ | Positive drive logic supply |
| 63 | V+ | Positive actuator supply |

FABRICATION AND OPERATIONAL TOLERANCES

| Parameter | Cause of variation | Compensation | Min. | Nom. | Max. | Units |
|---|---|---|---|---|---|---|
| Ambient Temperature | Environmental | Real-time | −10 | 25 | 50 | ° C. |
| Nozzle Radius | Lithographic | Brightness adjust | 5.3 | 5.5 | 5.7 | micron |
| Nozzle Length | Processing | Brightness adjust | 0.5 | 1.0 | 1.5 | micron |
| Nozzle Tip Contact Angle | Processing | Brightness adjust | 100 | 110 | 120 | ° |
| Paddle Radius | Lithographic | Brightness adjust | 9.8 | 10.0 | 10.2 | micron |
| Paddle-Chamber Gap | Lithographic | Brightness adjust | 0.8 | 1.0 | 1.2 | micron |
| Chamber Radius | Lithographic | Brightness adjust | 10.8 | 11.0 | 11.2 | micron |
| Inlet Area | Lithographic | Brightness adjust | 5500 | 6000 | 6500 | micron 2 |
| Inlet Length | Processing | Brightness adjust | 295 | 300 | 305 | micron |
| Inlet etch angle (re-entrant) | Processing | Brightness adjust | 90.5 | 91 | 91.5 | degrees |
| Heater Thickness | Processing | Real-time | 0.95 | 1.0 | 1.05 | micron |
| Heater Resistivity | Materials | Real-time | 115 | 135 | 160 | μΩ-cm |
| Heater Young's Modulus | Materials | Mask design | 400 | 600 | 650 | GPa |
| Heater Density | Materials | Mask design | 5400 | 5450 | 5500 | kg/m$^3$ |
| Heater CTE | Materials | Mask design | 9.2 | 9.4 | 9.6 | $10^{-6}$/° C. |
| Heater Width | Lithographic | Real-time | 1.15 | 1.25 | 1.35 | micron |
| Heater Length | Lithographic | Real-time | 27.9 | 28.0 | 28.1 | micron |
| Actuator Glass Thickness | Processing | Brightness adjust | 1.9 | 2.0 | 2.1 | micron |
| Glass Young's Modulus | Materials | Mask design | 60 | 75 | 90 | GPa |
| Glass CTE | Materials | Mask design | 0.0 | 0.5 | 1.0 | $10^{-6}$/° C. |
| Actuator Wall Angle | Processing | Mask design | 85 | 90 | 95 | degrees |
| Actuator to Substrate Gap | Processing | None required | 0.9 | 1.0 | 1.1 | micron |
| Bend Cancelling Layer | Processing | Brightness adjust | 0.95 | 1.0 | 1.05 | micron |
| Lever Arm Length | Lithographic | Brightness adjust | 87.9 | 88.0 | 88.1 | micron |
| Chamber Height | Processing | Brightness adjust | 10 | 11.5 | 13 | micron |
| Chamber Wall Angle | Processing | Brightness adjust | 85 | 90 | 95 | degrees |
| Color Related Ink Viscosity | Materials | Mask design | −20 | Nom. | +20 | % |
| Ink Surface tension | Materials | Programmed | 25 | 35 | 65 | mN/m |
| Ink Viscosity @ 25° C. | Materials | Programmed | 0.7 | 2.5 | 15 | cP |
| Ink Dye Concentration | Materials | Programmed | 5 | 10 | 15 | % |
| Ink Temperature (relative) | Operation | None | −10 | 0 | +10 | ° C. |
| Ink Pressure | Operation | Programmed | −10 | 0 | +10 | kPa |
| Ink Drying | Materials | Programmed | +0 | +2 | +5 | cP |
| Actuator Voltage | Operation | Real-time | 2.75 | 2.8 | 2.85 | V |
| Drive Pulse Width | Xtal Osc. | None required | 1.299 | 1.300 | 1.301 | microsec |
| Drive Transistor Resistance | Processing | Real-time | 3.6 | 4.1 | 4.6 | W |
| Fabrication Temp. (TiN) | Processing | Correct by design | 300 | 350 | 400 | ° C. |
| Battery Voltage | Operation | Real-time | 2.5 | 3.0 | 3.5 | V |

Variation with Ambient Temperature

The main consequence of a change in ambient temperature is that the ink viscosity and surface tension changes. As the bend actuator responds only to differential temperature between the actuator layer and the bend compensation layer, ambient temperature has negligible direct effect on the bend actuator. The resistivity of the TiN heater changes only slightly with temperature. The following simulations are for an water based ink, in the temperature range 0° C. to 80° C.

The drop velocity and drop volume does not increase monotonically with increasing temperature as one may expect. This is simply explained: as the temperature increases, the viscosity falls faster than the surface tension falls. As the viscosity falls, the movement of ink out of the nozzle is made slightly easier. However, the movement of the ink around the paddle—from the high pressure zone at the paddle front to the low pressure zone behind the paddle—changes even more. Thus more of the ink movement is 'short circuited' at higher temperatures and lower viscosities.

| Ambient Temperature ° C. | Ink Viscosity cP | Surface Tension dyne | Actuator Width µm | Actuator Thickness µm | Actuator Length µm | Pulse Voltage V | Pulse Current mA | Pulse Width µs | Pulse Energy nJ | Peak Temperature ° C. | Paddle Deflection µm | Paddle Velocity m/s | Drop Velocity m/s | Drop Volume pl |
|---|---|---|---|---|---|---|---|---|---|---|---|---|---|---|
| 0 | 1.79 | 38.6 | 1.25 | 1.0 | 27 | 2.8 | 42.47 | 1.6 | 190 | 465 | 3.16 | 2.06 | 2.82 | 0.80 |
| 20 | 1.00 | 35.8 | 1.25 | 1.0 | 27 | 2.8 | 42.47 | 1.6 | 190 | 485 | 3.14 | 2.13 | 3.10 | 0.88 |
| 40 | 0.65 | 32.6 | 1.25 | 1.0 | 27 | 2.8 | 42.47 | 1.6 | 190 | 505 | 3.19 | 2.23 | 3.25 | 0.93 |
| 60 | 0.47 | 29.2 | 1.25 | 1.0 | 27 | 2.8 | 42.47 | 1.6 | 190 | 525 | 3.13 | 2.17 | 3.40 | 0.78 |
| 80 | 0.35 | 25.6 | 1.25 | 1.0 | 27 | 2.8 | 42.47 | 1.6 | 190 | 545 | 3.24 | 2.31 | 3.31 | 0.88 |

The temperature of the IJ46 print head is regulated to optimize the consistency of drop volume and drop velocity. The temperature is sensed on chip for each segment. The temperature sense signal (Tsense) is connected to a common Tsense output. The appropriate Tsense signal is selected by asserting the Sense Enable (Sen) and selecting the appropriate segment using the D[$C_{0-7}$] lines. The Tsense signal is digitized by the drive ASIC, and drive pulse width is altered to compensate for the ink viscosity change. Data specifying the viscosity/temperature relationship of the ink is stored in the Authentication chip associated with the ink.

Variation with Nozzle Radius

The nozzle radius has a significant effect on the drop volume and drop velocity. For this reason it is closely controlled by 0.5 micron lithography. The nozzle is formed by a 2 micron etch of the sacrificial material, followed by deposition of the nozzle wall material and a CMP step. The CMP planarizes the nozzle structures, removing the top of the overcoat, and exposed the sacrificial material inside. The sacrificial material is subsequently removed, leaving a self-aligned nozzle and nozzle rim. The accuracy internal radius of the nozzle is primarily determined by the accuracy of the lithography, and the consistency of the sidewall angle of the 2 micron etch.

The following table shows operation at various nozzle radii. With increasing nozzle radius, the drop velocity steadily decreases. However, the drop volume peaks at around a 5.5 micron radius. The nominal nozzle radius is 5.5 microns, and the operating tolerance specification allows a ±4% variation on this radius, giving a range of 5.3 to 5.7 microns. The simulations also include extremes outside of the nominal operating range (5.0 and 6.0 micron). The major nozzle radius variations will likely be determined by a combination of the sacrificial nozzle etch and the CMP step. This means that variations are likely to be non-local: differences between wafers, and differences between the center and the perimeter of a wafer. The between wafer differences are compensated by the 'brightness' adjustment. Within wafer variations will be imperceptible as long as they are not sudden.

| Nozzle Radius µm | Ink Viscosity cP | Surface Tension mN/m | Actuator Width µm | Actuator Length µm | Pulse Voltage V | Pulse Current mA | Pulse Width µs | Pulse Energy nJ | Peak Temperature ° C. | Peak Pressure kPa | Paddle Deflection µm | Paddle Velocity m/s | Drop Velocity m/s | Drop Volume pl |
|---|---|---|---|---|---|---|---|---|---|---|---|---|---|---|
| 5.0 | 0.65 | 32.6 | 1.25 | 25 | 2.8 | 42.36 | 1.4 | 166 | 482 | 75.9 | 2.81 | 2.18 | 4.36 | 0.84 |
| 5.3 | 0.65 | 32.6 | 1.25 | 25 | 2.8 | 42.36 | 1.4 | 166 | 482 | 69.0 | 2.88 | 2.22 | 3.92 | 0.87 |
| 5.5 | 0.65 | 32.6 | 1.25 | 25 | 2.8 | 42.36 | 1.4 | 166 | 482 | 67.2 | 2.96 | 2.29 | 3.45 | 0.99 |
| 5.7 | 0.65 | 32.6 | 1.25 | 25 | 2.8 | 42.36 | 1.4 | 166 | 482 | 64.1 | 3.00 | 2.33 | 3.09 | 0.95 |
| 6.0 | 0.65 | 32.6 | 1.25 | 25 | 2.8 | 42.36 | 1.4 | 166 | 482 | 59.9 | 3.07 | 2.39 | 2.75 | 0.89 |

Ink Supply System

Figure 96:
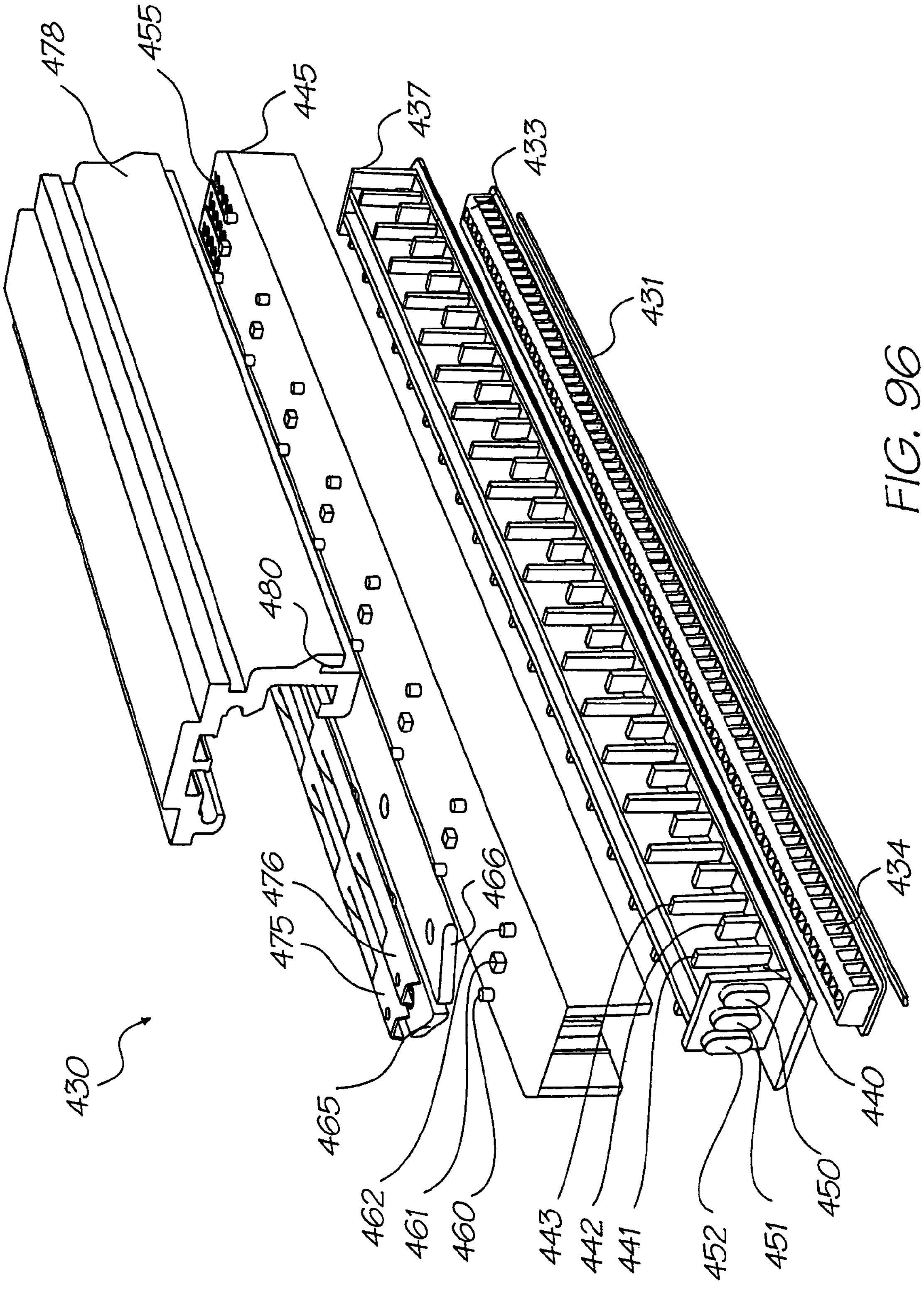
FIG. 96 illustrates an exploded perspective view of the incorporation of a print head into an ink channel molding support structure.
Figure 97:
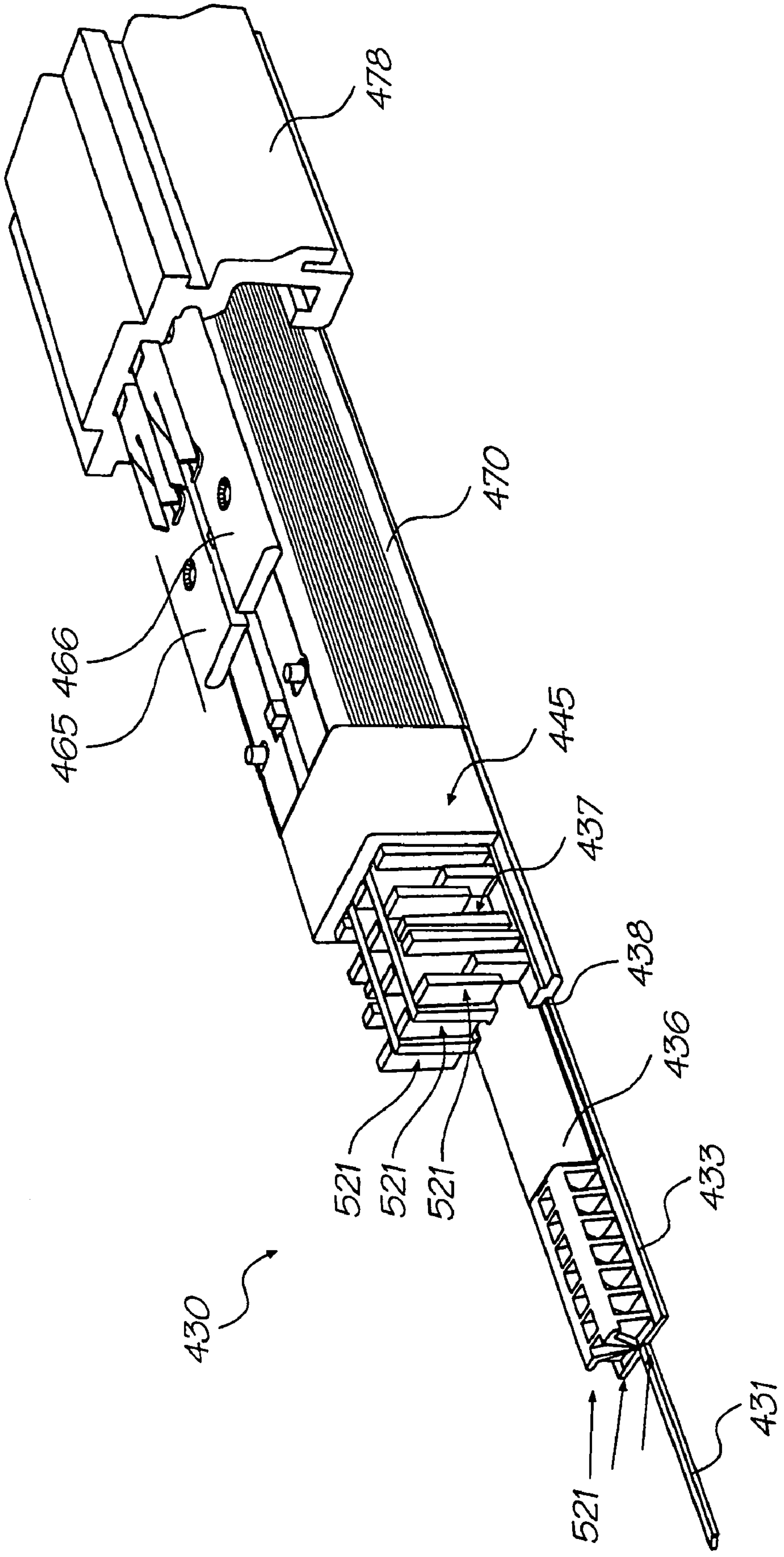
FIG. 97 illustrates a side perspective view partly in section of the ink channel molding support structure.

A print head constructed in accordance with the aforementioned techniques can be utilized in a print camera system similar to that disclosed in PCT patent application No. PCT/AU98/00544. A print head and ink supply arrangement suitable for utilization in a print on demand camera system will now be described. Starting initially with FIG. 96 and FIG. 97, there is illustrated portions of an ink supply arrangement in the form of an ink supply unit 430. The supply unit can be configured to include three ink storage chambers 521 to supply three color inks to the back surface of a print head, which in the preferred form is a print head chip 431. The ink is supplied to the print head by means of an ink distribution molding or manifold 433 which includes a series of slots e.g. 434 for the flow of ink via closely toleranced ink outlets 432 to the back of the print head 431. The outlets 432 are very small having a width of about 100 microns and accordingly need to be made to a much higher degree of accuracy than the adjacent interacting components of the ink supply unit such as the housing 495 described hereafter.

The print head 431 is of an elongate structure and can be attached to the print head aperture 435 in the ink distribution manifold by means of silicone gel or a like resilient adhesive 520.

Preferably, the print head is attached along its back surface 438 and sides 439 by applying adhesive to the internal sides of the print head aperture 435. In this manner the adhesive is applied only to the interconnecting faces of the aperture and print head, and the risk of blocking the accurate ink supply passages 380 formed in the back of the print head chip 431 (see FIG. 88) is minimised. A filter 436 is also provided that is designed to fit around the distribution molding 433 so as to filter the ink passing through the molding 433.

Ink distribution molding 433 and filter 436 are in turn inserted within a baffle unit 437 which is again attached by means of a silicone sealant applied at interface 438, such that ink is able to, for example, flow through the holes 440 and in turn through the holes 434. The baffles 437 can be a plastic injection molded unit which includes a number of spaced apart baffles or slats 441-443. The baffles are formed within each ink channel so as to reduce acceleration of the ink in the storage chambers 521 as may be induced by movement of the portable printer, which in this preferred form would be most disruptive along the longitudinal extent of the print head, whilst simultaneously allowing for flows of ink to the print head in response to active demand therefrom. The baffles are effective in providing for portable carriage of the ink so as to minimize disruption to flow fluctuations during handling.

The baffle unit 437 is in turn encased in a housing 445. The housing 445 can be ultrasonically welded to the baffle member 437 so as to seal the baffle member 437 into three separate ink chambers 521. The baffle member 437 further includes a series of pierceable end wall portions 450-452 which can be pierced by a corresponding mating ink supply conduit for the flow of ink into each of the three chambers. The housing 445 also includes a series of holes 455 which are hydrophobically sealed by means of tape or the like so as to allow air within the three chambers of the baffle units to escape whilst ink remains within the baffle chambers due to the hydrophobic nature of the holes eg. 455.

By manufacturing the ink distribution unit in separate interacting components as just described, it is possible to use relatively conventional molding techniques, despite the high degree of accuracy required at the interface with the print head. That is because the dimensional accuracy requirements are broken down in stages by using successively smaller components with only the smallest final member being the ink distribution manifold or second member needing to be produced to the narrower tolerances needed for accurate interaction with the ink supply passages 380 formed in the chip.

The housing 445 includes a series of positioning protuberances eg. 460-462. A first series of protuberances is designed to accurately position interconnect means in the form of a tape automated bonded film 470, in addition to first 465 and second 466 power and ground busbars which are interconnected to the TAB film 470 at a large number of locations along the surface of the TAB film so as to provide for low resistance power and ground distribution along the surface of the TAB film 470 which is in turn interconnected to the print head chip 431.

Figure 102:
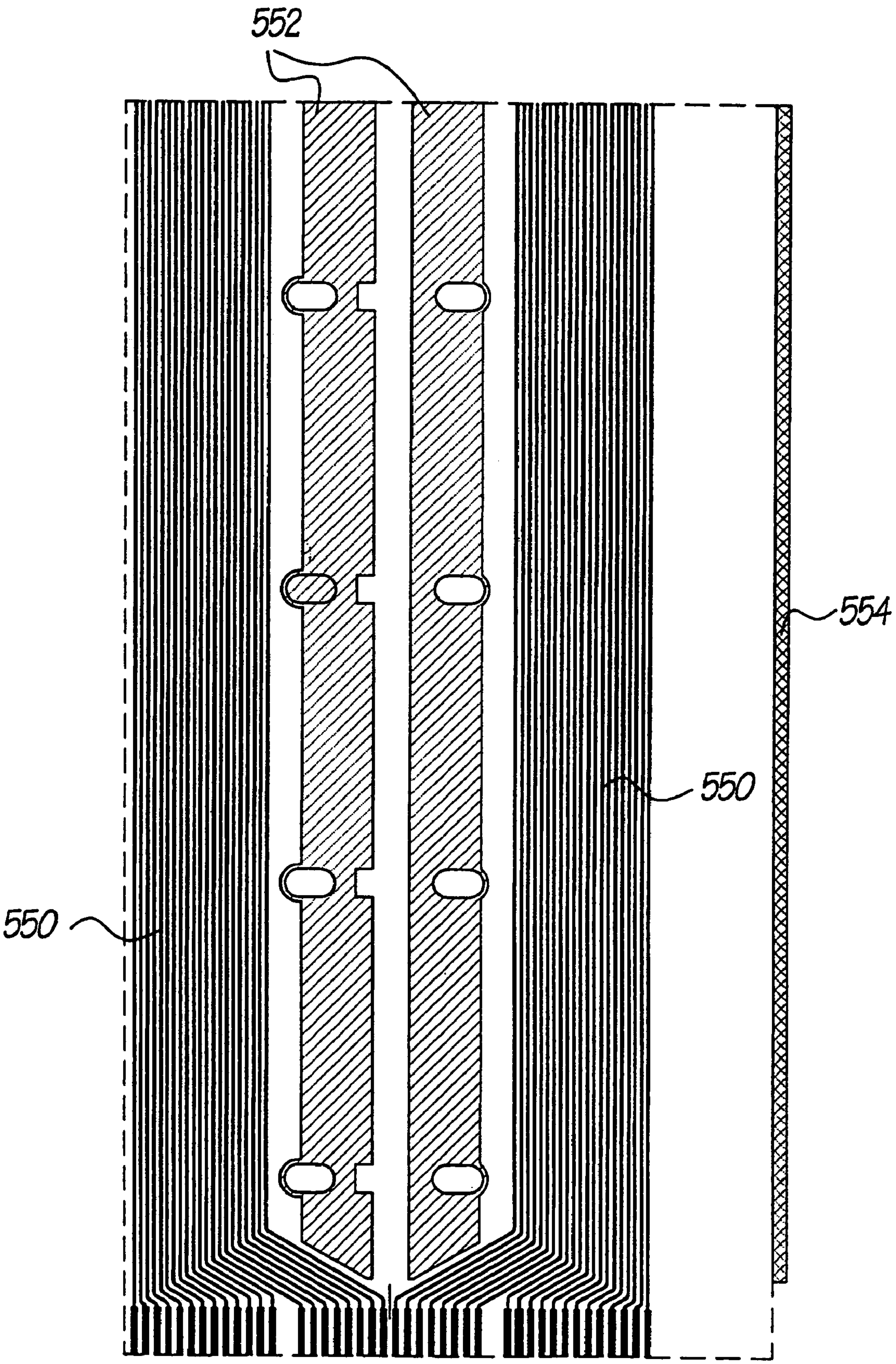
FIG. 102 illustrates an opened out plan view of the outermost side of the tape automated bonded film shown in FIG. 97.
Figure 103:
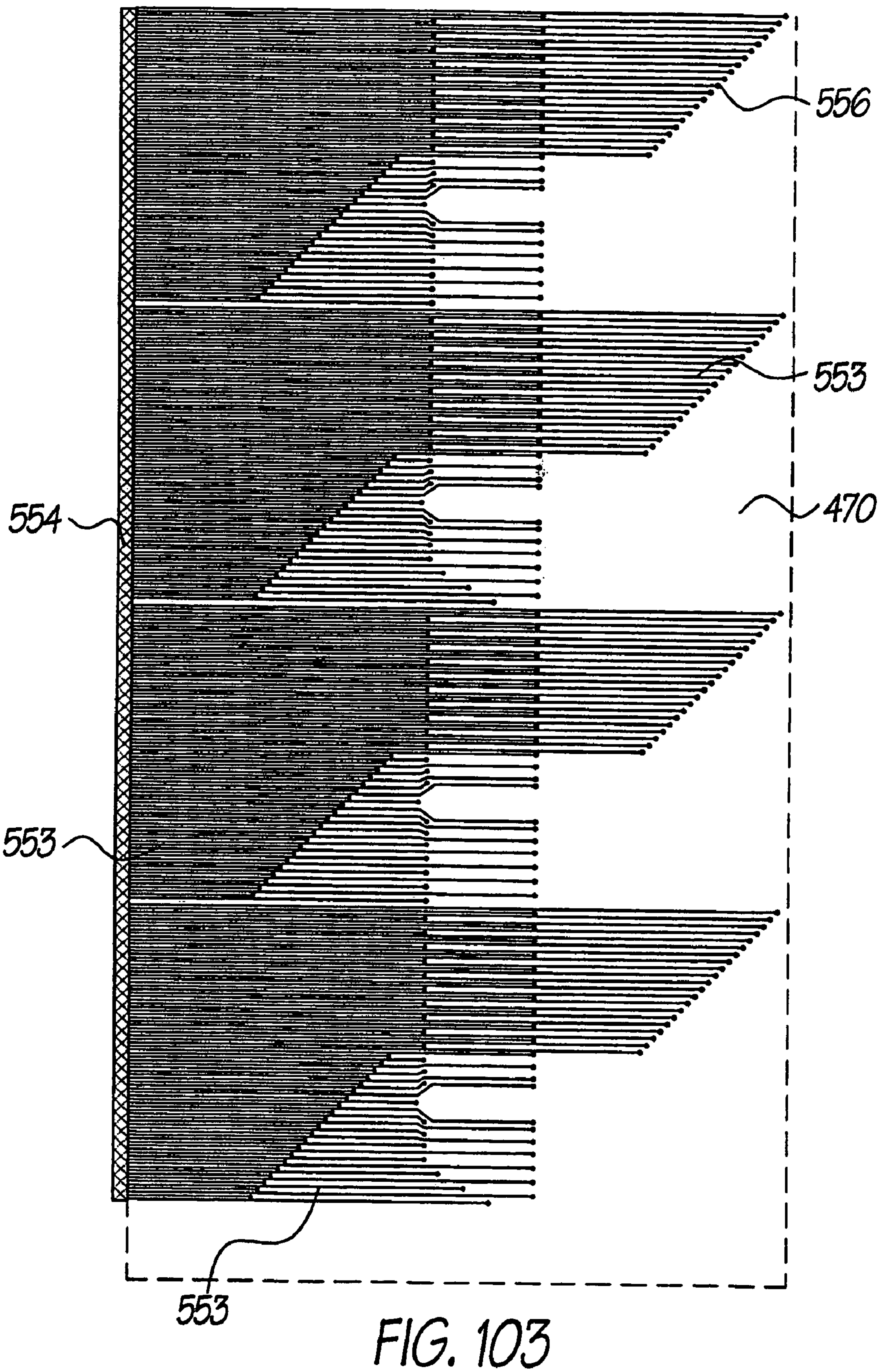
FIG. 103 illustrates the reverse side of the opened out tape automated bonded film shown in FIG. 102.
Figure 104:
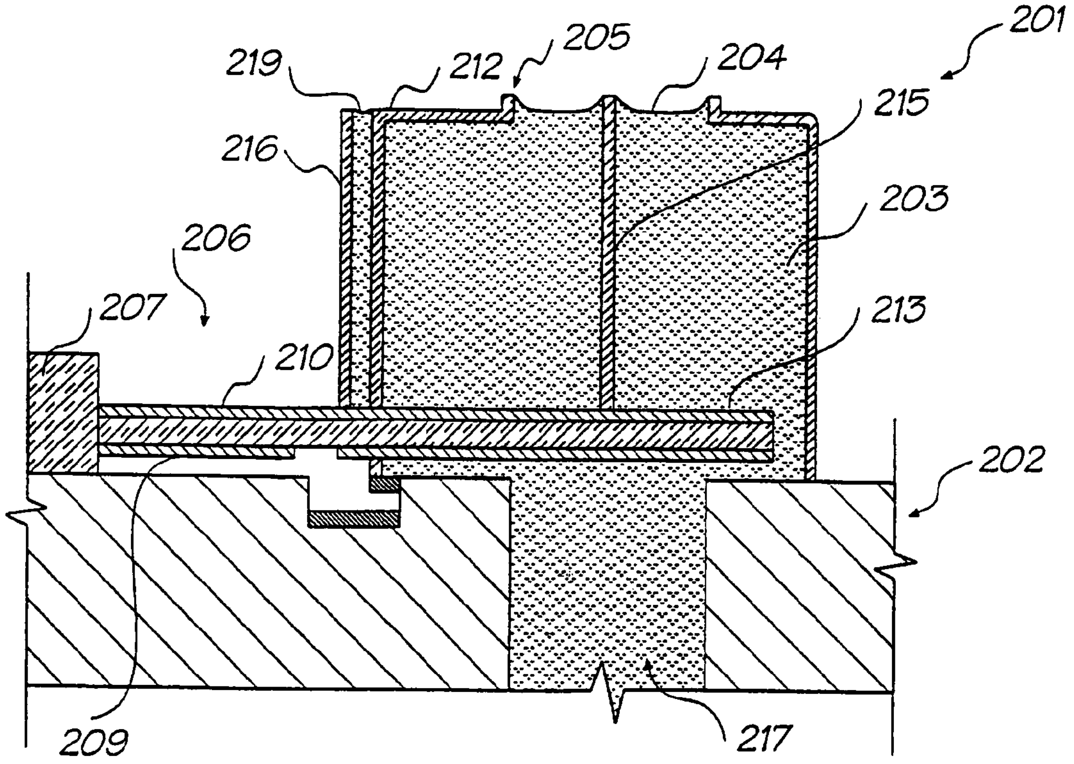
FIGS. 104-106 illustrates schematically the operational principles of the preferred embodiments.
Figure 105:
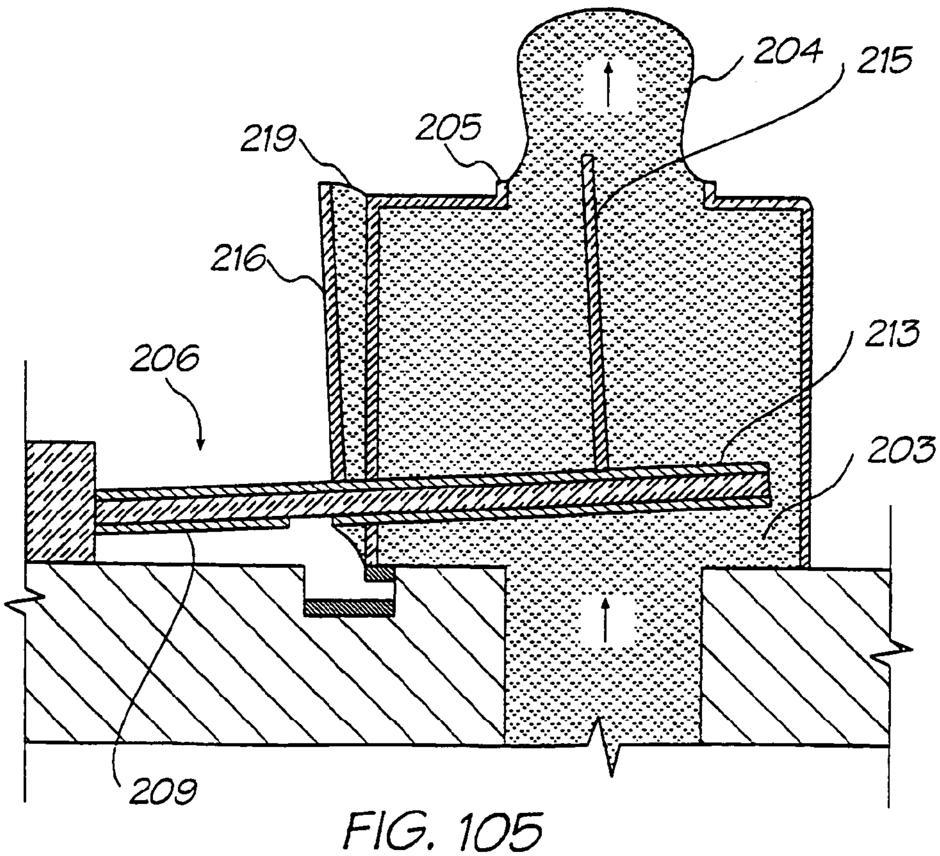
Figure 106:
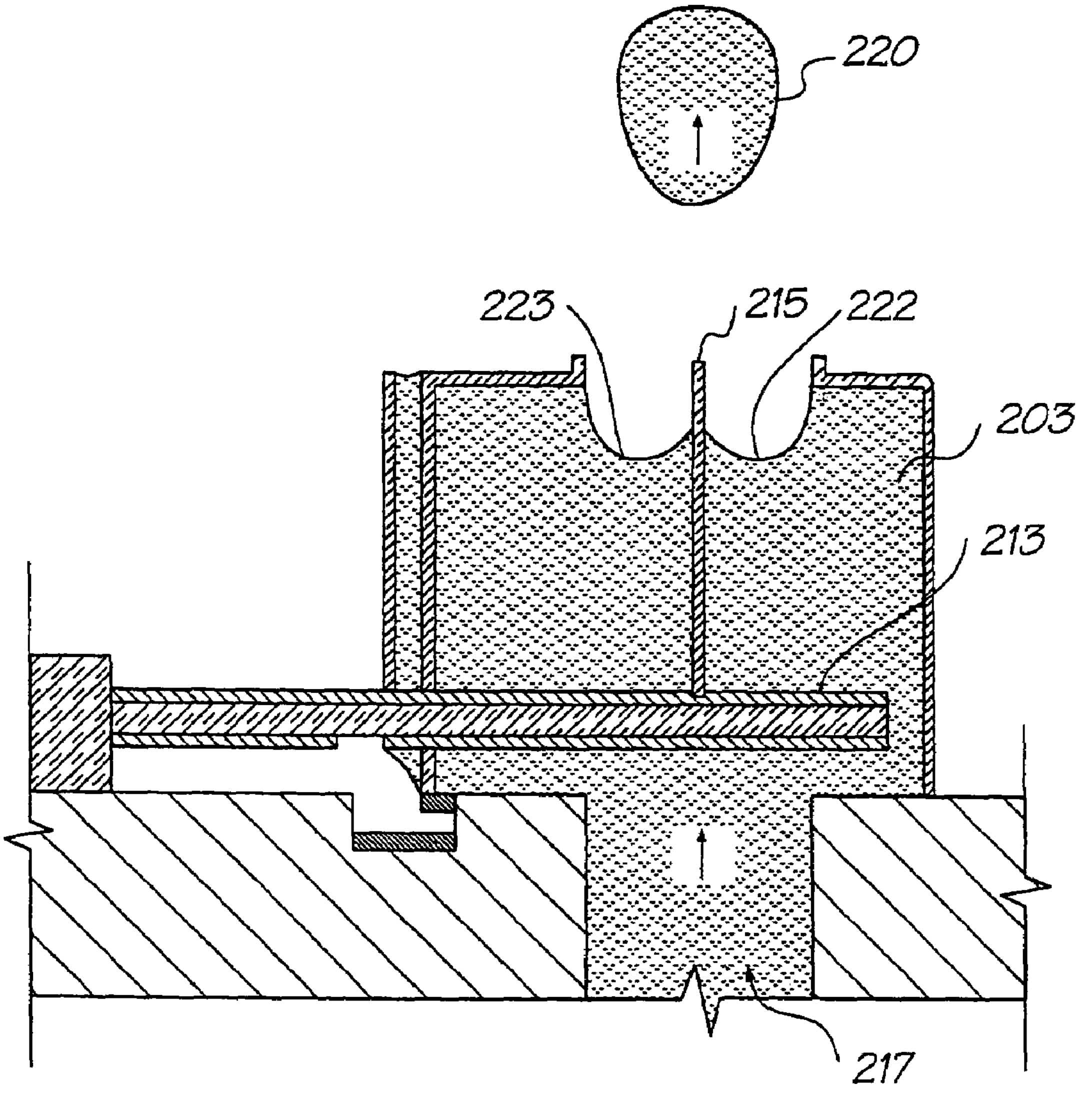
Figure 107:
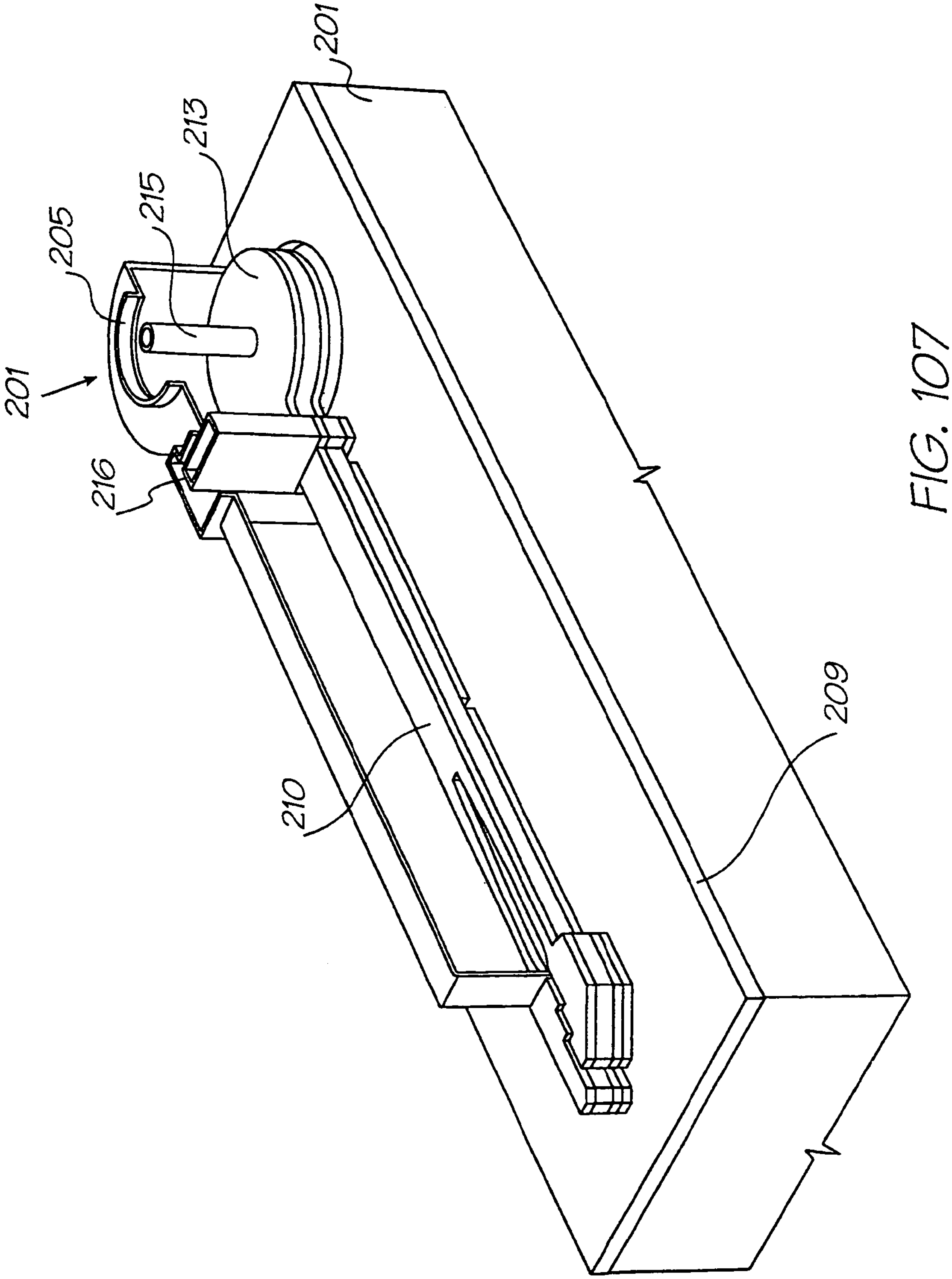
FIG. 107 is a side perspective view, partly in section, of a single nozzle arrangement of the preferred embodiment.
Figure 108:
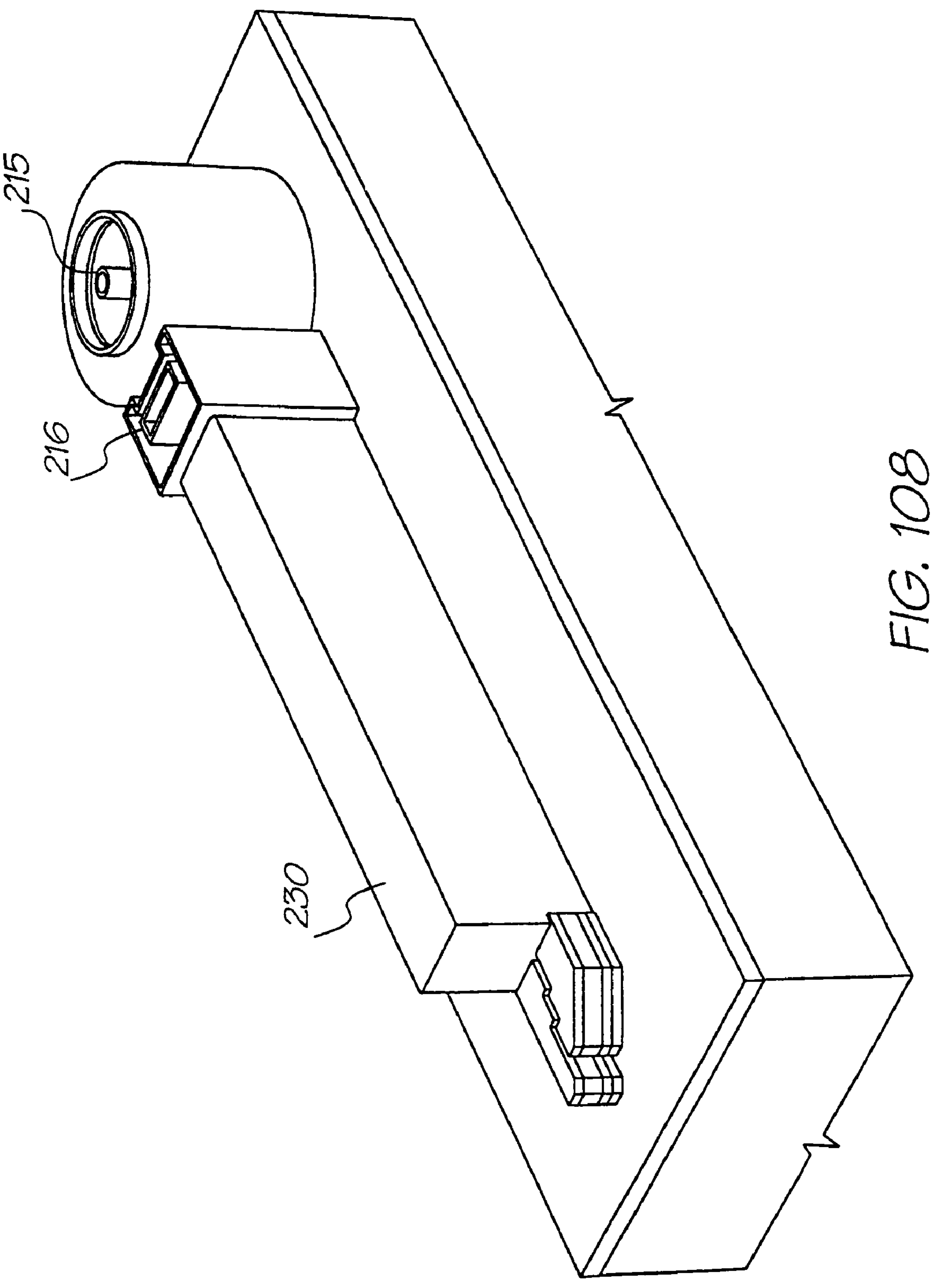
FIG. 108 illustrates a side perspective of a single nozzle including the shroud arrangement.
Figure 109:
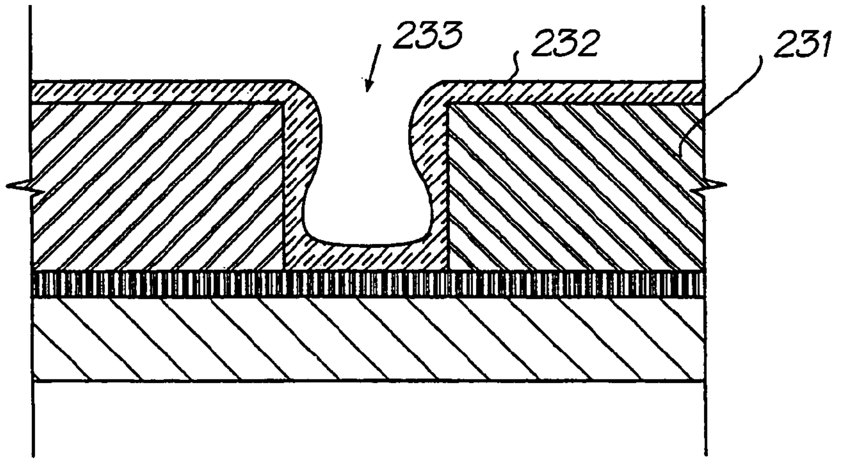
FIGS. 109-111 illustrates the principles of chemical, mechanical planarization utilized in the formation of the preferred embodiment.
Figure 110:
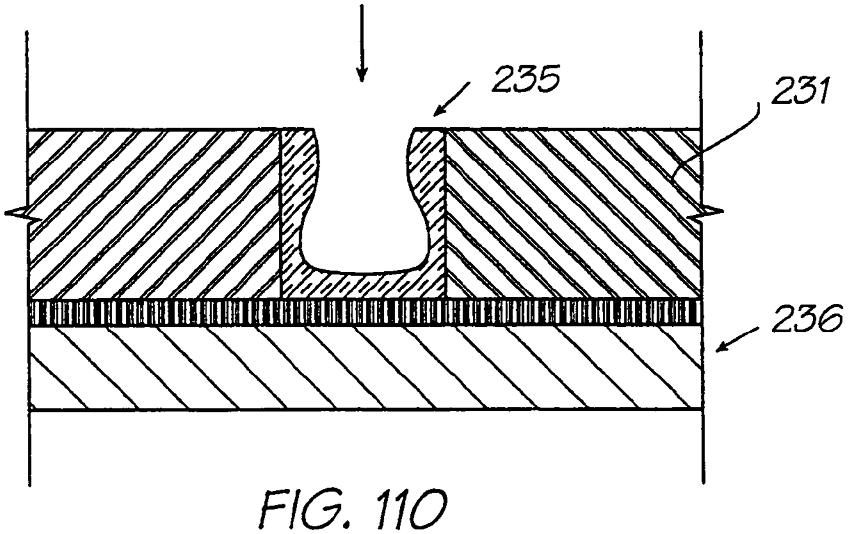
Figure 111:
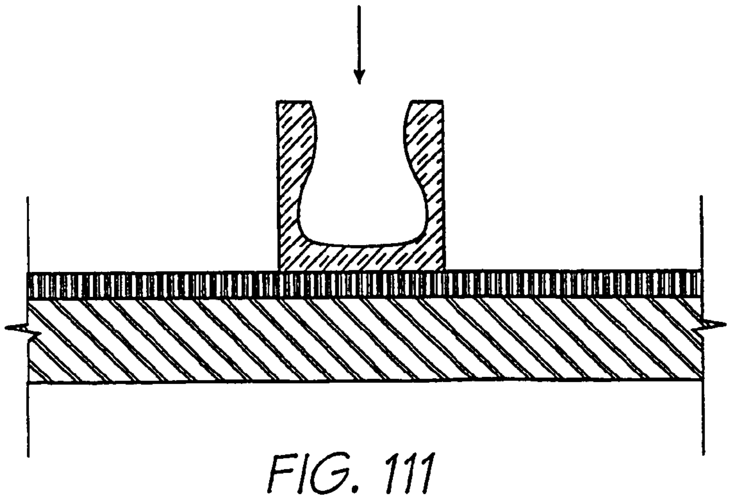

The TAB film 470, which is shown in more detail in an opened state in FIGS. 102 and 103, is double sided having on its outer side a data/signal bus in the form of a plurality of longitudinally extending control line interconnects 550 which releasably connect with a corresponding plurality of external control lines. Also provided on the outer side are busbar contacts in the form of deposited noble metal strips 552.

The inner side of the TAB film 470 has a plurality of transversely extending connecting lines 553 that alternately connect the power supply via the busbars and the control lines 550 to bond pads on the print head via region 554. The connection with the control lines occurring by means of vias 556 that extend through the TAB film. One of the many advantages of using the TAB film is providing a flexible means of connecting the rigid busbar rails to the fragile print head chip 431.

The busbars 465, 466 are in turn connected to contacts 475, 476 which are firmly clamped against the busbars 465,466 by means of cover unit 478. The cover unit 478 also can comprise an injection molded part and includes a slot 480 for the insertion of an aluminum bar for assisting in cutting a printed page.

Figure 98:
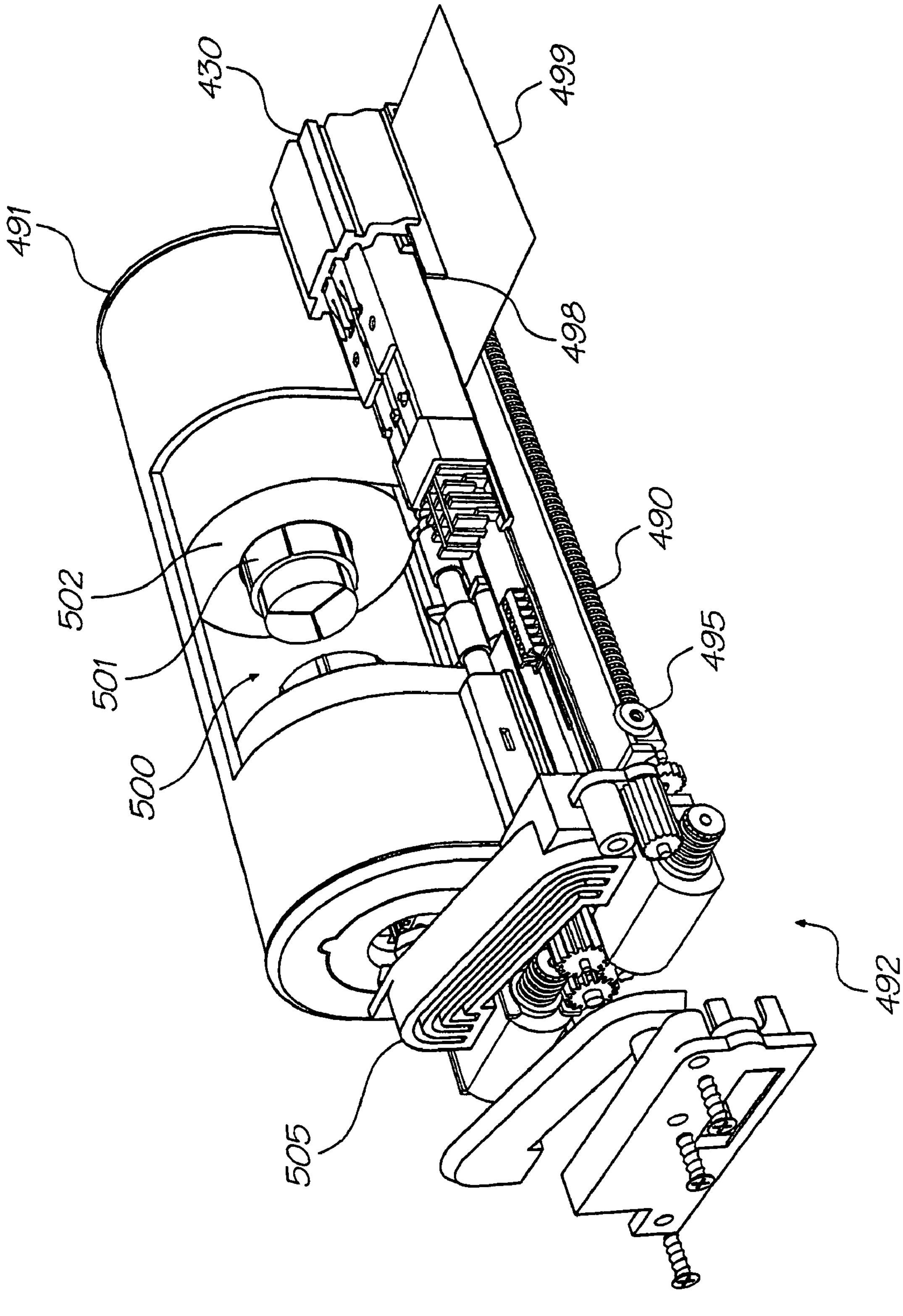
FIG. 98 illustrates a side perspective view partly in section of a print roll unit, print head and platen.

Turning now to FIG. 98 there is illustrated a cut away view of the print head unit 430, associated platen unit 490, print roll and ink supply unit 491 and drive power distribution unit 492 which interconnects each of the units 430, 490 and 491.

Figure 99:
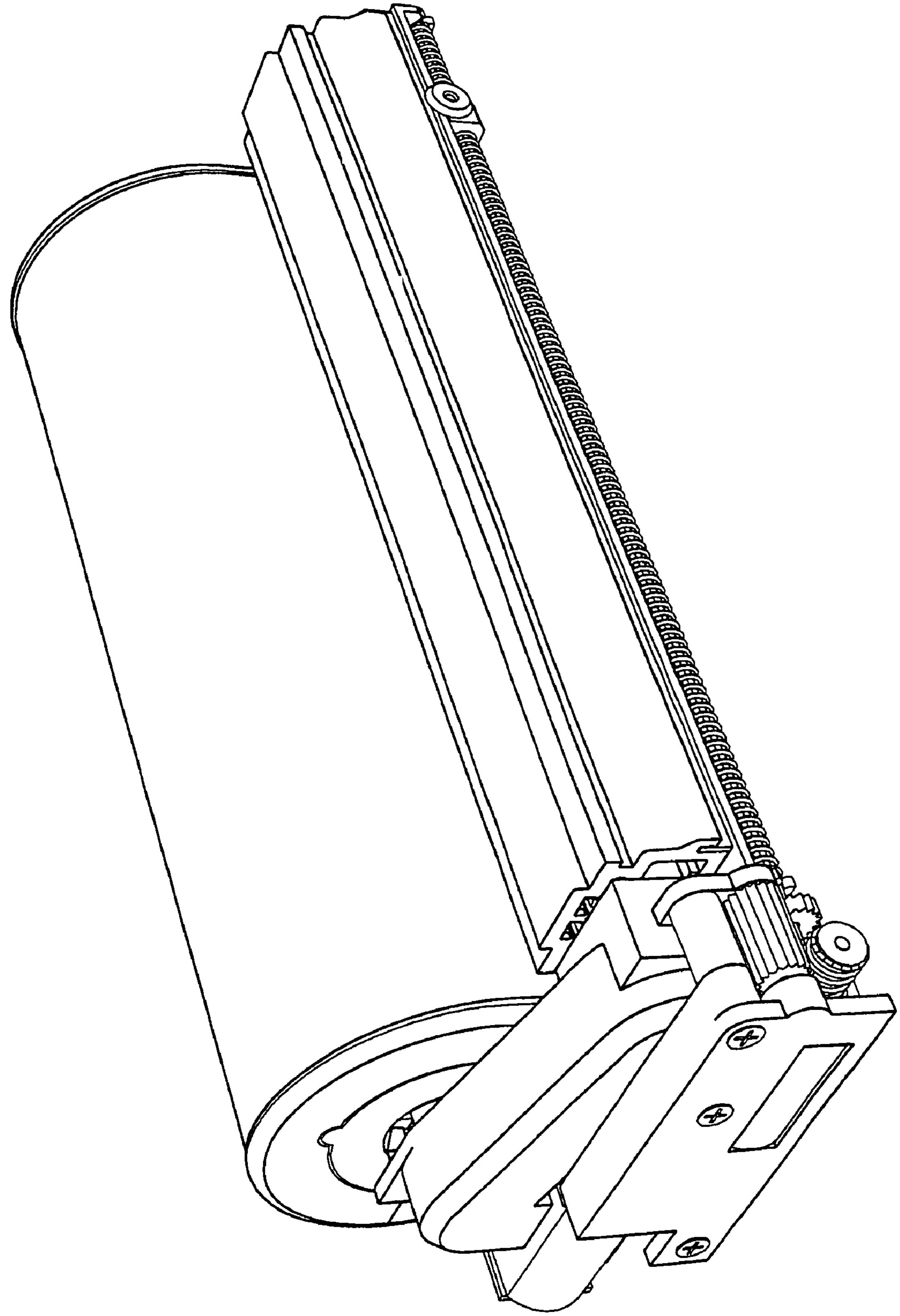
FIG. 99 illustrates a side perspective view of a print roll unit, print head and platen.
Figure 100:
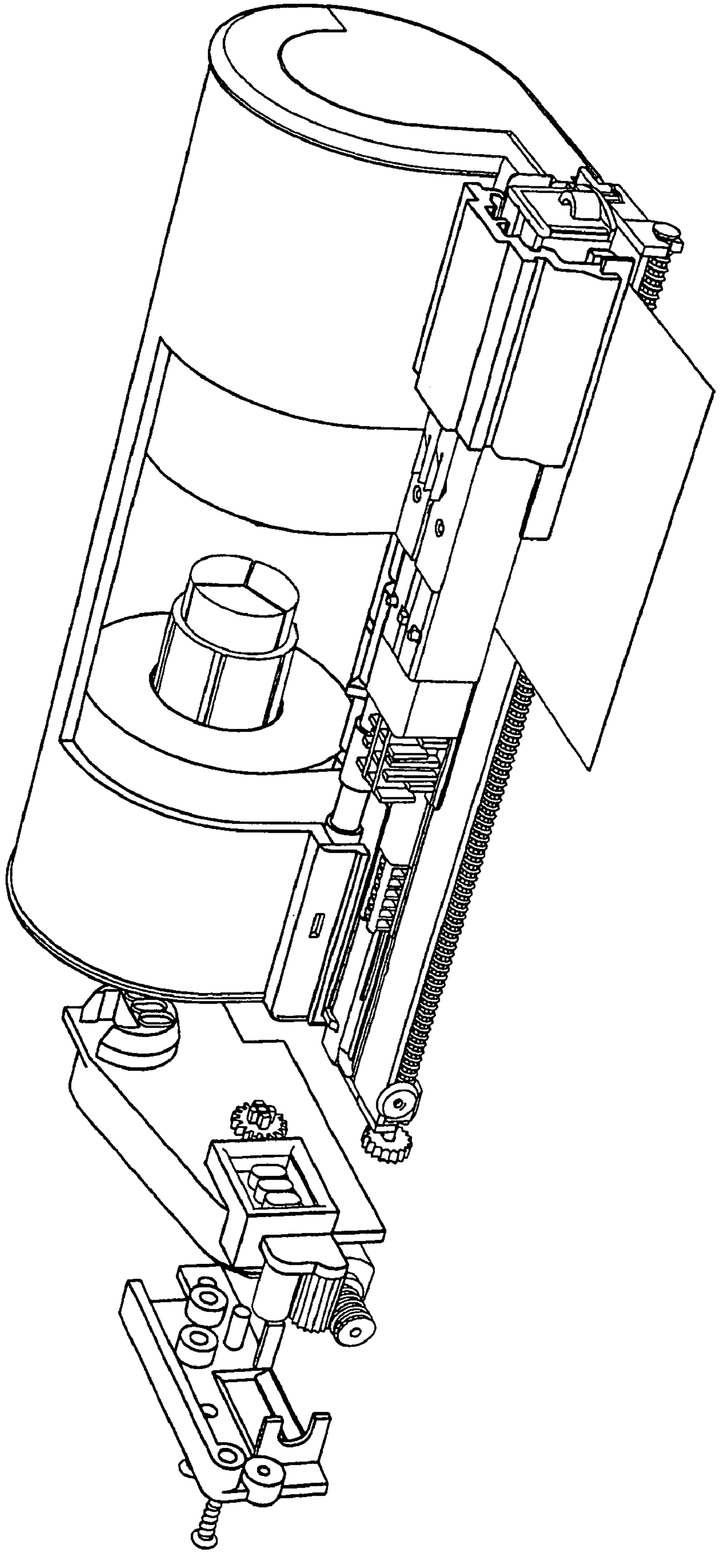
FIG. 100 illustrates a side exploded perspective view of a print roll unit, print head and platen.
Figure 101:
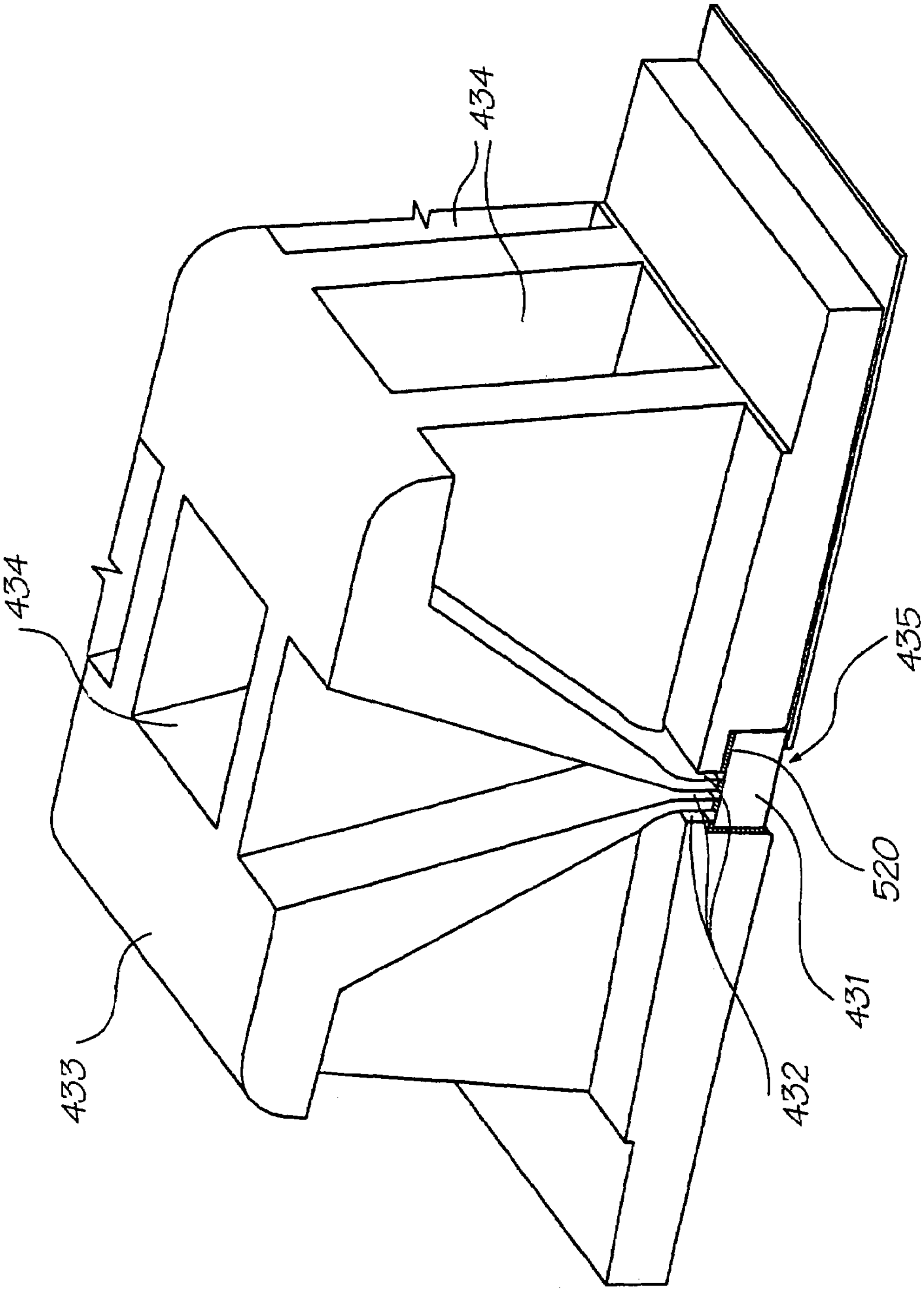
FIG. 101 is an enlarged perspective part view illustrating the attachment of a print head to an ink distribution manifold as shown in FIGS. 96 and 97.

The guillotine blade 495 is able to be driven by a first motor along the aluminum blade 498 so as to cut a picture 499 after printing has occurred. The operation of the system of FIG. 98 is very similar to that disclosed in PCT patent application PCT/AU98/00544. Ink is stored in the core portion 500 of a print roll former 501 around which is rolled print media 502. The print media is fed under the control of electric motor 494 between the platen 290 and print head unit 490 with the ink being interconnected via ink transmission channels 505 to the print head unit 430. The print roll unit 491 can be as described in the aforementioned PCT specification. In FIG. 99, there is illustrated the assembled form of single printer unit 510.

Features and Advantages

The IJ46 print head has many features and advantages over other printing technologies. In some cases, these advantages stem from new capabilities. In other cases, the advantages stem from the avoidance of problems inherent in prior art technologies. A discussion of some of these advantages follows.

High Resolution

The resolution of a IJ46 print head is 1,600 dots per inch (dpi) in both the scan direction and transverse to the scan direction. This allows full photographic quality color images, and high quality text (including Kanji). Higher resolutions are possible: 2,400 dpi and 4,800 dpi versions have been investigated for special applications, but 1,600 dpi is chosen as ideal for most applications. The true resolution of advanced commercial piezoelectric devices is around 120 dpi and thermal ink jet devices around 600 dpi.

Excellent Image Quality

High image quality requires high resolution and accurate placement of drops. The monolithic page width nature of IJ46 print heads allows drop placement to sub-micron precision. High accuracy is also achieved by eliminating misdirected drops, electrostatic deflection, air turbulence, and eddies, and maintaining highly consistent drop volume and velocity. Image quality is also ensured by the provision of sufficient resolution to avoid requiring multiple ink densities. Five color or 6 color 'photo' ink jet systems can introduce halftoning artifacts in mid tones (such as fleshtones) if the dye interaction and drop sizes are not absolutely perfect This problem is eliminated in binary three color systems such as used in IJ46 print heads.

High Speed (30 mm per Print Head)

The page width nature of the print head allows high-speed operation, as no scanning is required. The time to print a full color A4 page is less than 2 seconds, allowing full 30 page per minute (ppm) operation per print head. Multiple print heads can be used in parallel to obtain 60 ppm, 90 ppm, 120 ppm, etc. IJ46 print heads are low cost and compact, so multiple head designs are practical.

Low Cost

As the nozzle packing density of the IJ46 print head is very high, the chip area per print head can be low. This leads to a low manufacturing cost as many print head chips can fit on the same wafer.

All Digital Operation

The high resolution of the print head is chosen to allow fully digital operation using digital halftoning. This eliminates color non-linearity (a problem with continuous tone printers), and simplifies the design of drive ASICs.

Small Drop Volume

To achieve true 1,600 dpi resolution, a small drop size is required. An IJ46 print head's drop size is one picoliter (1 pl). The drop size of advanced commercial piezoelectric and thermal ink jet devices is around 3 pl to 30 pl.

Accurate Control of Drop Velocity

As the drop ejector is a precise mechanical mechanism, and does not rely on bubble nucleation, accurate drop velocity control is available. This allows low drop velocities (3-4 m/s) to be used in applications where media and airflow can be controlled. Drop velocity can be accurately varied over a considerable range by varying the energy provided to the actuator. High drop velocities (10 to 15 m/s) suitable for plain-paper operation and relatively uncontrolled conditions can be achieved using variations of the nozzle chamber and actuator dimensions.

Fast Drying

A combination of very high resolution, very small drops, and high dye density allows full color printing with much less water ejected. A 1600 dpi IJ46 print head ejects around 33% of the water of a 600 dpi thermal ink jet printer. This allows fast drying and virtually eliminates paper cockle.

Wide Temperature Range

IJ46 print heads are designed to cancel the effect of ambient temperature. Only the change in ink characteristics with temperature affects operation and this can be electronically compensated. Operating temperature range is expected to be 0° C. to 50° C. for water based inks.

No Special Manufacturing Equipment Required

The manufacturing process for IJ46 print heads leverages entirely from the established semiconductor manufacturing industry. Most ink jet systems encounter major difficulty and expense in moving from the laboratory to production, as high accuracy specialized manufacturing equipment is required.

High Production Capacity Available

A 6" CMOS fab with 10,000 wafer starts per month can produce around 18 million print heads per annum. An 8" CMOS fab with 20,000 wafer starts per month can produce around 60 million print heads per annum. There are currently many such CMOS fabs in the world.

Low Factory Setup Cost

The factory set-up cost is low because existing 0.5 micron 6" CMOS fabs can be used. These fabs could be fully amortized, and essentially obsolete for CMOS logic production. Therefore, volume production can use 'old' existing facilities. Most of the MEMS post-processing can also be performed in the CMOS fab.

Good Light-Fastness

As the ink is not heated, there are few restrictions on the types of dyes that can be used. This allows dyes to be chosen for optimum light-fastness. Some recently developed dyes from companies such as Avecia and Hoechst have light-fastness of 4. This is equal to the light-fastness of many pigments, and considerably in excess of photographic dyes and of ink jet dyes in use until recently.

Good Water-Fastness

As with light-fastness, the lack of thermal restrictions on the dye allows selection of dyes for characteristics such as water-fastness. For extremely high water-fastness (as is required for washable textiles) reactive dyes can be used.

Excellent Color Gamut

The use of transparent dyes of high color purity allows a color gamut considerably wider than that of offset printing and silver halide photography. Offset printing in particular has a restricted gamut due to light scattering from the pigments used. With three-color systems (CMY) or four-color systems (CMYK) the gamut is necessarily limited to the tetrahedral volume between the color vertices. Therefore it is important that the cyan, magenta and yellow dies are as spectrally pure as possible. A slightly wider 'hexcone' gamut that includes pure reds, greens, and blues can be achieved using a 6 color (CMYRGB) model. Such a six-color print head can be made economically as it requires a chip width of only 1 mm.

Elimination of Color Bleed

Ink bleed between colors occurs if the different primary colors are printed while the previous color is wet. While image blurring due to ink bleed is typically insignificant at 1600 dpi, ink bleed can 'muddy' the midtones of an image. Ink bleed can be eliminated by using microemulsion-based ink, for which IJ46 print heads are highly suited. The use of microemulsion ink can also help prevent nozzle clogging and ensure long-term ink stability.

High Nozzle Count

An IJ46 print head has 19,200 nozzles in a monolithic CMY three-color photographic print head. While this is large compared to other print heads, it is a small number compared to the number of devices routinely integrated on CMOS VLSI chips in high volume production. It is also less than 3% of the number of movable mirrors which Texas Instruments integrates in its Digital Micromirror Device (DMD), manufactured using similar CMOS and MEMS processes.

51,200 Nozzles per A4 Page Width Print Head

A four color (CMYK) IJ46 print head for page width A4/US letter printing uses two chips. Each 0.66 $cm^2$ chip has 25,600 nozzles for a total of 51,200 nozzles.

Integration of Drive Circuits

In a print head with as many as 51,200 nozzles, it is essential to integrate data distribution circuits (shift registers), data timing, and drive transistors with the nozzles. Otherwise, a minimum of 51,201 external connections would be required. This is a severe problem with piezoelectric ink jets, as drive circuits cannot be integrated on piezoelectric substrates. Integration of many millions of connections is common in CMOS VLSI chips, which are fabricated in high volume at high yield. It is the number of off-chip connections that must be limited.

Monolithic Fabrication

IJ46 print heads are made as a single monolithic CMOS chip, so no precision assembly is required. All fabrication is performed using standard CMOS VLSI and MEMS (Micro-Electro-Mechanical Systems) processes and materials. In thermal ink jet and some piezoelectric ink jet systems, the assembly of nozzle plates with the print head chip is a major cause of low yields, limited resolution, and limited size. Also, page width arrays are typically constructed from multiple smaller chips. The assembly and alignment of these chips is an expensive process.

Modular, Extendable for Wide Print Widths

Long page width print heads can be constructed by butting two or more 100 mm IJ46 print heads together. The edge of the IJ46 print head chip is designed to automatically align to adjacent chips. One print head gives a photographic size printer, two gives an A4 printer, and four gives an A3 printer. Larger numbers can be used for high speed digital printing, page width wide format printing, and textile printing.

Duplex Operation

Duplex printing at the full print speed is highly practical. The simplest method is to provide two print heads—one on each side of the paper. The cost and complexity of providing two print heads is less than that of mechanical systems to turn over the sheet of paper.

Straight Paper Path

As there are no drums required, a straight paper path can be used to reduce the possibility of paper jams. This is especially relevant for office duplex printers, where the complex mechanisms required to turn over the pages are a major source of paper jams.

High Efficiency

Thermal ink jet print heads are only around 0.01% efficient (electrical energy input compared to drop kinetic energy and increased surface energy). IJ46 print heads are more than 20 times as efficient.

Self-Cooling Operation

The energy required to eject each drop is 160 nJ (0.16 microjoules), a small fraction of that required for thermal ink jet printers. The low energy allows the print head to be completely cooled by the ejected ink, with only a 40° C. worst-case ink temperature rise. No heat sinking is required.

Low Pressure

The maximum pressure generated in an IJ46 print head is around 60 kPa (0.6 atmospheres). The pressures generated by bubble nucleation and collapse in thermal ink jet and Bubblejet systems are typically in excess of 10 MPa (100 atmospheres), which is 160 times the maximum IJ46 print head pressure. The high pressures in Bubblejet and thermal ink jet designs result in high mechanical stresses.

Low Power

A 30 ppm A4 IJ46 print head requires about 67 Watts when printing full 3 color black. When printing 5% coverage, average power consumption is only 3.4 Watts.

Low Voltage Operation

IJ46 print heads can operate from a single 3V supply, the same as typical drive ASICs. Thermal ink jets typically require at least 20 V, and piezoelectric ink jets often require more than 50 V. The IJ46 print head actuator is designed for nominal operation at 2.8 volts, allowing a 0.2 volt drop across the drive transistor, to achieve 3V chip operation.

Operation from 2 or 4 AA Batteries

Power consumption is low enough that a photographic IJ46 print head can operate from AA batteries. A typical 6"×4" photograph requires less than 20 Joules to print (including drive transistor losses). Four AA batteries are recommended if the photo is to be printed in 2 seconds. If the print time is increased to 4 seconds, 2 AA batteries can be used.

Battery Voltage Compensation

IJ46 print heads' can operate from an unregulated battery supply, to eliminate efficiency losses of a voltage regulator. This means that consistent performance must be achieved over a considerable range of supply voltages. The IJ46 print head senses the supply voltage, and adjusts actuator operation to achieve consistent drop volume.

Small Actuator and Nozzle Area

The area required by an IJ46 print head nozzle, actuator, and drive circuit is 1764 $\mu m^2$. This is less than 1% of the area required by piezoelectric ink jet nozzles, and around 5% of the area required by Bubblejet nozzles. The actuator area directly affects the print head manufacturing cost.

Small Total Print Head Size

An entire print head assembly (including ink supply channels) for an A4, 30 ppm, 1,600 dpi, four color print head is 210 mm×12 mm×7 mm. The small size allows incorporation into notebook computers and miniature printers. A photograph printer is 106 mm×7 mm×7 mm, allowing inclusion in pocket digital cameras, palmtop PC's, mobile phone/fax, and so on. Ink supply channels take most of this volume. The print head chip itself is only 102 mm×0.55 mm×0.3 mm.

Miniature Nozzle Capping System

A miniature nozzle capping system has been designed for IJ46 print heads. For a photograph printer this nozzle capping system is only 106 mm×5 mm×4 mm, and does not require the print head to move.

High Manufacturing Yield

The projected manufacturing yield (at maturity) of the IJ46 print heads is at least 80%, as it is primarily a digital CMOS chip with an area of only 0.55 $cm^2$. Most modern CMOS processes achieve high yield with chip areas in excess of 1 $cm^2$. For chips less than around 1 $cm^2$, cost is roughly proportional to chip area. Cost increases rapidly between 1 $cm^2$ and 4 $cm^2$, with chips larger than this rarely being practical. There is a strong incentive to ensure that the chip area is less than 1 $cm^2$. For thermal ink jet and Bubblejet print heads, the chip width is typically around 5 mm, limiting the cost effective chip length to around 2 cm. A major target of IJ46 print head development has been to reduce the chip width as much as possible, allowing cost effective monolithic page width print heads.

Low Process Complexity

With digital IC manufacture, the mask complexity of the device has little or no effect on the manufacturing cost or difficulty. Cost is proportional to the number of process steps, and the lithographic critical dimensions. IJ46 print heads use a standard 0.5 micron single poly triple metal CMOS manufacturing process, with an additional 5 MEMS mask steps. This makes the manufacturing process less complex than a typical 0.25 micron CMOS logic process with 5 level metal.

Simple Testing

IJ46 print heads include test circuitry that allows most testing to be completed at the wafer probe stage. Testing of all electrical properties, including the resistance of the actuator, can be completed at this stage. However, actuator motion can only be tested after release from the sacrificial materials, so final testing must be performed on the packaged chips.

Low Cost Packaging

IJ46 print heads are packaged in an injection molded polycarbonate package. All connections are made using Tape Automated Bonding (TAB) technology (though wire bonding can be used as an option). All connections are along one edge of the chip.

No Alpha Particle Sensitivity

Alpha particle emission does not need to be considered in the packaging, as there are no memory elements except static registers, and a change of state due to alpha particle tracks is likely to cause only a single extra dot to be printed (or not) on the paper.

Relaxed Critical Dimensions

The critical dimension (CD) of the IJ46 print head CMOS drive circuitry is 0.5 microns. Advanced digital IC's such as microprocessors currently use CDs of 0.25 microns, which is two device generations more advanced than the IJ46 print head requires. Most of the MEMS post processing steps have CDs of 1 micron or greater.

Low Stress During Manufacture

Devices cracking during manufacture are a critical problem with both thermal ink jet and piezoelectric devices. This limits the size of the print head that it is possible to manufacture. The stresses involved in the manufacture of IJ46 print heads are no greater than those required for CMOS fabrication.

No Scan Banding

IJ46 print heads are full page width, so do not scan. This eliminates one of the most significant image quality problems of ink jet printers. Banding due to other causes (misdirected drops, print head alignment) is usually a significant problem in page width print heads. These causes of banding have also been addressed.

'Perfect' Nozzle Alignment

All of the nozzles within a print head are aligned to sub-micron accuracy by the 0.5 micron stepper used for the lithography of the print head. Nozzle alignment of two 4" print heads to make an A4 page width print head is achieved with the aid of mechanical alignment features on the print head chips. This allows automated mechanical alignment (by simply pushing two print head chips together) to within 1 micron. If finer alignment is required in specialized applications, 4" print heads can be aligned optically.

No Satellite Drops

The very small drop size (1 pl) and moderate drop velocity (3 m/s) eliminates satellite drops, which are a major source of image quality problems. At around 4 m/s, satellite drops form, but catch up with the main drop. Above around 4.5 m/s, satellite drops form with a variety of velocities relative to the main drop. Of particular concern is satellite drops which have a negative velocity relative to the print head, and therefore are often deposited on the print head surface. These are difficult to avoid when high drop velocities (around 10 m/s) are used.

Laminar Air Flow

The low drop velocity requires laminar airflow, with no eddies, to achieve good drop placement on the print medium. This is achieved by the design of the print head packaging. For 'plain paper' applications and for printing on other 'rough' surfaces, higher drop velocities are desirable. Drop velocities to 15 m/s can be achieved using variations of the design dimensions. It is possible to manufacture 3 color photographic print heads with a 4 m/s drop velocity, and 4 color plain-paper print heads with a 15 m/s drop velocity, on the same wafer. This is because both can be made using the same process parameters.

No Misdirected Drops

Misdirected drops are eliminated by the provision of a thin rim around the nozzle, which prevents the spread of a drop across the print head surface in regions where the hydrophobic coating is compromised.

No Thermal Crosstalk

When adjacent actuators are energized in Bubblejet or other thermal ink jet systems, the heat from one actuator spreads to others, and affects their firing characteristics. In IJ46 print heads, heat diffusing from one actuator to adjacent actuators affects both the heater layer and the bend-cancelling layer equally, so has no effect on the paddle position. This virtually eliminates thermal crosstalk.

No Fluidic Crosstalk

Each simultaneously fired nozzle is at the end of a 300 micron long ink inlet etched through the (thinned) wafer. These ink inlets are connected to large ink channels with low fluidic resistance. This configuration virtually eliminates any effect of drop ejection from one nozzle on other nozzles.

No Structural Crosstalk

This is a common problem with piezoelectric print heads. It does not occur in IJ46 print heads.

Permanent Print Head

The IJ46 print heads can be permanently installed. This dramatically lowers the production cost of consumables, as the consumable does not need to include a print head.

No Kogation

Kogation (residues of burnt ink, solvent, and impurities) is a significant problem with Bubblejet and other thermal ink jet print heads. IJ46 print heads do not have this problem, as the ink is not directly heated.

No Cavitation

Erosion caused by the violent collapse of bubbles is another problem that limits the life of Bubblejet and other thermal ink jet print heads. IJ46 print heads do not have this problem because no bubbles are formed.

No Electromigration

No metals are used in IJ46 print head actuators or nozzles, which are entirely ceramic. Therefore, there is no problem with electromigration in the actual ink jet devices. The CMOS metalization layers are designed to support the required currents without electromigration. This can be readily achieved because the current considerations arise from heater drive power, not high speed CMOS switching.

Reliable Power Connections

While the energy consumption of IJ46 print heads are fifty times less than thermal ink jet print heads, the high print speed and low voltage results in a fairly high electrical current consumption. Worst case current for a photographic IJ46 print head printing in two seconds from a 3 Volt supply is 4.9 Amps. This is supplied via copper busbars to 256 bond pads along the edge of the chip. Each bond pad carries a maximum of 40 mA. On chip contacts and vias to the drive transistors carry a peak current of 1.5 mA for 1.3 microseconds, and a maximum average of 12 mA.

No Corrosion

The nozzle and actuator are entirely formed of glass and titanium nitride (TiN), a conductive ceramic commonly used as metalization barrier layers in CMOS devices. Both materials are highly resistant to corrosion.

No Electrolysis

The ink is not in contact with any electrical potentials, so there is no electrolysis.

No Fatigue

All actuator movement is within elastic limits, and the materials used are all ceramics, so there is no fatigue.

No Friction

No moving surfaces are in contact, so there is no friction.

No Stiction

The IJ46 print head is designed to eliminate stiction, a problem common to many MEMS devices. Stiction is a word combining "stick" with "friction" and is especially significant at the in MEMS due to the relative scaling of forces. In the IJ46 print head, the paddle is suspended over a hole in the substrate, eliminating the paddle-to-substrate stiction which would otherwise be encountered.

No Crack Propagation

The stresses applied to the materials are less than 1% of that which leads to crack propagation with the typical surface roughness of the TiN and glass layers. Corners are rounded to minimize stress 'hotspots'. The glass is also always under compressive stress, which is much more resistant to crack propagation than tensile stress.

No Electrical Poling Required

Piezoelectric materials must be poled after they are formed into the print head structure. This poling requires very high electrical field strengths—around 20,000 V/cm. The high voltage requirement typically limits the size of piezoelectric print heads to around 5 cm, requiring 100,000 Volts to pole. IJ46 print heads require no poling.

No Rectified Diffusion

Rectified diffusion—the formation of bubbles due to cyclic pressure variations—is a problem that primarily afflicts piezoelectric ink jets. IJ46 print heads are designed to prevent rectified diffusion, as the ink pressure never falls below zero.

Elimination of the Saw Street

The saw street between chips on a wafer is typically 200 microns. This would take 26% of the wafer area. Instead, plasma etching is used, requiring just 4% of the wafer area. This also eliminates breakage during sawing.

Lithography Using Standard Steppers

Although IJ46 print heads are 100 mm long, standard steppers (which typically have an imaging field around 20 mm square) are used. This is because the print head is 'stitched' using eight identical exposures. Alignment between stitches is not critical, as there are no electrical connections between stitch regions. One segment of each of 32 print heads is imaged with each stepper exposure, giving an 'average' of 4 print heads per exposure.

Integration of Full Color on a Single Chip

IJ46 print heads integrate all of the colors required onto a single chip. This cannot be done with page width 'edge shooter' ink jet technologies.

Wide Variety of Inks

IJ46 print heads do not rely on the ink properties for drop ejection. Inks can be based on water, microemulsions, oils, various alcohols, MEK, hot melt waxes, or other solvents. IJ46 print heads can be 'tuned' for inks over a wide range of viscosity and surface tension. This is a significant factor in allowing a wide range of applications.

Laminar Air Flow with No Eddies

The print head packaging is designed to ensure that airflow is laminar, and to eliminate eddies. This is important, as eddies or turbulence could degrade image quality due to the small drop size.

Drop Repetition Rate

The nominal drop repetition rate of a photographic IJ46 print head is 5 kHz, resulting in a print speed of 2 second per photo. The nominal drop repetition rate for an A4 print head is 10 kHz for 30+ ppm A4 printing. The maximum drop repetition rate is primarily limited by the nozzle refill rate, which is determined by surface tension when operated using non-pressurized ink. Drop repetition rates of 50 kHz are possible using positive ink pressure (around 20 kPa). However, 34 ppm is entirely adequate for most low cost consumer applications. For very high-speed applications, such as commercial printing, multiple print heads can be used in conjunction with fast paper handling. For low power operation (such as operation from 2 AA batteries) the drop repetition rate can be reduced to reduce power.

Low Head-to-Paper Speed

The nominal head to paper speed of a photographic IJ46 print head is only 0.076 m/sec. For an A4 print head it is only 0.16 m/sec, which is about a third of the typical scanning ink jet head speed. The low speed simplifies printer design and improves drop placement accuracy: However, this head-to-paper speed is enough for 34 ppm printing, due to the page width print head. Higher speeds can readily be obtained where required.

High Speed CMOS not Required

The clock speed of the print head shift registers is only 14 MHz for an A4/letter print head operating at 30 ppm. For a photograph printer, the clock speed is only 3.84 MHz. This is much lower than the speed capability of the CMOS process used. This simplifies the CMOS design, and eliminates power dissipation problems when printing near-white images.

Fully Static CMOS Design

The shift registers and transfer registers are fully static designs. A static design requires 35 transistors per nozzle, compared to around 13 for a dynamic design. However, the static design has several advantages, including higher noise immunity, lower quiescent power consumption, and greater processing tolerances.

Wide Power Transistor

The width to length ratio of the power transistor is 688. This allows a 4 Ohm on-resistance, whereby the drive transistor consumes 6.7% of the actuator power when operating from 3V. This size transistor fits beneath the actuator, along with the shift register and other logic. Thus an adequate drive transistor, along with the associated data distribution circuits, consumes no chip area that is not already required by the actuator.

There are several ways to reduce the percentage of power consumed by the transistor: increase the drive voltage so that the required current is less, reduce the lithography to less than 0.5 micron, use BiCMOS or other high current drive technology, or increase the chip area, allowing room for drive transistors which are not underneath the actuator. However, the 6.7% consumption of the present design is considered a cost-performance optimum.

Range of Applications

The presently disclosed ink jet printing technology is suited to a wide range of printing systems.

Major example applications include:

1. Color and monochrome office printers
2. SOHO printers
3. Home PC printers
4. Network connected color and monochrome printers
5. Departmental printers
6. Photographic printers
7. Printers incorporated into cameras
8. Printers in 3G mobile phones
9. Portable and notebook printers
10. Wide format printers
11. Color and monochrome copiers
12. Color and monochrome facsimile machines
13. Multi-function printers combining print, fax, scan, and copy functions
14. Digital commercial printers
15. Short run digital printers
16. Packaging printers
17. Textile printers
18. Short run digital printers
19. Offset press supplemental printers
20. Low cost scanning printers
21. High speed page width printers
22. Notebook computers with inbuilt page width printers
23. Portable color and monochrome printers
24. Label printers
25. Ticket printers
26. Point-of-sale receipt printers
27. Large format CAD printers
28. Photofinishing printers
29. Video printers
30. PhotoCD printers
31. Wallpaper printers
32. Laminate printers
33. Indoor sign printers
34. Billboard printers
35. Videogame printers
36. Photo 'kiosk' printers
37. Business card printers
38. Greeting card printers
39. Book printers
40. Newspaper printers
41. Magazine printers
42. Forms printers
43. Digital photo album printers
44. Medical printers
45. Automotive printers
46. Pressure sensitive label printers
47. Color proofing printers
48. Fault tolerant commercial printer arrays.

Prior Art Ink Jet Technologies

Similar capability print heads are unlikely to become available from the established ink jet manufacturers in the near future. This is because the two main contenders—thermal ink jet and piezoelectric ink jet—each have severe fundamental problems meeting the requirements of the application.

The most significant problem with thermal ink jet is power consumption. This is approximately 100 times that required for these applications, and stems from the energy-inefficient means of drop ejection. This involves the rapid boiling of water to produce a vapor bubble which expels the ink. Water has a very high heat capacity, and must be superheated in thermal ink jet applications. The high power consumption limits the nozzle packing density, as The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of page width print heads with 19,200 nozzles.

Comparison of IJ46 Print Heads and Thermal Ink Jet (TIJ) Printing Mechanisms

| Factor | TIJ print heads | IJ46 print heads | Advantage |
|---|---|---|---|
| Resolution | 600 | 1,600 | Full photographic image quality and high quality text |
| Printer type | Scanning | Page width | IJ46 print heads do not scan, resulting in faster printing and smaller size |
| Print speed | <1 ppm | 30 ppm | IJ46 print head's page width results in >30 times faster operation |
| Number of nozzles | 300 | 51,200 | >100 times as many nozzles enables the high print speed |

-continued

| Factor | TIJ print heads | IJ46 print heads | Advantage |
|---|---|---|---|
| Drop volume | 20 picoliters | 1 picoliter | Less water on the paper, print is immediately dry, no 'cockle' |
| Construction | Multi-part | Monolithic | IJ46 print heads do not require high precision assembly |
| Efficiency | <0.1% | 2% | 20 times increase in efficiency results in low power operation |
| Power supply | Mains power | Batteries | Battery operation allows portable printers, e.g. in cameras, phones |
| Peak pressure | >100 atm | 0.6 atm | The high pressures in a thermal ink jet cause reliability problems |
| Ink temperature | +300° C. | +50° C. | High ink temperatures cause burnt dye deposits (kogation) |
| Cavitation | Problem | None | Cavitation (erosion due to bubble collapse) limits head life |
| Head life | Limited | Permanent | TIJ print heads are replaceable due to cavitation and kogation |
| Operating voltage | 20 V | 3 V | Allows operation from small batteries, important for portable and pocket printers |
| Energy per drop | 10 μJ | 160 nJ | <1/50 of the drop ejection energy allows battery operation |
| Chip area per nozzle | 40,000 $\mu m^2$ | 1,764 $\mu m^2$ | Small size allows low cost manufacture |

In the preferred embodiment, a paddle is formed with a "poker" device attached in a central portion thereof such that, during movement of the paddle, the poker device pokes any unwanted foreign body or material which should congregate around the nozzle, out of the nozzle. The poker can be formed during fabrication of the ink ejection nozzle arrangement by means of a chemical mechanical planarization step with, preferably, the formation being a byproduct of the normal formation steps for forming the ink ejection nozzle on arrangement on a semi-conductor wafer utilizing standard MEMS processing techniques.

Additionally, in order to restrict the amount of wicking and the opportunities for wicking, an actuator slot guard is provided, formed on the bend actuator itself, closely adjacent to the actuator slot so as to restrict the opportunities for flow of fluid out of the nozzle chamber due to surface tension effects.

Turning now to FIG. 1 to FIG. 3 there will now be explained the operational principles of the preferred embodiment. In FIG. 1, there is illustrated a nozzle arrangement 201 which is formed on the substrate 202 which can comprise a semi-conductor substrate or the like. The arrangement 201 includes a nozzle chamber 203 which is normally filled with ink so as to form a meniscus 204 which surrounds a nozzle rim 205. A thermal bend actuator device 206 is attached to post 207 and includes a conductive heater portion 209 which is normally balanced with a corresponding layer 210 in thermal equilibrium. The actuator 206 passes through a slot in the wall 212 of the nozzle chamber and inside forms a nozzle ejection paddle 213. On the paddle 213 is formed a "poker" 215 which is formed when forming the walls of the nozzle chamber 203. Also formed on the actuator 206 is a actuator slot protection barrier 216. An ink supply channel 217 is also formed through the surface of the substrate 202 utilizing highly anisotropic etching of the substrate 202. During operation, ink flows out of the nozzle chamber 203 so as to form a layer 219 between the slot in the wall 212 and the actuator slot protection barrier 216. The protection barrier is profiled to substantially mate with the slot but to be slightly spaced apart therefrom so that any meniscus eg. 219 is of small dimensions.

Next, as illustrated in FIG. 2, when it is desired to eject a drop from the nozzle chamber 203, the bottom conductive thermal actuator 209 is heated electrically so as to undergo a rapid expansion which in turn results in the rapid upward movement of the paddle 213. The rapid upward movement of the paddle 213 results in ink flow out of the nozzle so as to form bulging ink meniscus 204. Importantly, the movement of the actuator 206 results in the poker 215 moving up through the plane of the nozzle rim so as to assist in the ejection of any debris which may be in the vicinity of the nozzle rim 205.

Further, the movement of the actuator 206 results in a slight movement of the actuator slot protection barrier 216 which maintains substantially the small dimensioned meniscus 219 thereby reducing the opportunity for ink wicking along surfaces. Subsequently, the conductive heater 209 is turned off and the actuator 206 begins to rapidly return to its original position. The forward momentum of the ink around meniscus 204 in addition to the backflow due to return movement of the actuator 2026 results in a general necking and breaking of the meniscus 204 so as to form a drop.

The situation a short time later is as illustrated in FIG. 3 where a drop 220 proceeds to the print media and the meniscus collapses around poker 215 so as to form menisci 222, 223. The formation of the menisci 222, 223 result in a high surface tension pressure being exerted in the nozzle chamber 203 which results in ink being drawn into the nozzle chamber 203 via ink supply channel 217 so as to rapidly refill the nozzle chamber 203. The utilization of the poker 215 increases the speed of refill in addition to ensuring that no air bubble forms within the nozzle chamber 203 by means of the meniscus attaching to the surface of the nozzle paddle 213 and remaining there. The poker 215 ensures that the meniscus eg. 222, 223 will run along the poker 215 so as to refill in the nozzle chamber. Additionally, the area around the actuator slot barrier 216 remains substantially stable minimizing the opportunities for wicking therefrom.

Turning now to FIG. 4 there is illustrated a side perspective view of a single nozzle arrangement 201 shown in sections. FIG. 5 illustrates a side perspective view of a single nozzle including a protective shroud 230. The central poker 215 and aperture card 216 are as previously discussed. The construction of the arrangement of FIGS. 4 and 5 can be as a result of the simple modification of deep mask steps utilized in the construction of the nozzle arrangement in Australian Provisional Patent Application PP6534 (the contents of which are specifically incorporated by cross-reference) so as to include the poker 215 and guard 216. The poker and guard are constructed primarily by means of a chemical mechanical planarization step which is illustrated schematically in FIG. 6 to FIG. 8. The poker 215 and guard 216 are constructed by depositing a surface layer 232 on a sacrificial layer 231 which includes a series of etched vias eg. 233. Subsequently, as illustrated in FIG. 7, the top layer is chemically and mechanically planarized off so as to leave the underlying structure 235 which is attached to lower structural layers 236. Subsequently, as illustrated in FIG. 8, the sacrificial layer 231 is etched away leaving the resulting structure as required.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of fabricating a micro-electromechanical actuating mechanism on a wafer substrate, the method comprising the steps of:

carrying out a CMOS fabrication process on the wafer to form transistor control and drive circuitry;

depositing sacrificial material on the transistor control and drive circuitry;

etching the sacrificial material to provide connection access to the drive circuitry;

carrying out a MEMS fabrication process on the layer of sacrificial material to form a micro-electromechanical actuator connected to the drive circuitry and responsive to electrical signals from the drive circuitry; and removing the sacrificial material to free the micro-electromechanical actuator, wherein the steps of carrying out the CMOS and MEMS fabrication processes are such that the transistor circuitry is interposed between the actuator and the wafer substrate.

2. A method as claimed in claim 1, in which the step of carrying out the MEMS fabrication process is such that the micro-electromechanical actuator is elongate, with one end anchored to the substrate.

3. A method as claimed in claim 2, in which the step of carrying out the CMOS fabrication process includes the step of forming traces for the transistor circuitry such that the traces include a series of portions that extend transversely with respect to the micro-electromechanical actuator.

4. A method as claimed in claim 3, in which the step of carrying out the MEMS fabrication process includes the step of forming actuator layers on the sacrificial material such that one of the actuator layers defines a series of corrugations that correspond with the series of transversely extending portions of the heater layer.

5. A method as claimed in claim 4, in which the step of forming the actuator layers includes the step of forming said one of the actuator layers in the form of a resistive heating circuit of a conductive material in electrical contact with the drive transistor circuitry to be heated on receipt of an electrical signal from the drive transistor circuitry.

6. A method as claimed in claim 5, in which the resistive heating circuit is formed with a conductive material having a coefficient of thermal expansion sufficient to result in expansion and subsequent contraction of the heating circuit upon heating and subsequent cooling to result in displacement of the micro-electromechanical actuator with respect to the substrate.

7. A method as claimed in claim 6, in which the step of forming said resistive heating circuit incorporates the steps of forming a fluid ejection paddle such that said one of the actuator layers also defines the fluid ejection paddle, and forming an electrical discontinuity between the fluid ejection paddle and the heating circuit to insulate the fluid ejection paddle.

8. A method as claimed in claim 7, which includes the step of forming a nozzle chamber structure on the substrate to define a nozzle chamber such that the fluid ejection paddle extends into the nozzle chamber and the actuator extends through a wall of the nozzle chamber structure.

* * * * *